(12) United States Patent
Suzuki

(10) Patent No.: US 6,298,361 B1
(45) Date of Patent: Oct. 2, 2001

(54) SIGNAL ENCODING AND DECODING SYSTEM

(75) Inventor: Shiro Suzuki, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/013,492

(22) Filed: Jan. 26, 1998

(30) Foreign Application Priority Data

Feb. 6, 1997 (JP) .................................................. 9-024119
Jul. 18, 1997 (JP) .................................................. 9-194416

(51) Int. Cl.[7] .................................................. G06F 17/10
(52) U.S. Cl. .................................................. 708/313; 708/300
(58) Field of Search .................................. 708/313, 300; 341/51

(56) References Cited

U.S. PATENT DOCUMENTS

| | | | |
|---|---|---|---|
| 5,721,772 | * | 2/1998 | Haneda et al. ........................ 708/313 |
| 5,777,900 | * | 7/1998 | Takeuchi et al. ...................... 708/300 |
| 5,825,310 | * | 10/1998 | Tsutsui .................................. 708/300 |
| 5,926,455 | * | 7/1999 | Allpress ................................ 708/300 |
| 6,018,754 | * | 1/2000 | Chen et al. ........................... 708/313 |

FOREIGN PATENT DOCUMENTS 0 721 258 A2   7/1996 (EP).
WO 91/16769   10/1991 (WO).

OTHER PUBLICATIONS

J. Rothweiler, "Polyphase Quadrature Filters—A New Sub-band Coding Technique," ICASSP, Apr. 14–16, 1983, Boston, vol. 3 of 3, pp. 1280–1283.

R. Crochiere et al., "Digital Coding of Speech in Sub-Bands," The Bell System Technical Journal, vol. 55, No. 8, Oct. 1976, pp. 1069–1085.

J. Princen et al., "Subband/Transform Coding Using Filter Bank Designs Based on Time Domain Aliasing Cancellation," ICASSP, Apr. 6–9, 1987, vol. 4, pp. 2161–2164.

* cited by examiner

Primary Examiner—David H. Malzahn
(74) Attorney, Agent, or Firm—Sonnenschein, Nath & Rosenthal

(57) ABSTRACT

In band-splitting acoustic signals and subsequently encoding and decoding the band-split signals, band-splitting and band-synthesizing processing with high accuracy is desirable. To this end, an optimizing processor optimizes prototype filter coefficients held on a prototype filter coefficient holder by a window function of a tap length L'. The filter coefficient portions of the optimized prototype filter with both end values equal to zero are discarded for deriving a corrected prototype filter having a tap length L'.

59 Claims, 44 Drawing Sheets

SIGNAL ENCODING AND DECODING SYSTEM

BACKGROUND OF THE INVENTION

1. Field of the Invention

This invention relates to a band synthesis filter bank and a band synthesis filtering for band-synthesizing band-split signals for restoration of the original signals, a band splitting filter bank and a band splitting filtering for band-splitting signals, an encoder and an encoding method, a decoder and a decoding method, and a recording medium.

2. Description of the Related Art

There are a wide variety of methods for encoding signals, such as audio or acoustic signals. Examples of these are a sub-band encoding method, which is a non-blocking frequency spectrum splitting method of splitting time-domain audio signals into plural frequency bands without blocking, using a spectrum-splitting filter, and encoding the resulting signals of the frequency bands, and a so-called transform coding which is a blocking frequency spectrum splitting method of transforming time-domain signals into frequency domain signals by orthogonal transform and encoding the resulting spectral components from one frequency band to another.

There is also known a high-efficiency encoding technique which is a combination of the sub-band coding and transform coding, in which case time domain signals are split into plural frequency bands by sub-band coding and the resulting band signals are orthogonal-transformed into spectral components which are encoded from band to band.

Among the above-mentioned filters is a so-called QMF (quadrature mirror filter) as discussed in 1976, R. E. Crochiere, Digital Coding of Speech in Subbands, Bell Syst. Tech. J. Vol. 55, No. 8, 1976. However, if the frequency spectrum is split into a number of bands, a corresponding number of QMF stages is required, thus increasing the processing volume and consequent signal delay.

Thus, attention is being directed to PQF (polyphase quadrature filter) suffering from only small processing volume and delay and which can split the frequency spectrum into M equal bands such that the number of samples of orthogonal transform associated with the same time point become equal in all bands to simplify the filter bank structure to enable efficient processing. This PQF is discussed in Joseph H. Rothweiler, Polyphase Quadrature Filters—A New Subband Coding Technique, ICASSP 83 BOSTON.

Among the above-mentioned techniques for orthogonal transform is a technique in which an input audio signal is blocked every pre-set unit time, such as every frame, and discrete Fourier transform (DFT), discrete cosine transform (DCT) or modified DCT (MDCT) is applied to each block for converting the signals from those on the time axis to those on the frequency axis. If the above-mentioned DFT or DCT is applied on the basis of a time block composed of N samples, N independent real-number data are obtained. It is noted that, for reducing junction distortions between time blocks, a given time bock is usually overlapped with N1 samples with both neighboring blocks, and N real-number data on an average are quantized and encoded in DFT or DCT for (N–N1) samples.

On the other hand, if the above-mentioned MDCT is used as a method for orthogonal transform, N independent real-number data are obtained from 2N samples overlapped with N samples of both neighboring time blocks. Thus, in MDCT, N real-number data on an average are quantized and encoded for N samples. A decoding device adds waveform elements obtained on inverse transform in each block from the codes obtained by MDCT with interference for reconstructing the waveform signals. Discussions of the MDCT are found in J. P. Princen and A. B. Bradley, Subband/Transform Coding Using Filter Bank Based on Time Domain Aliasing Cancellation, ICASSP 1987. By quantizing signals split into plural frequency bands by a filter or orthogonal transform, the frequency band in which occurs the quantization noise can be controlled so that encoding can be achieved with psychoacoustic higher efficiency by exploiting acoustic characteristics such as masking effects or equal loudness effects.

In high-efficiency encoding/decoding acoustic signals, the frequency spectrum is split in many cases into several bands. In such case, band-splitting/band synthesis of high precision is desirable to remove the effect from the neighboring bands. To this end, a band splitting/band synthesizing filter with as long a tap length as possible and with acute frequency response is typically used. This, however, increases the processing volume to render real-time processing difficult.

In particular, it is necessary to optimize the bit allocation for the spectra components, thus significantly increasing the processing volume. Notwithstanding, an encoder of a larger size and a larger processing capability can be used in many cases, so that the tap length of the frequency-splitting filter bank used for an encoder can be selected to a proper length matched to the desired characteristics. On the other hand, it is not mandatory with an encoder to perform real-time processing.

However, if desired to design an encoder of a small size and a low processing capability, it becomes necessary to suppress the processing volume to a lower value, even although the encoder can use a device of a larger size and a higher processing capability.

In a decoder not in need of an optimizing processing as required for an encoder, a device of a smaller size is desired with a smaller processing volume than that required in an encoder, so that a lower processing volume is desirable. Recently, a decoder is produced by software in many cases. Since the software is lower in processing capability than the hardware, it becomes more crucial to suppress the processing volume to a smaller value.

SUMMARY OF THE INVENTION

It is therefore an object of the present invention to provide a band synthesizing filter bank and a band synthesizing filtering method capable of reducing the processing volume to realize decoding with a low processing volume with priority placed on real-time processing in case it is necessary to use a decoder of low processing capability in carrying out band synthesis processing.

It is another object of the present invention to provide a band-splitting filter bank and a band-splitting filtering method capable of reducing the processing volume to realize encoding with priority placed on real-time processing if, in performing band-splitting, an encoder with a low processing capability needs to be used.

It is still another object of the present invention to provide an encoder in which the processing volume can be controlled to place a priority on the real-time processing if, in performing encoding accompanied by band splitting, the processing capability is low or if the processing capability is changed with time.

It is yet another object of the present invention to provide a decoder in which the processing volume can be controlled to place a priority on the real-time processing if, in performing encoding accompanying band-synthesis processing, the processing capability is low or if the processing capability is changed with time.

In one aspect, the present invention provides a band-splitting filter bank for processing an input signal with band-splitting, including tap length converting means for outputting filter coefficients with a contracted tap length obtained on contracting the filter coefficients of a standard tap length based on the tap length information and processing means for convolving the filter coefficients of the contracted tap length outputted by the tap length converting means with the input signal.

In another aspect, the present invention provides a band-splitting filtering method for band-splitting an input signal including a tap length converting step for outputting filter coefficients with a contracted tap length obtained on contracting the filter coefficients of a standard tap length based on the tap length information and a processing step for convolving the filter coefficients of the contracted tap length outputted by the tap length converting step with the input signal.

In a further aspect, the present invention provides a recording medium having recorded thereon input signals processed with band-splitting processing, the band-splitting processing including a tap length converting step for outputting filter coefficients with a contracted tap length obtained on contracting the filter coefficients of a standard tap length based on the tap length information and a processing step for convolving the filter coefficients of the contracted tap length outputted by the tap length converting step with the input signal.

In a further aspect, the present invention provides a band-synthesizing filter bank for processing an input signal with band synthesis including tap length converting means for outputting filter coefficients with a contracted tap length obtained on contracting the filter coefficients of a standard tap length based on the tap length information and processing means for convolving the filter coefficients of the contracted tap length outputted by the tap length converting means with the input signal.

In a further aspect, the present invention provides a band-synthesizing filtering method for band-synthesizing an input signal, including a tap length converting step for outputting filter coefficients with a contracted tap length obtained on contracting the filter coefficients of a standard tap length based on the tap length information and a processing step for convolving the filter coefficients of the contracted tap length outputted by the tap length converting step with the input signal.

In a further aspect, the present invention provides a recording medium having recorded thereon band-synthesizing filtering processing of band-synthesizing input signals. The band-synthesizing filtering processing includes a tap length converting step for outputting filter coefficients with a contracted tap length obtained on contracting the filter coefficients of a standard tap length based on the tap length information and a processing step for convolving the filter coefficients of the contracted tap length outputted by the tap length converting step with the input signal.

In a further one aspect, the present invention provides a band-splitting filter bank for processing an input signal with band splitting including optimizing processing means for processing filter coefficients using an optimizing function and tap length converting means for converting the tap length of the filter coefficients optimized by the optimizing processing means.

In a further aspect, the present invention provides a band-splitting filtering method for processing an input signal with band splitting processing, including an optimizing processing step for processing the filter coefficients using an optimizing function and a tap length converting step for converting the tap length of the filter coefficients optimized by the optimizing processing step.

In a further aspect, the present invention provides a recording medium having recorded thereon band-splitting filtering processing of band-splitting input signals. The band-splitting processing includes an optimizing processing step for processing filter coefficients using an optimizing function and a tap length converting step for converting the tap length of the filter coefficients optimized by the optimizing processing step.

In a further aspect, the present invention provides a band synthesizing filter bank for processing an input signal with band synthesis processing with modified filter coefficients. The input signal is such a signal band-split by a band-splitting filter bank constituted by a pre-set finite tap length. The filter bank includes optimizing processing means for processing the filter coefficients using an optimizing function and tap length converting means for converting the tap length of the filter coefficients optimized by the optimizing processing means.

In a further aspect, the present invention provides a band synthesizing filtering method for processing an input signal with band synthesis processing with modified filter coefficients. The input signal is such a signal band-split by a band-splitting filter bank constituted by a pre-set finite tap length. The filter bank includes an optimizing processing step for processing filter coefficients using an optimizing function and a tap length converting step for converting the tap length of the filter coefficients optimized by the optimizing processing step.

In a further aspect, the present invention provides a recording medium having recorded thereon band synthesizing filtering processing of band-synthesizing an input signal using modified filter coefficients. The input signal is a signal band-split by a band-splitting filter bank constituted by a pre-set finite tap length. The band-synthesizing processing includes an optimizing processing step for processing filter coefficients using an optimizing function and a tap length converting step for converting the tap length of the filter coefficients optimized by the optimizing processing step.

In a further aspect, the present invention provides an encoder for band-splitting and subsequently encoding an input signal, including a band-splitting filter bank for band-splitting the input signal, and encoding means for encoding a signal band-split by the band-splitting filter bank for generating a codestring, the encoding means writing in the codestring the tap length information used for band-splitting the input signal by the band-splitting filter bank.

In a further aspect, the present invention provides an encoding method for band-splitting and subsequently encoding an input signal, including a band-splitting filtering step for band-splitting the input signal and an encoding step for encoding a signal band-split by the band-splitting filter bank for generating a codestring. The encoding step writes in the codestring the tap length information used for band-splitting the input signal by the band-splitting filtering step.

In a further aspect, the present invention provides a recording medium having recorded thereon encoding processing of band-splitting and subsequently encoding an input signal. The encoding processing includes a band-splitting filtering step for band-splitting the input signal and an encoding step for encoding a signal band-split by the band-splitting filter bank for generating a codestring, the encoding step writing in the codestring the tap length information used for band-splitting the input signal by the band-splitting filtering step.

In a further aspect, the present invention provides a decoder for decoding a codestring encoded by an encoder employing a band-splitting filter bank including readout means for reading out the band-splitting tap length information from the codestring and a band-synthesizing filter bank for setting the band synthesis tap length based on the band-splitting tap length information read out by the readout means, the band-synthesizing filter bank doing band synthesis by the band-splitting tap length.

In a further aspect, the present invention provides a decoding method for decoding a codestring encoded by an encoder employing a band-splitting filter bank including readout means for reading out the band-splitting tap length information from the codestring and a band-synthesizing filtering step for setting the band synthesis tap length based on the band-splitting tap length information read out by the readout means, the band-synthesizing filtering step doing band synthesis by the band-splitting tap length.

In yet another aspect, the present invention provides a recording medium having recorded thereon a decoding processing of decoding a codestring encoded by encoding processing employing a band-splitting filter bank. The decoding processing includes a readout step for reading out the band-splitting tap length information from the codestring and a band-synthesizing filtering step for setting the band synthesis tap length based on the band-splitting tap length information read out by the readout means, the band-synthesizing filtering step doing band synthesis by the band-splitting tap length.

With the band-synthesizing filter bank and filtering method of the present invention, the filter coefficients used on the band synthesizing side are psychoacoustically processed by an optimizing function. The optimized filter coefficients are then corrected and the tap lengths reduced. Thus, if it is required to use a small-sized decoder with a low processing capability at the time of band syntheses, or if a number of application items are running on a sole decoder to impose a high load, acoustic signals can be decoded in real-time.

Also, with the band-synthesizing filter bank and filtering method of the present invention, the filter coefficients of a standard tap length are contracted on the basis of the desired tap length information to give filter coefficients of the desired tap length which are then convolved to derive the band-synthesized signals. Thus, if it is required to use a small-sized decoder with a low processing capability at the time of band syntheses, or if a number of application items are running on a sole decoder to impose a high load, acoustic signals can be decoded in real-time.

With the band-splitting filter bank and the filtering method according to the present invention, the filter coefficients of a standard tap length are contracted on the basis of the desired tap length information to give filter coefficients of the desired tap length which are then convolved to derive the band-synthesized signals. Thus, if it is required to use a small-sized decoder with a low processing capability at the time of band splitting, it becomes possible to reduce the processing volume to realize encoding in which preference is for real-time processing.

Since it is possible with the encoder/decoder according to the present invention to control the processing volume, the tap length L can be set to a larger value if there is sufficient allowance in the processing capability to realize high precision band/splitting/band synthesis, whereas, if there is no sufficient allowance in the processing capability, the tap length L is contracted to reduce the processing volume to realize real-time processing to enable band splitting/band synthesis with only small psychoacoustic problems.

In particular, the present invention is effective when the processing capability is varied with time, as when a number of applications are running simultaneously on a computer, since it allows real-time processing to be continued even if a large load is imposed on the CPU.

The filter coefficients are interchangeable even if the tap length is varied, such that there is raised no psychoacoustic problem if a band-splitting filter having a number of taps different from that of the band-synthesizing filter is used. Therefore, there is derived a merit of hardware interchangeability that a codestring by an encoder of the present invention can be reproduced by a conventional decoder.

DESCRIPTION OF PREFERRED EMBODIMENTS

Figure 1:
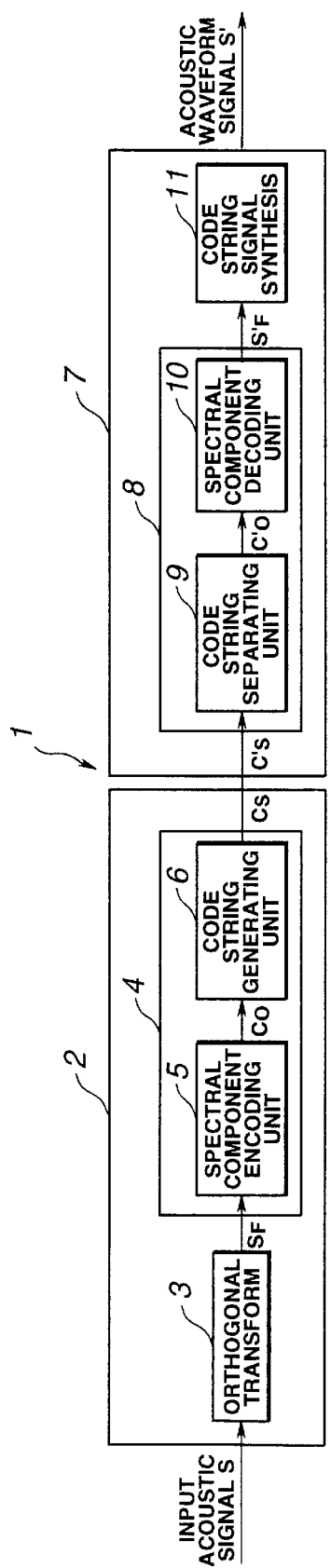
FIG. 1 is a schematic block diagram showing an acoustic signal encoding/decoding system for implementing the band-synthesizing filter bank and the filtering method according to the present invention.

The band-synthesizing filter bank and the filtering method, band-splitting filter bank and the filtering method, an encoding method and device, a decoding method and device and a recording medium according to the present invention will be explained with reference to the drawings.

An embodiment of the present invention is directed to an acoustic signal encoding/decoding system 1 which first spectrum-splits acoustic signals, such as audio or speech signals, orthogonal-transforms the resulting band-based signals, encodes the band-based spectral components to generate a codestring, and dissolves the codestring for restoring the band-based encoded output from band to band for subsequently band-synthesizing the restored signals for decoding the acoustic signals, such as audio or speech signals.

This encoding/decoding system for acoustic signals 1 includes an encoder 2 for band-splitting and orthogonal-transforming an input acoustic signal and encoding spectral components from band to band, and a decoder 7 for restoring band-based signals from a codestring outputted by the encoder 2 and band-synthesizing the restored signals for outputting an output acoustic signal S'.

The encoder 2 includes an orthogonal transform unit 3 for orthogonal-transforming band-based signals for outputting resulting spectral signal components $S_F$ for outputting the spectral signal components $S_F$, and an encoding unit 4 for encoding the spectral components resulting from orthogonal transform for generating an encoded output $C_0$. The encoding unit 4 includes a spectral component encoding unit 5 for encoding the spectral signal components $S_F$ for generating an encoded output $C_0$ and a codestring generating unit 6 for generating a codestring $C_S$ from the encoded output $C_0$.

The decoder 7 includes a decoding unit 8 for restoring the codestring $C_S$ from band to band for outputting spectral components $S_F'$ and a time-domain signal synthesis unit 11 for inverse-orthogonal-transforming band-based spectral components $S_F'$ for effectuating band synthesis for outputting the output acoustic signal S'. The decoding unit 8 includes a codestring resolving unit 9 for resolving the codestring $C_S'$ for extracting the encoded output $C_0'$ and a spectral component decoding unit 10 for restoring the spectral components $S_F'$ from the extracted encoded output $C_0'$ for outputting the restored spectral components $S_F'$.

Figure 2:
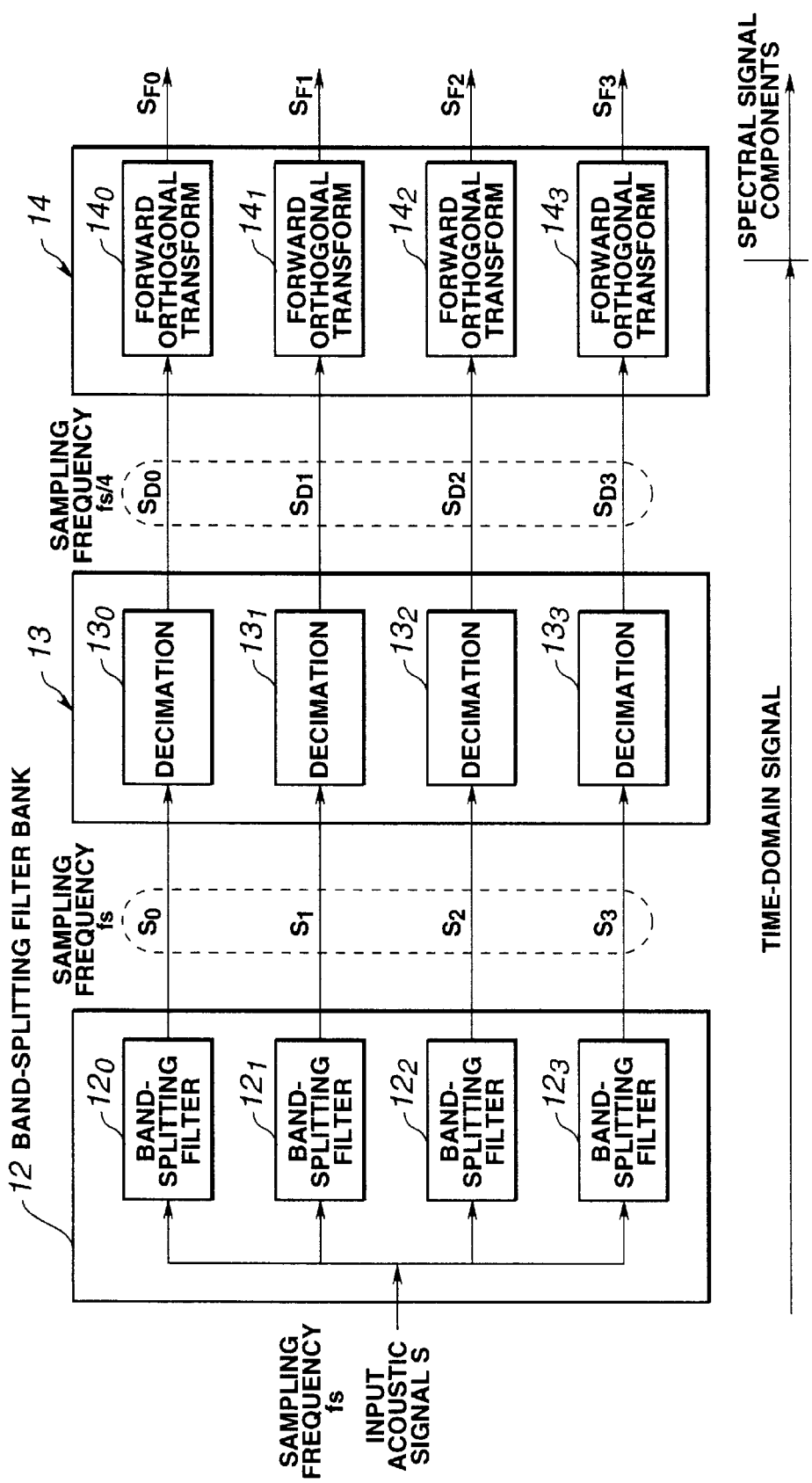
FIG. 2 is a block diagram showing a detailed structure of an orthogonal transform unit employed on an encoder side of the acoustic signal encoding/decoding system.

The orthogonal transform unit 3 may be implemented as shown in FIG. 2. First, the input acoustic signal S has its entire frequency spectrum split into, for example, four equal parts. Specifically, the input acoustic signal S has its entire frequency spectrum uniformly split into M (=4) by band-splitting filters $12_0$, $12_1$, $12_2$ and $12_3$ making up a band-splitting filter bank 12 such as a PQF filter bank.

The frequency response of the respective filters of the band-splitting filter bank 12, such as the PQF filter bank, is found by shifting the frequency response of a low-pass filter termed a prototype filter having a pass-band equal to $\pi/2M$ on the frequency axis, as will be explained subsequently.

The time-domain signals $S_0$, $S_1$, $S_2$ and $S_3$, band-split by the band-splitting filter bank 12, is decimated by decimating units $13_0$, $13_1$, $13_2$ and $13_3$ so that the number of samples is reduced to 1/M of that of the input acoustic signal S so that the time-domain signals $S_0$, $S_1$, $S_2$ and $S_3$ now prove to be time-domain signals $S_{D0}$, $S_{D1}$, $S_{D2}$ and $S_{D3}$. These time-domain signals are transformed by forward orthogonal transform units $14_0$, $14_1$, $14_2$ and $14_3$ such as modified DCT units, into spectral components $S_{F0}$, $S_{F1}$, $S_{F2}$ and $SF_3$, respectively.

The time-domain signals $S_0$, $S_1$, $S_2$ and $S_3$, outputted by the band-splitting filter bank 12, are passed through the decimation unit 13 to prove to be the time-domain signals $S_{D0}$, $S_{D1}$, $S_{D2}$ and $S_{D3}$. The number of samples is now reduced to 1/M of that of the input acoustic signal S, with the bandwidth being 1/M. With the bandwidth thus reduced to 1/M, aliasing is produced between neighboring bands to produce aliasing components. These aliasing components, however, can be cancelled out by band-synthesis processing by a PQF filter bank in the decoder 7 as later explained.

Figure 3:
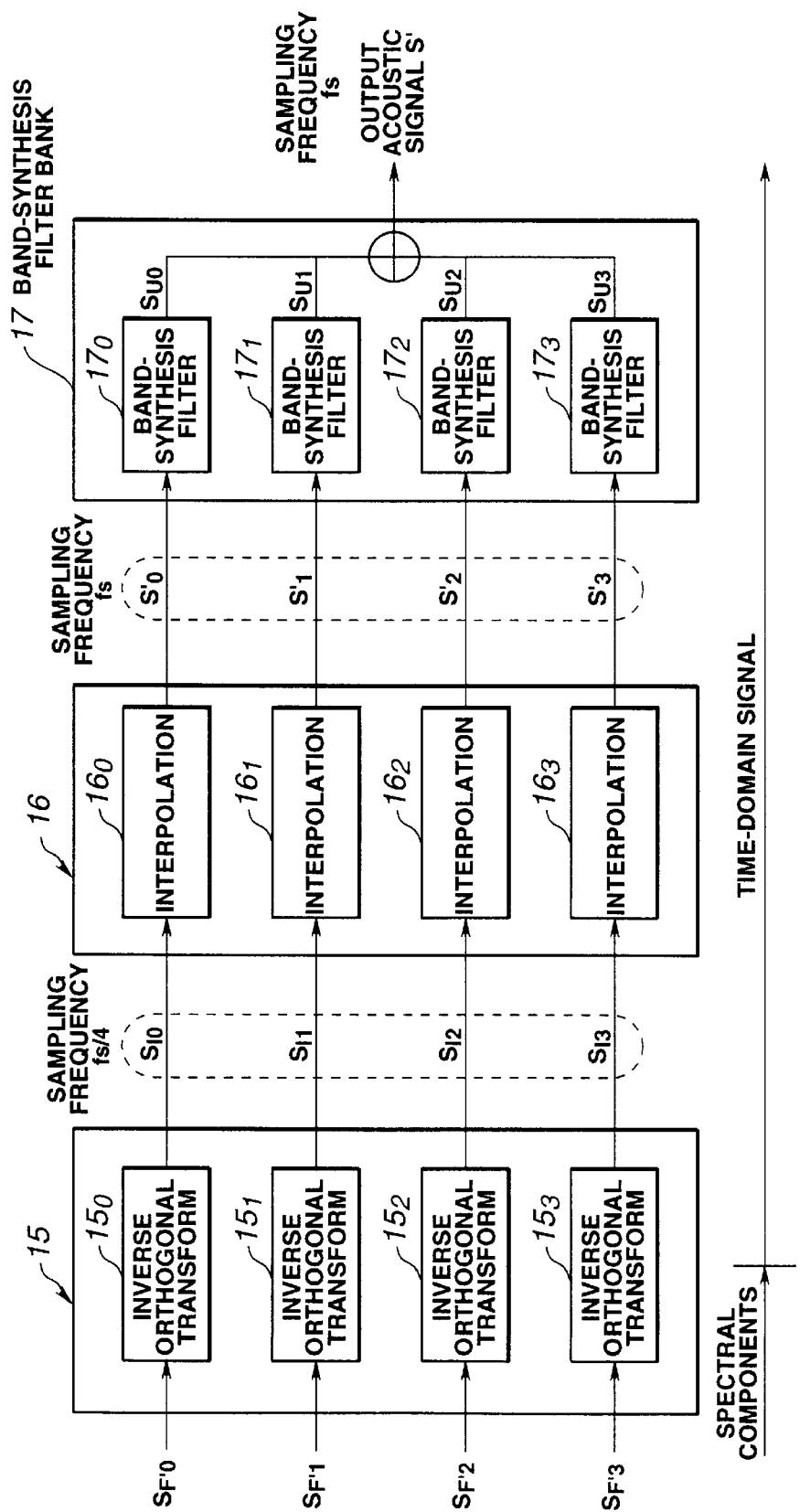
FIG. 3 is a block diagram showing a detailed structure of a time-domain signal synthesizing unit used on an encoder side of the acoustic signal encoding/decoding system.

The time-domain signal synthesis unit 11 of the decoder 7 can be implemented as shown in FIG. 3. The spectral components $S'_{F0}$, $S'_{F1}$, $S'_{F2}$ and $S'_{F3}$, restored by the spectral component decoding unit 10, are transformed into time-domain signals $S_{10}$, $S_{11}$, $S_{12}$ and $S_{13}$ by inverse orthogonal transform unit $15_0$, $15_1$, $15_2$ and $15_3$.

In the final stage of the time-domain signal synthesis unit 11 is provided a band-synthesizing filter bank 17. For producing the output acoustic signal substantially by band-synthesis processing by the band-synthesizing filter bank 17, it is necessary to convert the sampling frequency $f_S/M$ to an M-tupled frequency, that is to $f_S$.

Thus, the time-domain signals $S_{10}$, $S_{11}$, $S_{12}$ and $S_{13}$, having the sampling frequency $f_S/M$, are converted by an interpolator 16 into time-domain signals $S'_0$, $S'_1$, $S'_2$ and $S'_3$ of the sampling frequency $f_S$. Although aliasing is produced at this time between the bands, these aliasing components contained in the signals of the M bands are cancelled by the band-synthesizing filters $17_0$, $17_1$, $17_2$ and $17_3$ of the band-synthesizing filter bank 17. The time-domain signals $S_{U0}$, $S_{U1}$, $S_{U2}$ and $S_{U3}$ are synthesized to a sole output to produce an output acoustic signal S'.

Figure 4:
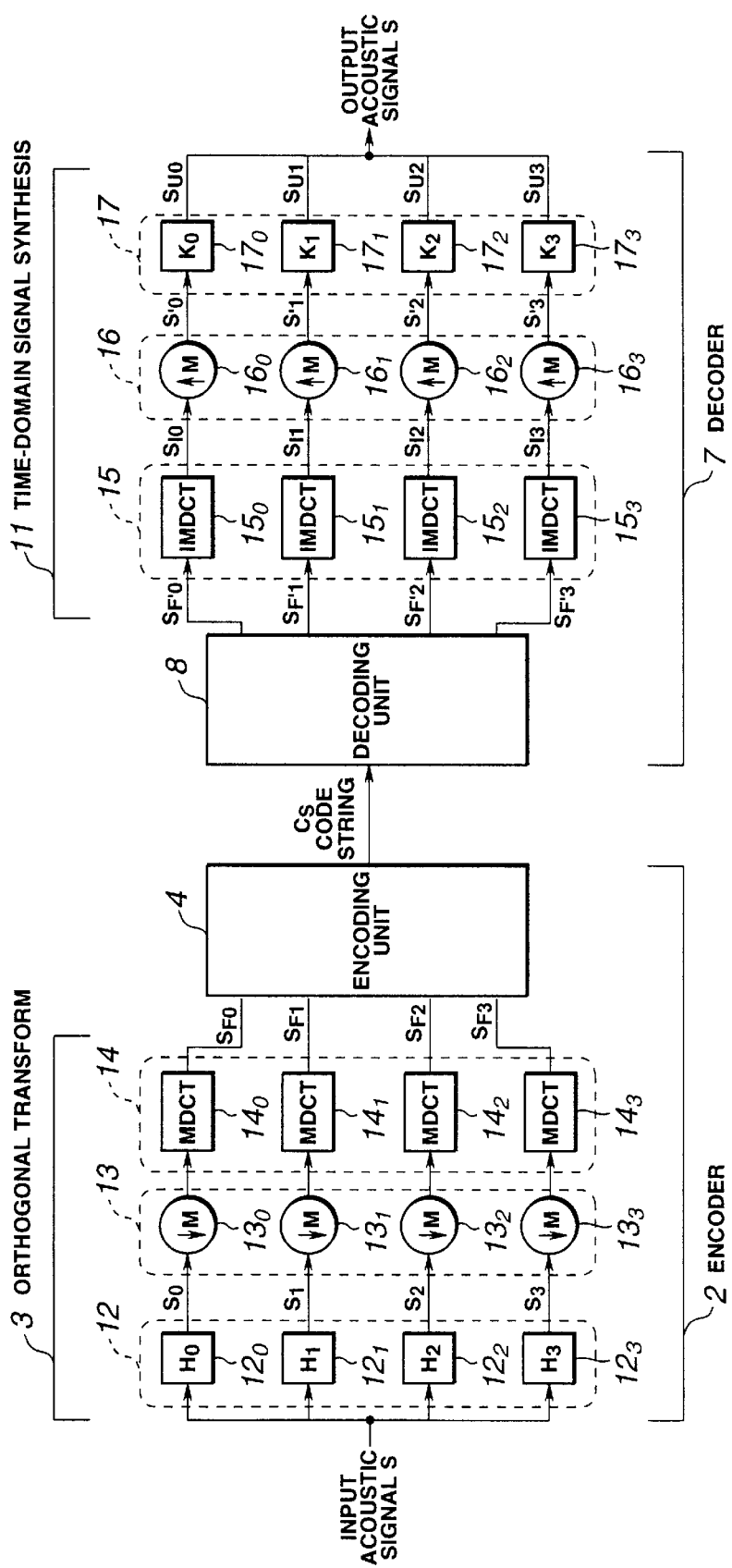
FIG. 4 is a block diagram showing the structure of the acoustic signal encoding/decoding system employing the orthogonal transform unit of FIG. 2 and the time-domain signal synthesis unit of FIG. 3.

If the orthogonal transform unit 3 shown in FIG. 2 is used as the orthogonal transform unit 3 of FIG. 1, and the time-domain signal synthesis unit 11 shown in FIG. 3 is used as the time-domain signal synthesis unit 11 of FIG. 1, the acoustic signal encoding/decoding system 1 shown in FIG. 1 has a configuration shown in FIG. 4. Here, a PQF filter bank with M=4 is used as a filter bank and MDCT is used as orthogonal transform.

Figure 5:
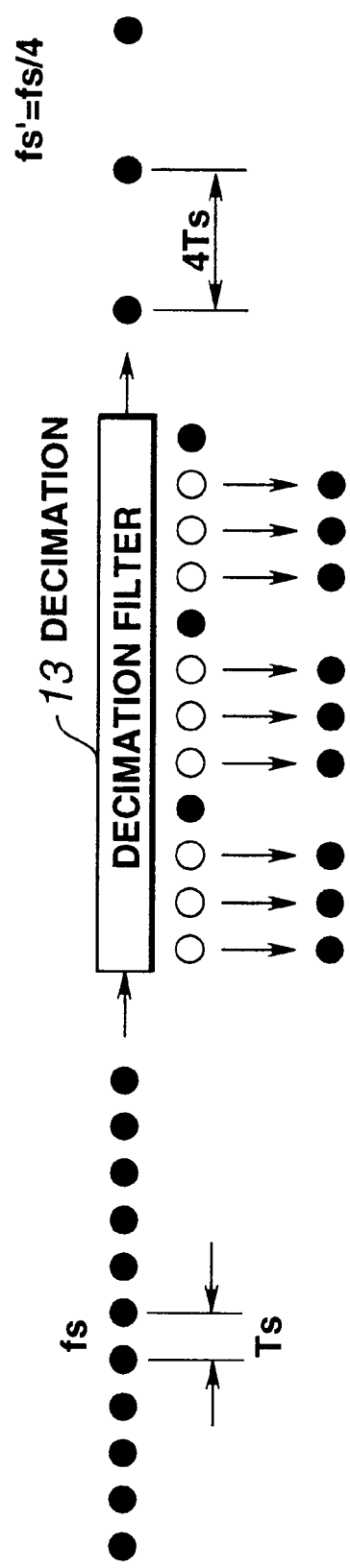
FIG. 5 illustrates the operation of a decimation filter.

The orthogonal transform unit 3 is provided with a decimation unit 13 shown in FIG. 4. The decimation unit 13 decimates the time-domain signals $S_0$ to $S_3$, outputted by the band-splitting filters $12_0$ to $12_3$ making up the band-splitting filter bank 12, using a decimation filter DF shown in FIG. 5. Since M=4, only the leading-end samples of the four samples of the time-domain signals $S_0$ to $S_3$ having the sampling frequency $f_S$ are outputted by the decimation filter DF, whilst the remaining three samples are discarded. By this operation, the signal sampling frequency proves to be $f_S/4$, with the signal bandwidth being 1/4.

Figure 6:
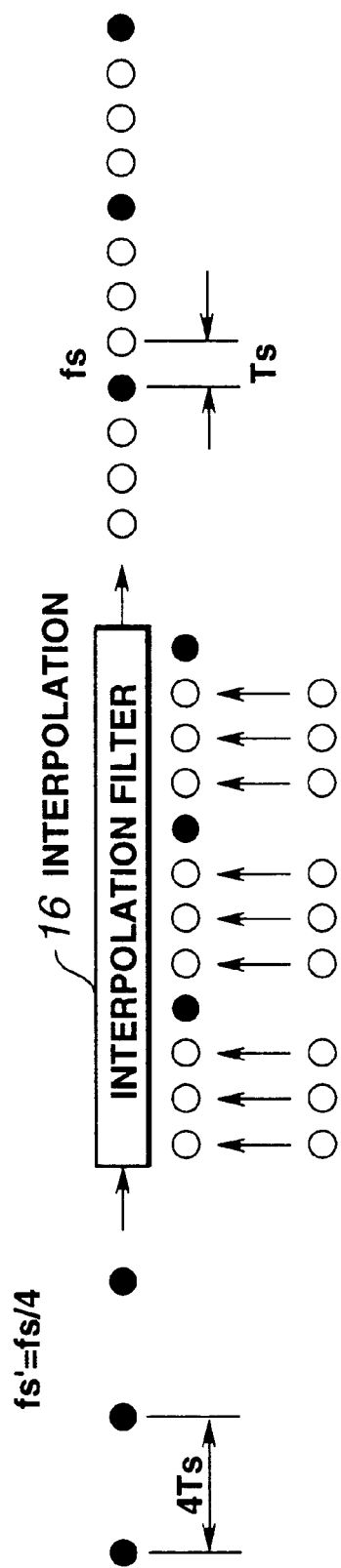
FIG. 6 illustrates the operation of an interpolation filter.

The time-domain signal synthesis unit 11 is provided with the interpolator 16, as shown in FIG. 4. This interpolator 16 interpolates the time-domain signals $S_{10}$ to $S_{13}$ outputted by the IMDCT units $15_0$, $15_1$, $15_2$ and $15_3$ of the inverse orthogonal transform unit 15 using an interpolation filter IF shown in FIG. 6. Since M=4, three data each with a value of 0 are inserted by the interpolation filter IF to the time-domain signals $S_{10}$ to $S_{13}$. This processing converts the sampling frequency from $f_S/4$ to $f_S$. At this time, however, aliasing components are introduced into the output of the interpolation filter IF. The four band signals, containing the aliasing components, are passed through band-synthesizing filters $17_0$, $17_1$, $17_2$ and $17_3$ of the band-synthesizing filter bank 17 for cancelling the aliasing components.

Meanwhile, the band-splitting filter bank 12, used in the orthogonal transform unit 3 shown in FIGS. 1, 2 and 4, is required to have acute cut-off performance for effectuating high-precision transform by the downstream side forward orthogonal transform unit 14.

In the following description, it is assumed that the band-splitting filter bank is constituted by a PQF filter bank having filter coefficients hx(96), where x=0 to M−1, with the tap length L=96.

Figure 7:
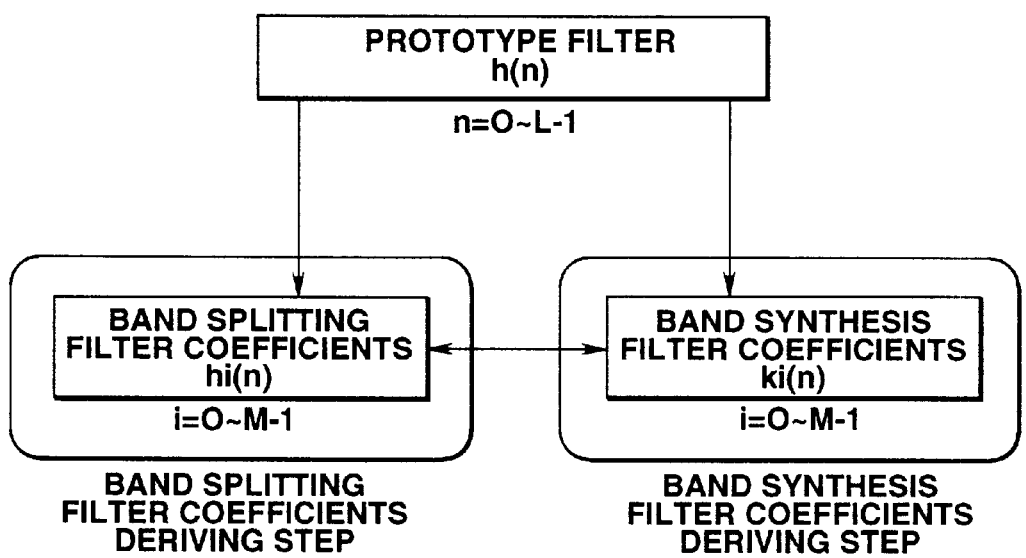
FIG. 7 illustrates the relation between a prototype filter, band-splitting filter coefficients and band-synthesizing filter coefficients.

The band-splitting filter coefficients $H_0$, $H_1$, $H_2$ and $H_3$ of band-splitting filters $12_0$, $12_1$, $12_2$ and $12_3$ of the band-splitting filter bank 12, constituted by the PQF filter bank, may be found by shifting the frequency response of the prototype filter of the pass-band of $\pi/2M$ on the frequency axis by the band-splitting filter coefficient deriving step shown in FIG. 7.

Meanwhile, the band synthesis filter coefficients $K_0$, $K_1$, $K_2$ and $K_3$ of the band-synthesizing filters $17_0$, $17_1$, $17_2$ and $17_3$ of the band-synthesizing filter bank 17 constituted by the PQF filter bank may be found by shifting the frequency response of the prototype filter of the pass-band of $\pi/2M$ on the frequency axis by the band-synthesizing filter coefficient deriving step shown in FIG. 7.

It should be noted that the coefficients $H_0$, $H_1$, $H_2$ and $H_3$ and the coefficients $K_0$, $K_1$, $K_2$ and $K_3$ are closely correlated with one another, so that, if one of the coefficients is set, the other is set unequivocally.

Figure 8A:
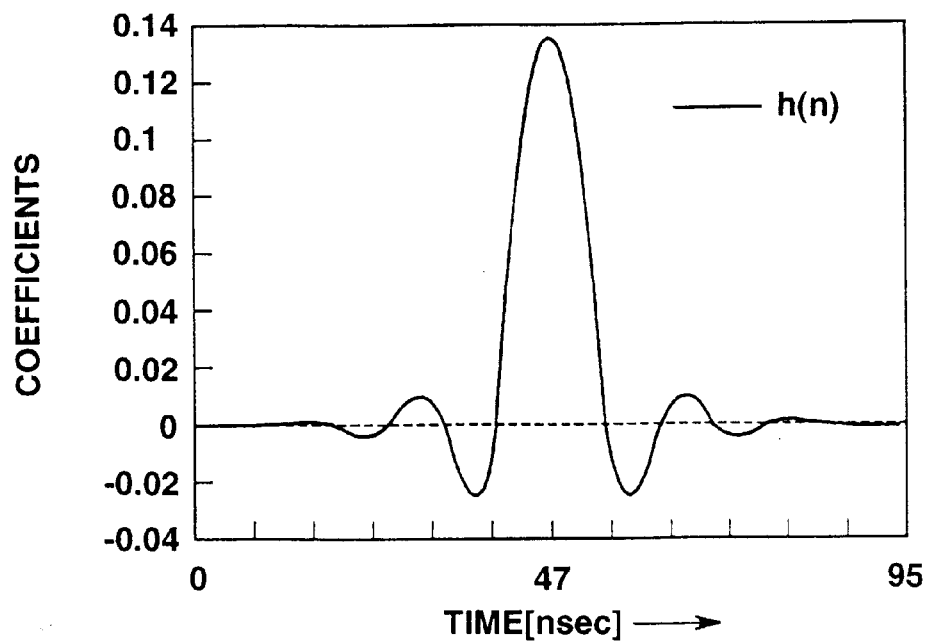
FIGS. 8A and 8B illustrate the impulse response and frequency response of the prototype filter.
Figure 8B:
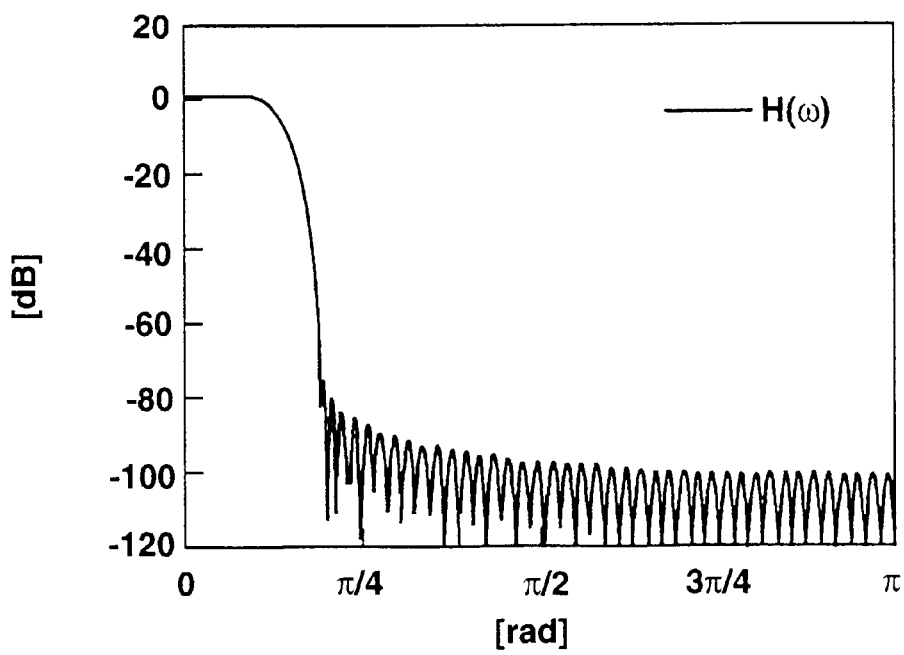

It is assumed that, for the prototype filter h(n) shown in FIG. 7, with a tap length L=96, the impulse response shown in FIG. 8A, is used. The frequency response of this prototype filter has amplitude characteristics $H(\omega)$ shown in FIG. 8B and can be represented by:

$$H(\omega)=0 \ (|\omega|>\pi/M)$$

$$H^2(\omega)+H^2(\pi/M-\omega)=1 \ (|\omega|>\pi/M)$$

This prototype filter is a low-pass filter for limiting the pass-band width to 1/2M instead of 1/M. The band-splitting filter coefficients of the band-based band-splitting filters constituted by the PQF filters with a tap length of L=96 can be found by shifting the frequency response of this prototype filter h(n) on the frequency axis.

Figure 9A:
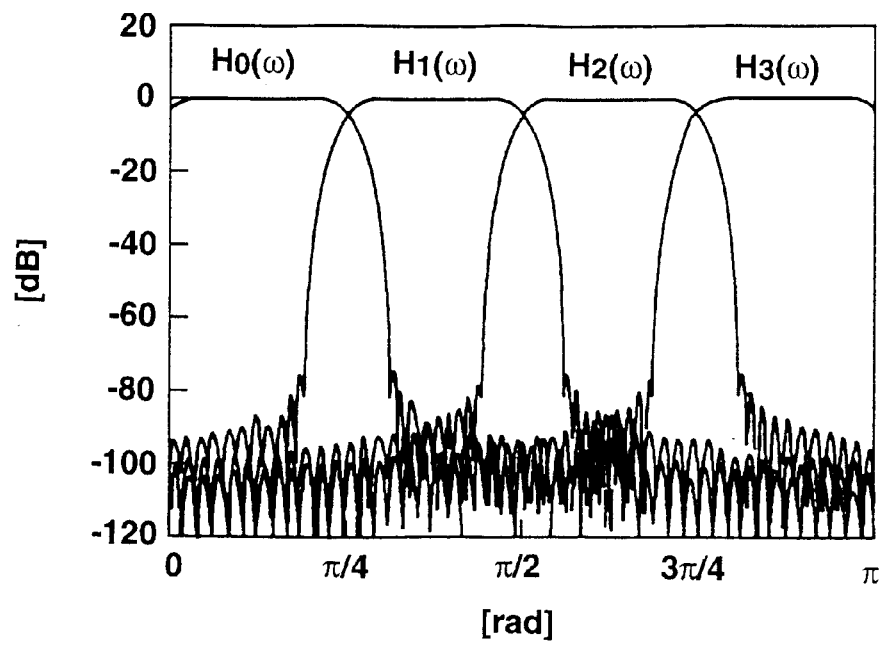
FIGS. 9A and 9B illustrate the frequency response of a band-splitting filter and a band-synthesis filter derived from the prototype filter having the characteristics shown in FIGS. 8A and 8B.

The frequency response of the band-based splitting filters of the PQF filter bank, derived from the prototype filter h(n) with tap length L=96 having the characteristics shown in FIG. 8, was found. The results are as shown in FIG. 9A and FIG. 10A. The frequency response $H_0(\omega)$, $H_1(\omega)$, $H_2(\omega)$ and $H_3(\omega)$ of the band-based splitting filters have the attenuation of the inhibited band of not less than 80 dB. More specifically, the cut-off characteristics of 80 to 100 dB are secured, such that aliasing from neighboring bands can be suppressed sufficiently.

Figure 9B:
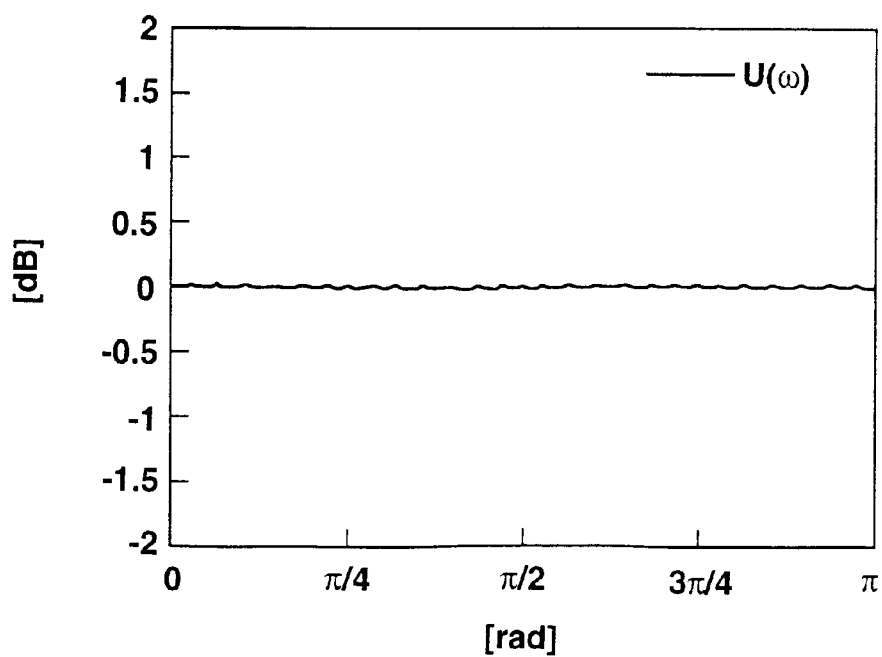

If the band-synthesizing filter is constituted by a PQF filter bank, having filter coefficients kx (x=0 to M−1) with a tap length of 96 in association with the band-splitting filter bank 12 shown in FIG. 10A, ripples of the frequency response $U(\omega)$ in case the respective bands are synthesized as shown in FIG. 9B and in FIG. 10B, are suppressed to an extremely low value of not more than 0.01 dB. The band splitting/band synthesis can be realized to an extremely high precision with the use of the PQF filter with the tap length equal to 96.

The processing volume of the PQF filter bank, that can be used for the band-splitting filter bank 12 or the band-synthesizing filter bank 17 takes up a large proportion in the processing volume of the encoding/decoding device in its entirety, and is increased or decreased in proportion to the tap length. Thus, the processing volume of the encoding/decoding device in its entirety can be controlled by varying the tap length.

The present invention enables the processing volume of the encoding/decoding device to be controlled in its entirety by suppressing the deterioration in the sound quality to a minimum in case the tap length of the PQF filter bank is rendered variable.

Figure 11:
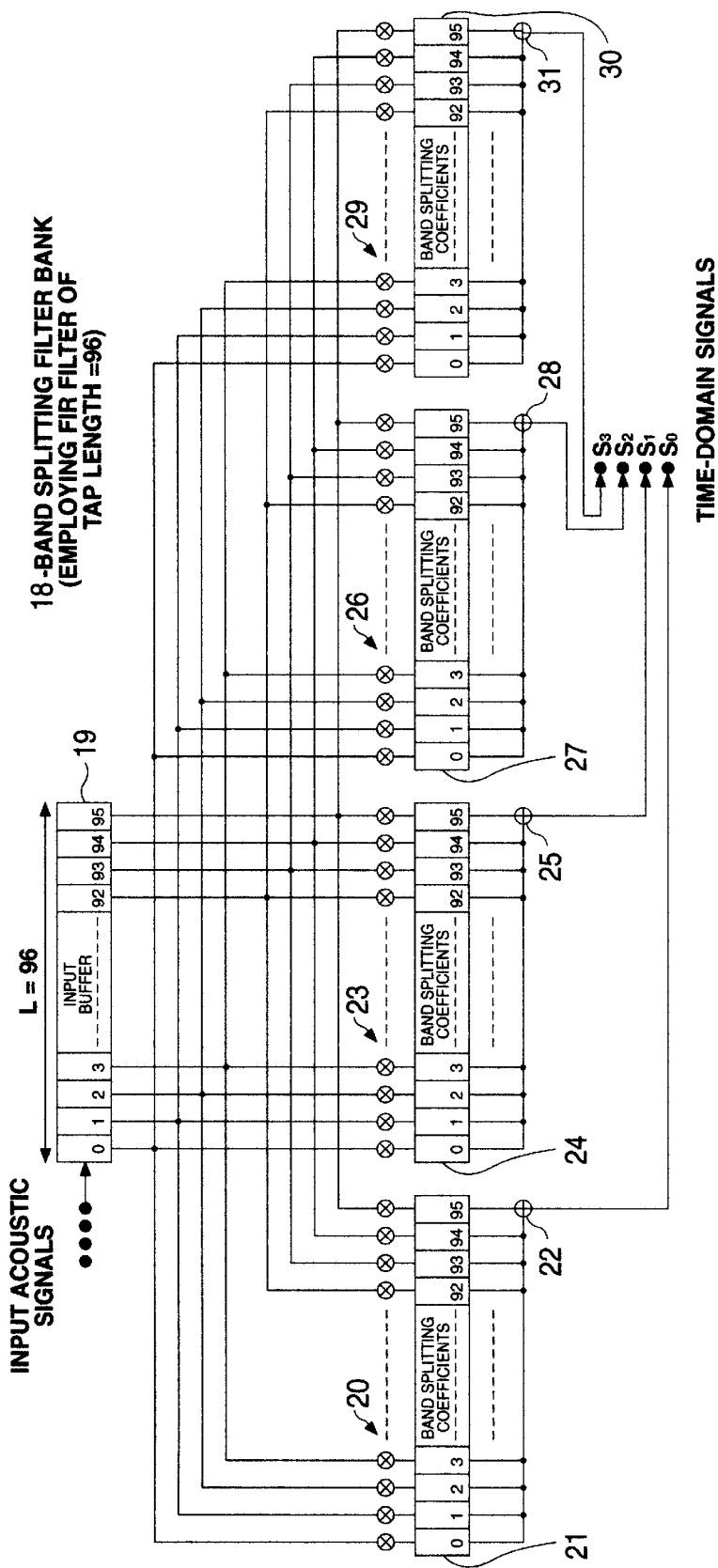
FIG. 11 illustrates the structure of a band-synthesis filter bank employing a band-splitting filter having the characteristics shown in FIGS. 9 and 10.

For comparison, a band-splitting filter bank 18 constructed using an FIR filter with a tap length L=96 is shown in FIG. 11. To an input buffer 19 is entered the input acoustic signal S sample-by-sample. The processing of convolution by the input buffer 19 and the four filter coefficient-holding units 21, 24, 27 and 30 is carried out by sets of multipliers 20, 23, 26 and 29 and adders 22, 25, 28 and 31 for producing band-based signal components $S_0$, $S_1$, $S_2$ and $S_3$. With this band-splitting filter bank 18, there are 96 processing operations per sample.

Meanwhile, in the encoder 2, encoding need not necessarily be carried out in real-time. Thus, an encoder having a higher processing capability can be used. As a result, the tap length of the band-splitting filter bank can, from time to time, be set to a suitable value matched to desired characteristics.

Figure 13:
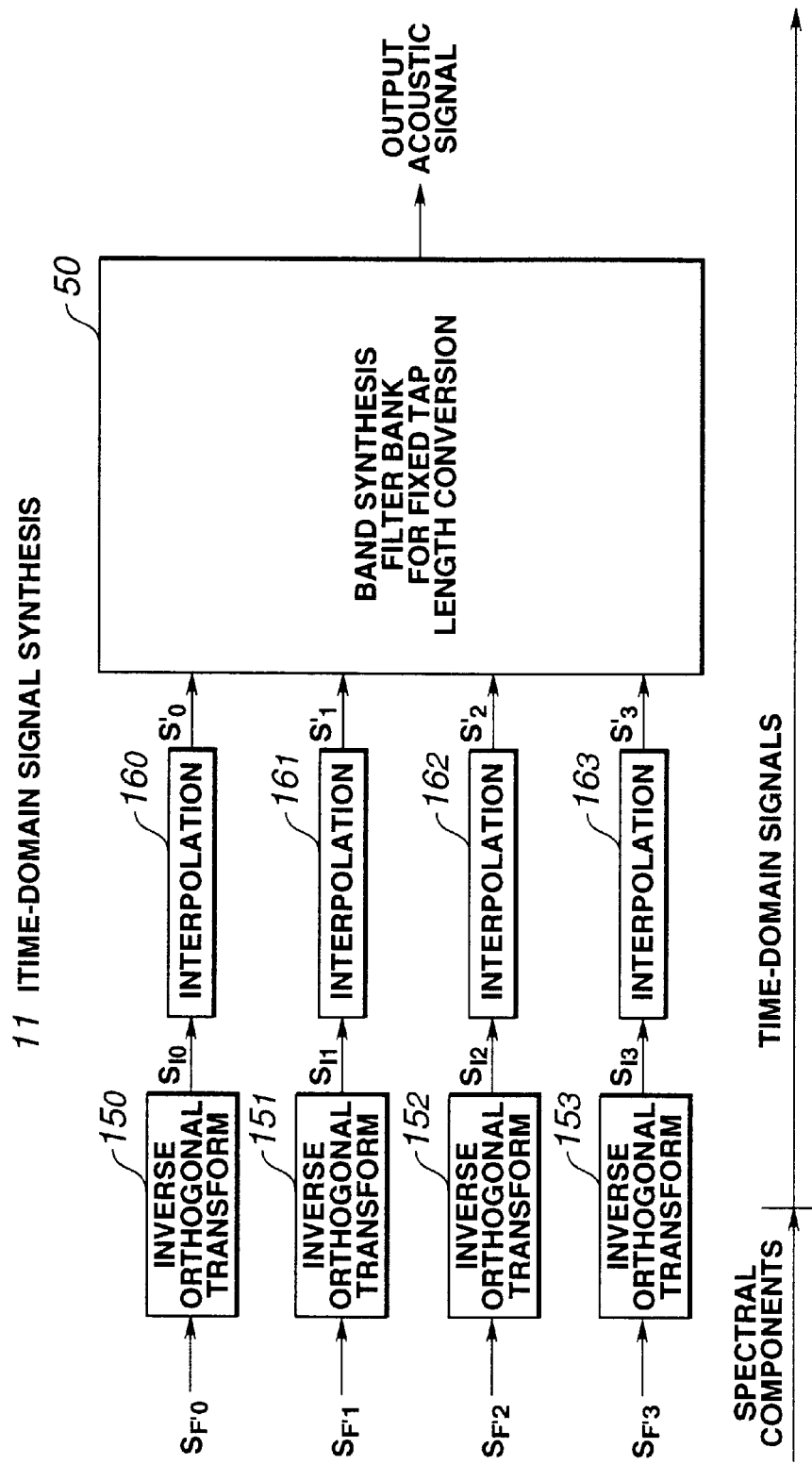
FIG. 13 is a block diagram showing the structure of a fixed tap length band synthesizing filter bank having a tap length shorter than the tap length of the band-splitting filter of the orthogonal transform unit.

On the other hand, if the decoder 7 of a higher processing capability needs to be used for performing band-synthesis, it occurs from time to time that the processing cannot catch up with the increased tap length, such that real-time decoding of the acoustic signal becomes impossible. The expedition of processing only for the band synthesis is hereinafter explained. FIG. 13 shows the structure of the time-domain signal synthesis unit 11 constituting the decoder capable of expediting the band-synthesizing operation.

The time-domain signal synthesis unit 11, shown in FIG. 13, employs a fixed tap length converting band-synthesizing filter bank 50. This fixed tap length converting band-synthesizing filter bank 50 has a fixed tap length L (such as 64 or 48) which is shorter than the tap length L of, for example, 96, of the band-splitting filter bank 12 constituting the orthogonal transform unit 3 in the encoder 2.

Figure 14:
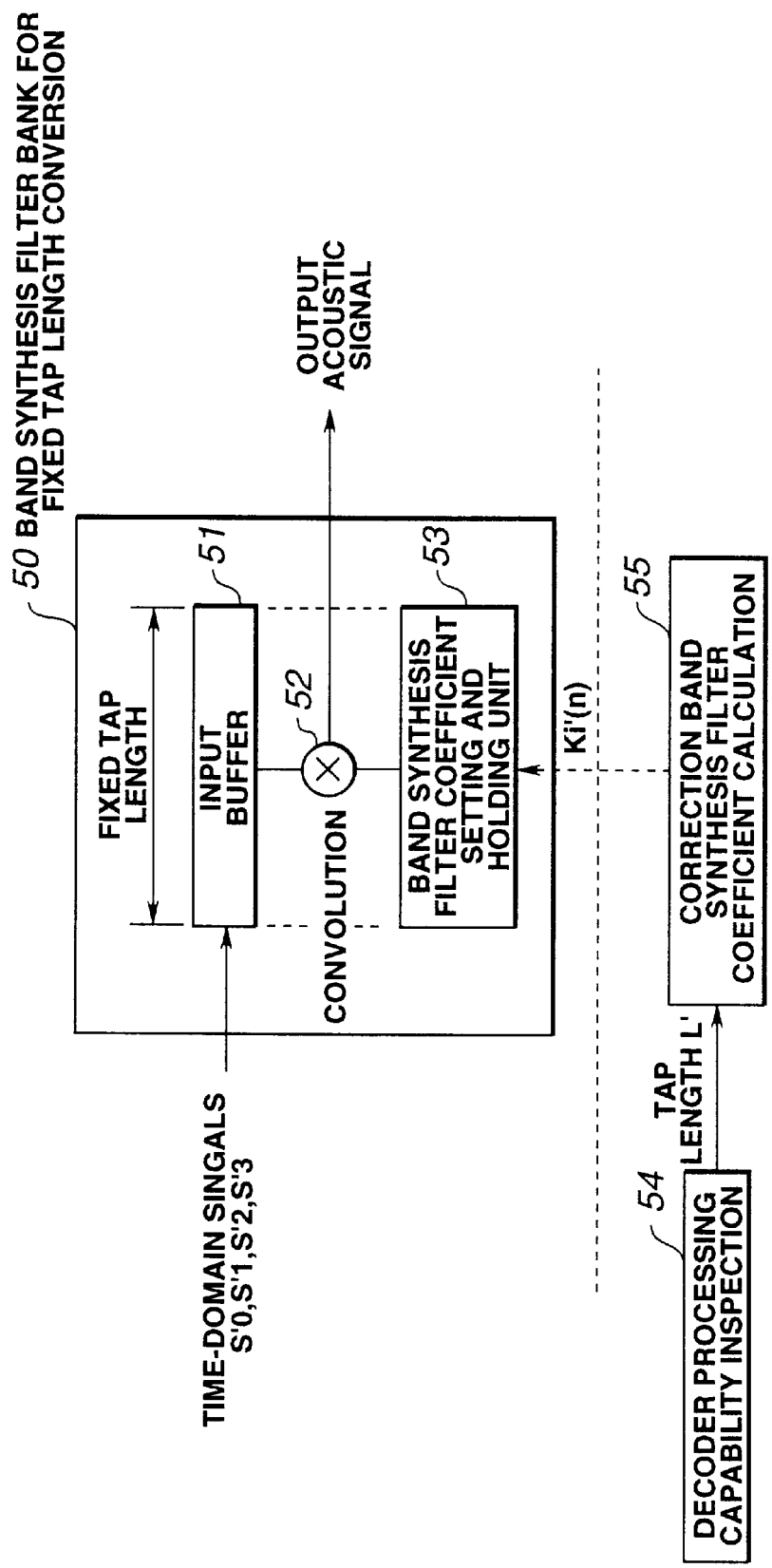
FIG. 14 is a block diagram showing the structure of the fixed tap length band synthesizing filter bank shown in FIG. 13.

Referring to FIG. 14, the fixed tap length converting band-synthesizing filter bank 50 includes an input buffer 51 to which are entered time-domain signals $S'_0$, $S'_1$, $S'_2$ and $S'_3$, a convolution processing unit 52 and a band synthesis filter coefficient setting and holding unit 53 for correcting the band synthesis filter coefficients depending on the processing capability of the decoder, as later explained.

A decoder processing capability inspection unit 54 previously checks the processing capability of the decoder 7 to derive the tap length L' that can be calculated. The band synthesis filter coefficients are derived such as to enable characteristics required by the correction band synthesis filter coefficient processor 55 to be obtained. The band synthesis filter coefficients are set in the band synthesis filter coefficient setting and holding unit 53 and subsequently convolved by the convolution processing unit 52 on the time-domain signals $S'_0$, $S'_1$, $S'_2$ and $S'_3$ fed via the input buffer 51 for outputting the resulting output acoustic signal S'.

Since the tap length of the fixed tap length converting band-synthesizing filter bank 50 is reduced from L to L', the convolution processing volume is also reduced as compared to the case of the tap length equal to 96. For example, if the tap length L=96, the volume of product sum processing required for band synthesis processing with the tap length L=96 is 96 per sample, whereas, if the tap length L=64, 64 product-sum operations per sample suffice, thus enabling expedition of the band-synthesis processing.

The decoder processing capability inspection unit 54 for checking the processing capability of the decoder 7 simply checks the processing capability proper to the decoder used for band synthesis processing and is used for a case in which, if the tap length L' is once set, the processing capability of the decoder is not changed with time.

Figure 15:
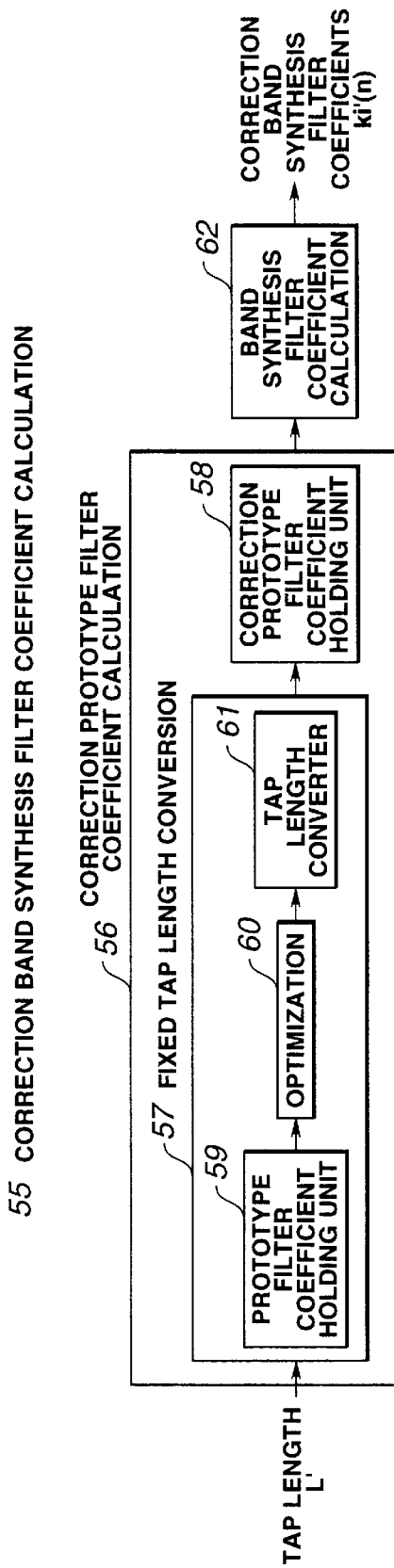
FIG. 15 is a block diagram showing a detailed structure of a correction band-synthesizing filter coefficient processor of a fixed tap length converting band-synthesizing filter bank shown in FIG. 14.

The correction band synthesis filter coefficient processor 55 shown FIG. 14 is constructed as shown in FIG. 15. First, the correction prototype filter coefficient processor 56 finds the correction protocol type filter coefficients of the tap length L' from the prototype filter with the tap length L=96.

The correction prototype filter coefficient processor 56 includes a fixed tap length conversion unit 57 for converting the tap length of the prototype filter with the tap length L=96 and a correction prototype filter coefficient holder 58 for holding the coefficients of the correction prototype filter fixed-tap-length-converted by the fixed tap length conversion unit 57.

The fixed tap length conversion unit 57 includes a prototype filter coefficient holder 59 for holding the prototype filter coefficients with the tap length L=9, an optimization processor 60 for optimizing the prototype filter coefficients held by the prototype filter coefficient holder 59 with the windowing function of the tap length L' and a tap length conversion unit 61 for rounding off the filter coefficients having both end values of the optimized prototype filter of the tap length L' for deriving the corrected prototype filter with the tap length L'.

From the corrected prototype filter with the tap length L', derived by this correction prototype filter coefficient processor 56, a band synthesis filter coefficient processor 62 operating as the band synthesis filter coefficients deriving step shown in FIG. 7 derives the corrected band synthesis filter coefficients $k_i'(n)$ with the tap length L'.

Figure 16:
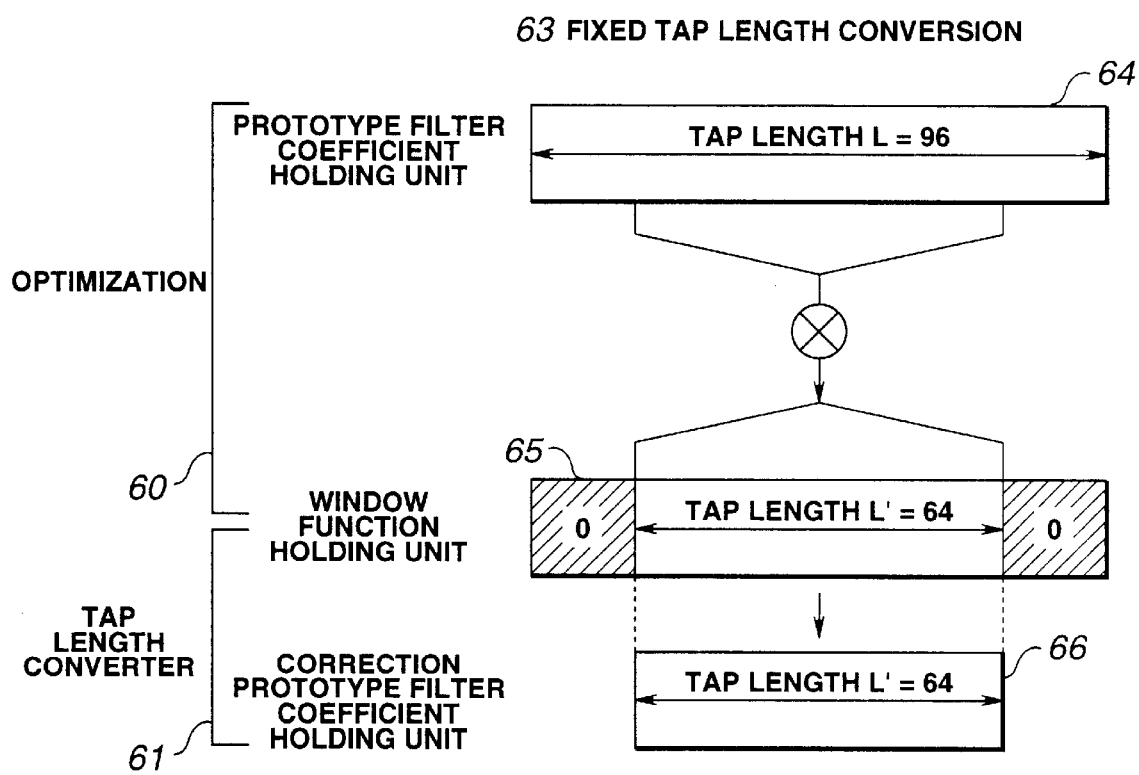
FIG. 16 is a block diagram showing a detailed structure of the fixed tap length converting portion of the correction band-synthesizing filter coefficient processor shown in FIG. 15.

FIG. 16 shows a fixed tap length conversion unit 63 for converting the tap length L=96 to the tap length L'=64.

FIG. 16 shows, as an example, the fixed tap length conversion unit 63 for converting the tap length L=96 to the tap length L'=64. First, the optimization processor 60 applies the window function with the tap length L'=64 held by the window function holder 65 to the prototype filter coefficients with the tap length L=96 held on a prototype filter coefficient holder 64. It is noted that 16 taps from both ends of the window function w(n) are 0 in value, thus not affecting the processing precision. Therefore, this portion can be rounded off in the tap length conversion unit 61.

Figure 17:
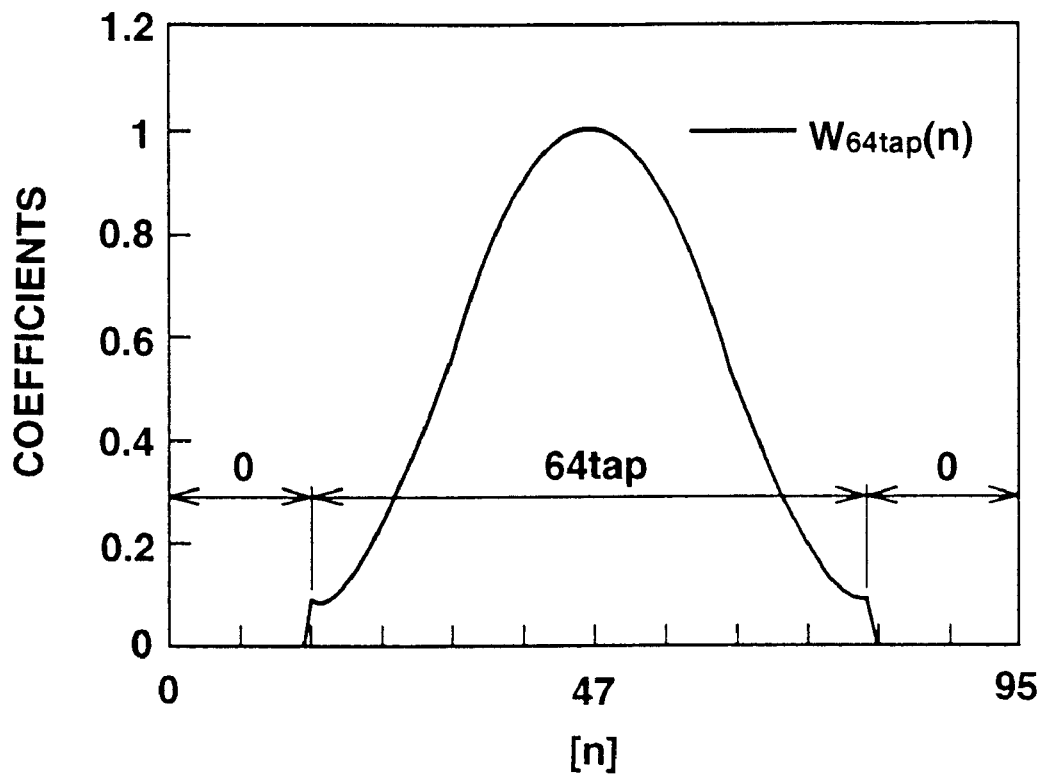
FIG. 17 illustrates an example of coefficients of the window function holder shown in FIG. 16.

As a window function employed in the optimization processor 60 of FIG. 16, a specified example of the Hamming function $w_{64tap}(n)$ with the tap length L'=64 is shown in FIG. 17. This Hamming function s represented by $w(n)=0.54-0.46\cos(2\pi(n-1)/(L'-1))$ 16<n<81 and $i=(L-L')/2$ $w(n)=0$ for other values of n.

By smoothly converting the value at the time of rounding off both ends of the prototype filter h(n), non-continuous portions on the tap can be reduced to optimize the frequency separation characteristics.

Figure 18A:
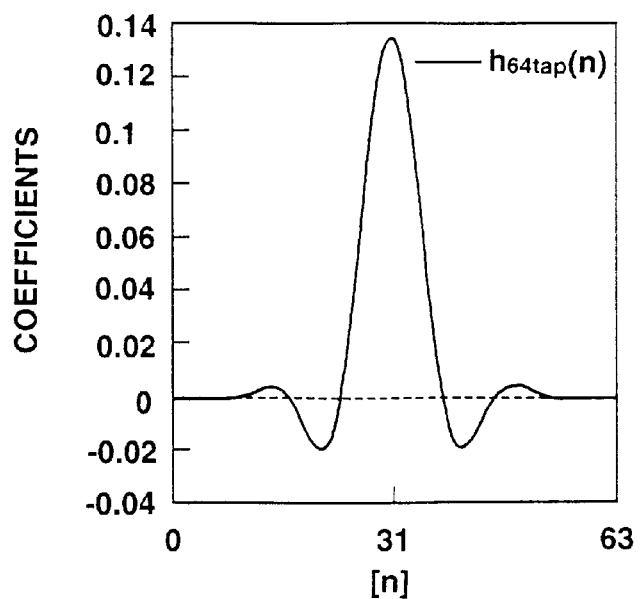
FIGS. 18A and 18B illustrate the impulse response and the frequency response of the correction prototype filter obtained on acting the window function of FIG. 17 on the prototype filter having the characteristics shown in FIG. 8.
Figure 18B:
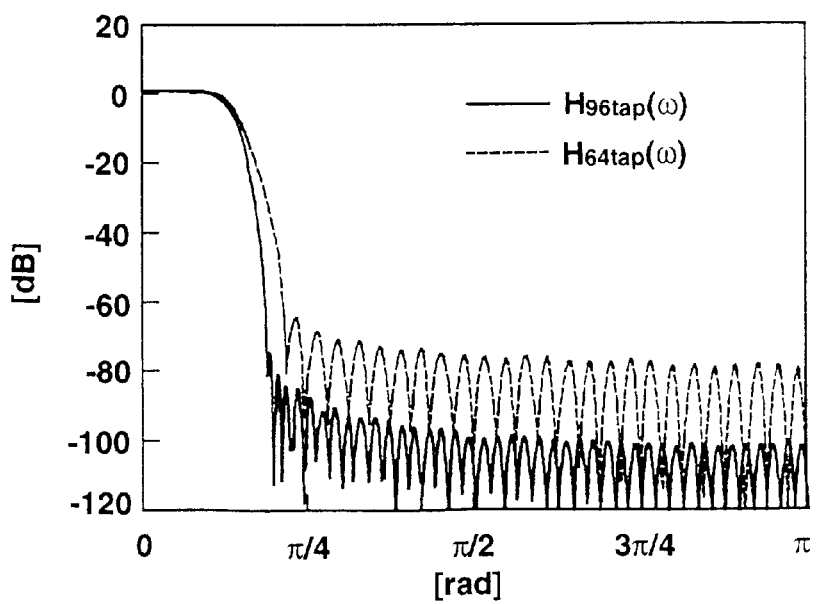

FIG. 18A shows the impulse response of the corrected prototype filter $h_{64tap}(n)$ derived by the fixed tap length conversion unit 63 employing the Hamming function shown in FIG. 17. FIG. 18B compares the frequency response of the prototype filter with the tap length L=96 to the frequency response $H_{64tap}(\omega)$ of the corrected prototype filter $h_{64tap}(n)$. Although the inhibiting band attenuation in the frequency response of the $H_{64tap}(\omega)$ is enhanced in transition width as compared to the frequency response $H_{96tap}(\omega)$ of the prototype filter with the tap L=96, it is still possible to maintain the inhibiting band attenuation of the order of 80 dB.

Figure 19A:
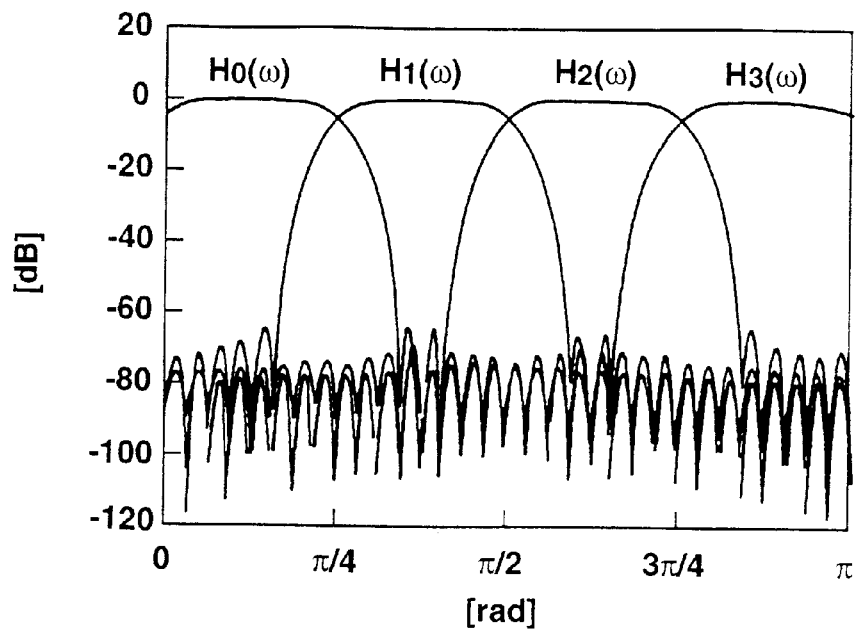
FIGS. 19A and 19B illustrate the frequency response of the band-splitting filter and the band-synthesizing filter derived from the prototype filter having characteristics shown in FIG. 18.
Figure 19B:
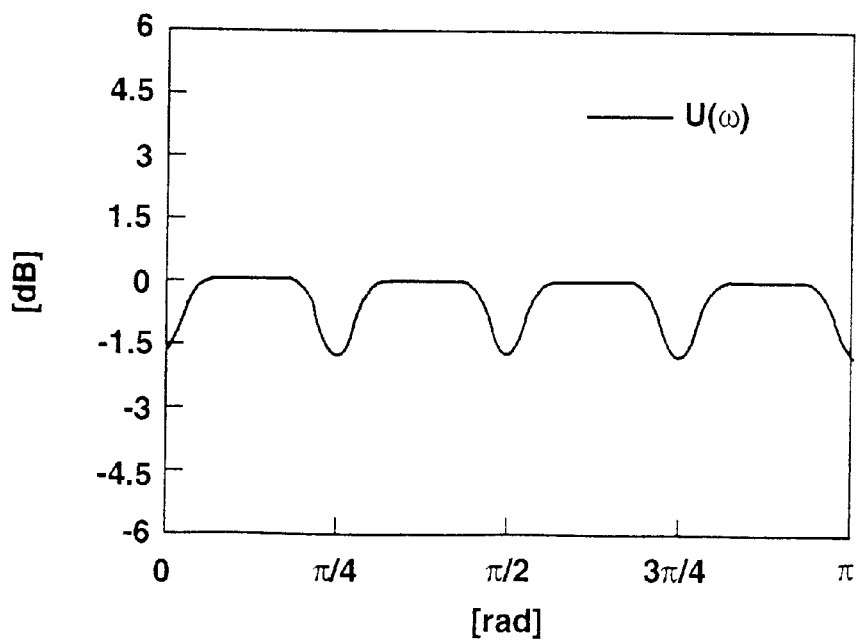

FIG. 19A shows the frequency response of the band-based splitting filters derived from the correction prototype filter $h_{64tap}(n)$, the characteristics of which are shown in FIGS. 18A and B. The frequency response $H_0(\omega)$, $H_1(\omega)$, $H_2(\omega)$ and $H_3(\omega)$ of the respective band-splitting filters exhibit the inhibiting band attenuation of the order of 80 dB which is sufficient to suppress aliasing from neighboring bands. The frequency response of the entire spectrum on synthesis of the respective bands is not flat as shown in FIG. 19B. In particular, the value of $U(\omega)$ is lowered by approximately 2 dB in the overlapping portions of the respective bands. However, in band synthesis processing for acoustic signals, this gain decrease in the overlapping portion is not so troublesome to the human ear. What is troublesome is the aliasing component from the neighboring band which it is meritorious to suppress to a low level for optimum psychoacoustic effects.

Figure 12:
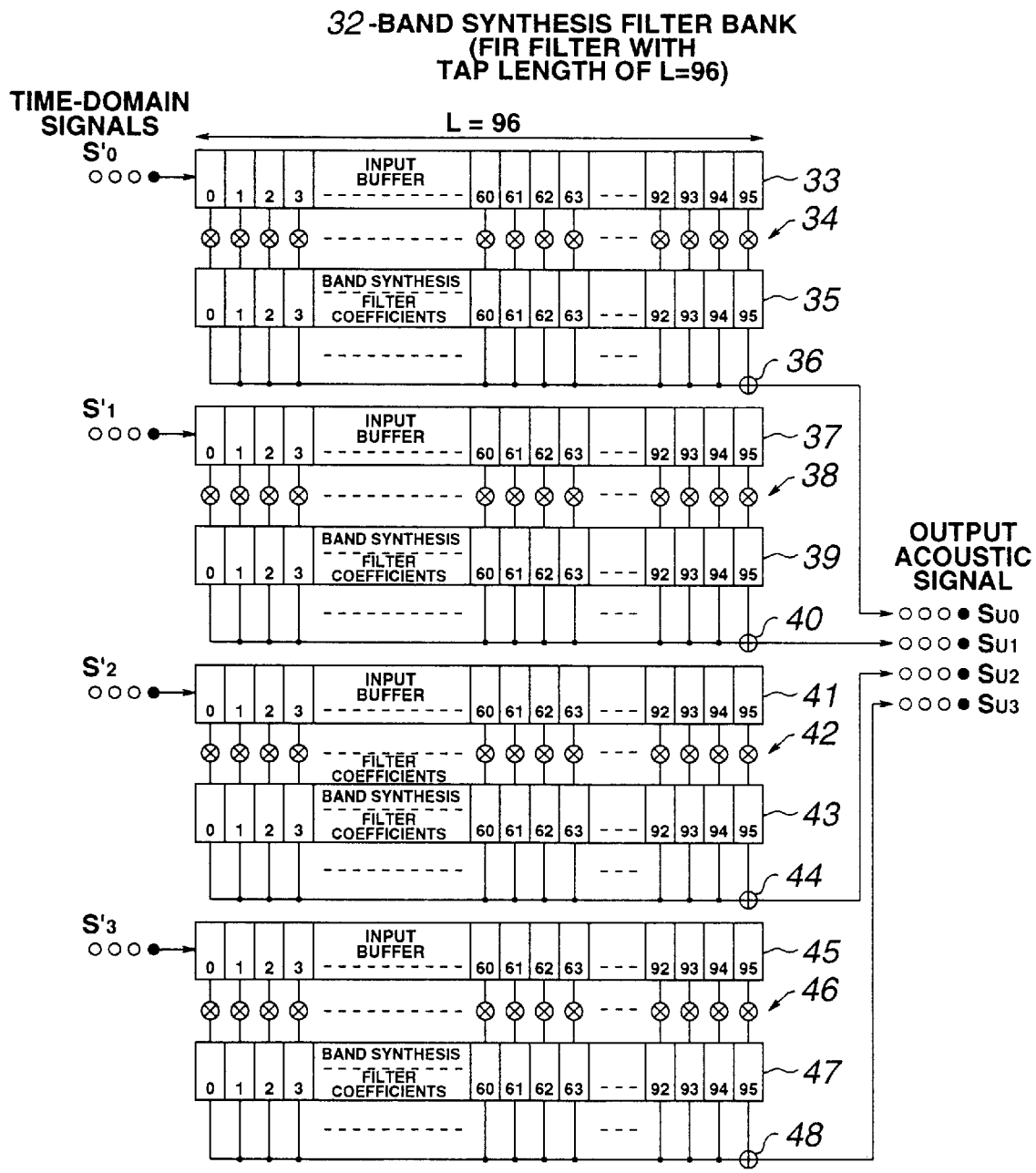
FIG. 12 illustrates the structure of a band-synthesis filter bank employing a band-synthesis filter having the characteristics shown in FIGS. 9 and 10.
Figure 20:
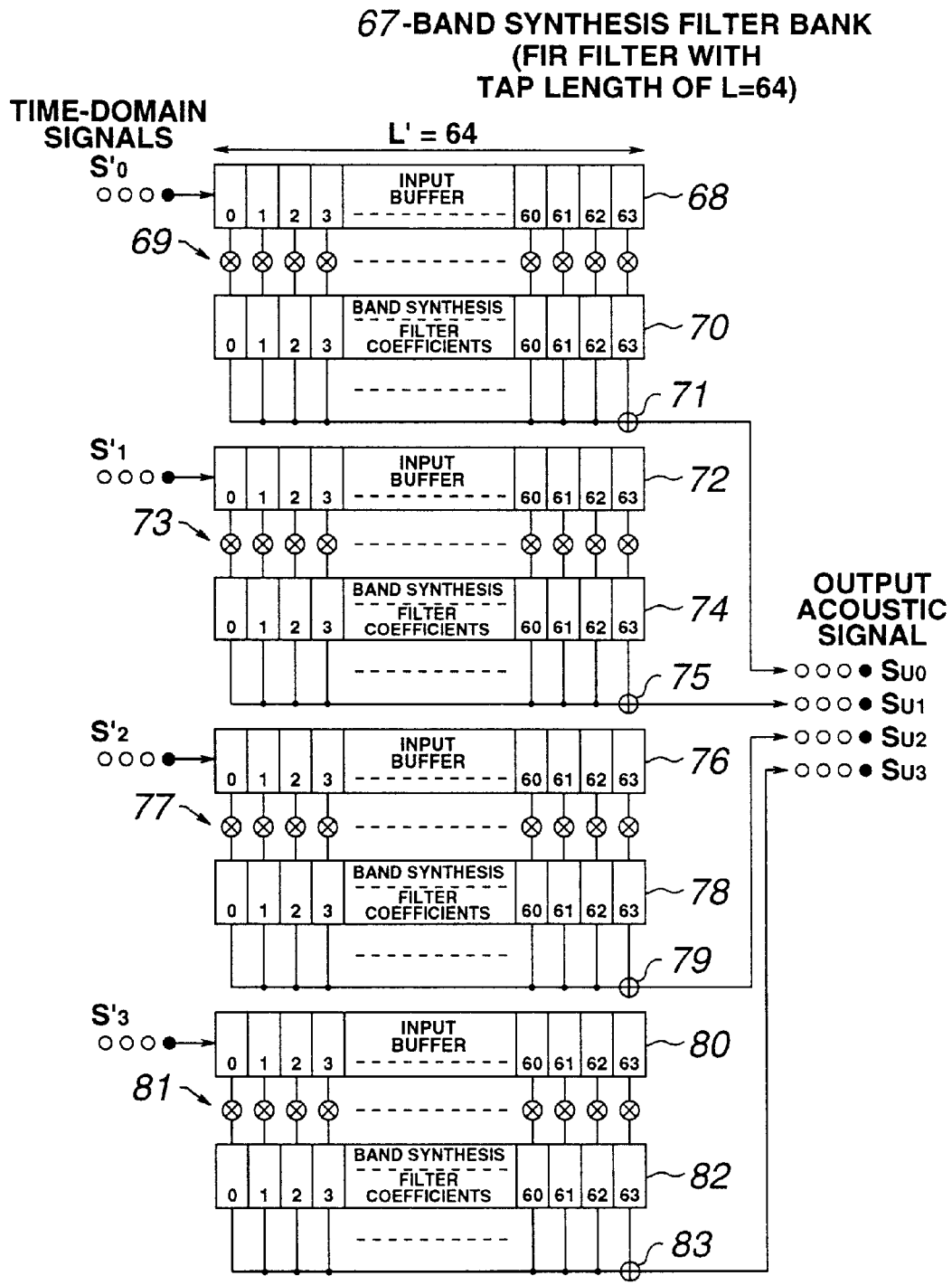
FIG. 20 illustrates the structure of a band-synthesizing filter bank employing the band-synthesizing filter derived in FIG. 19.

FIG. 20 shows the structure of a fixed tap length converting band-synthesizing filter bank 67 in which the band-synthesizing filter bank 32 with the tap length L=96 shown in FIG. 12 is replaced by a band-synthesizing filter bank with the tap length L'=64. To the input buffers 68, 72, 76 and 80 are entered four time-domain signals $S'_0$, $S'_1$, $S'_2$ and $S'_3$, sample-by-sample. The convolution processing by these input buffers and the band-synthesis filter coefficient holders 70, 74, 78 and 82 with the tap length L'=64 is carried out by multiplier sets 69, 73, 77 and 81 and the adders 71, 75, 79 and 83 for producing band-based outputs $S_{U0}$, $S_{U1}$, $S_{U2}$ and $S_{U3}$, respectively.

For the band-synthesis filter coefficient holders 70, 74, 78 and 82, corrected band synthesis filter coefficients $k_i'(n)$ with the tap length L', as found in FIG. 15, are used. With the band-synthesizing filter bank 67, filter coefficient correction and tap length reduction are executed for evading serious psychoacoustic problems, such that the number of times of the convolution processing operations can be diminished as compared to that executed by the band-synthesizing filter bank 32 with the tap length L=96, thus enabling fast band-synthesis processing. In the present example, the product-sum processing volume required for the band-synthesis processing with the tap length L=96 is 96 per sample. However, if the tap length L' is set to 64, 64 product-sum processing operations per sample suffice thus suppressing the volume of the product-sum processing operations to 2/3.

Figure 21:
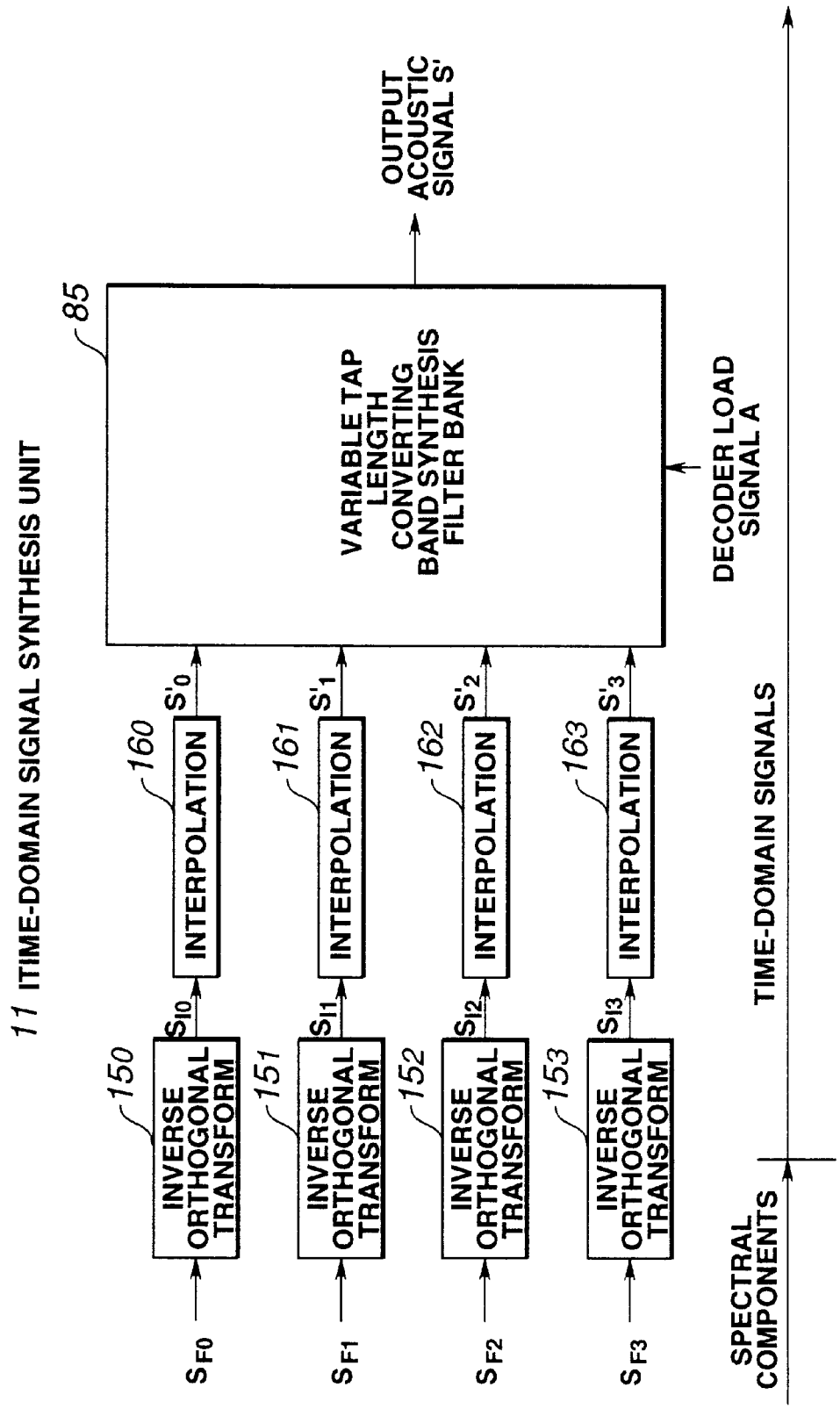
FIG. 21 is a block diagram showing the structure in which a variable tap length band-synthesizing filter bank having a tap length shorter than the tap length of the band-splitting filter bank of the orthogonal transform unit is used in the time-domain signal synthesizing unit shown in FIG. 3.

A further embodiment for expediting the band-synthesizing processing is hereinafter explained. FIG. 21 shows the structure of the instant embodiment of the time-domain signal synthesis unit 11.

The time-domain signal synthesis unit 11 shown in FIG. 21 uses a variable tap length converting band-synthesis filter bank 85. If the tap length L of the band-splitting filter bank 12 constituting the orthogonal transform unit 3 in the encoder 2 is e.g., 96, the variable tap length converting band-synthesis filter bank 85 is designed with a shorter tap length L' which is not fixed but is variable.

Figure 22:
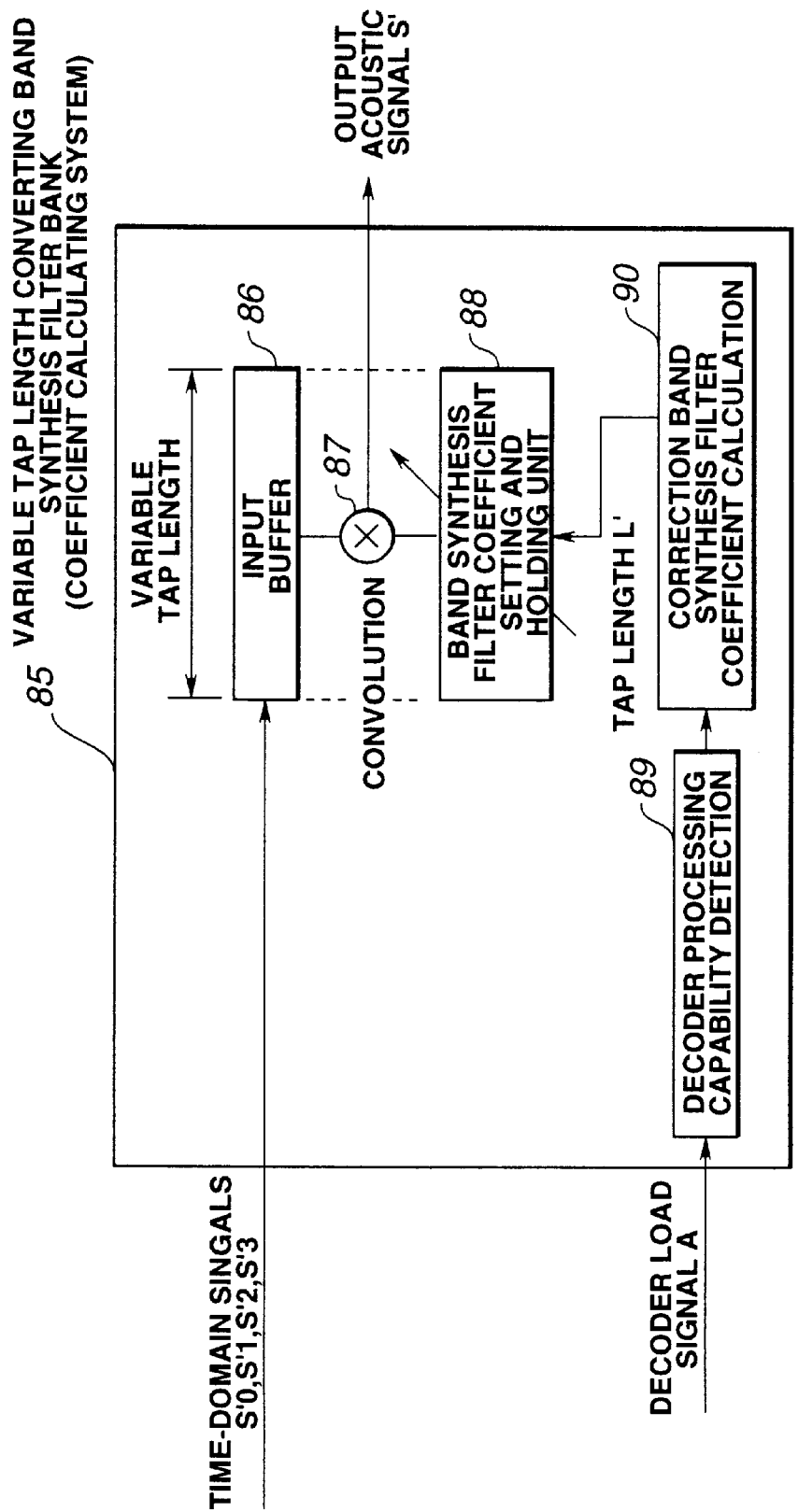
FIG. 22 is a block diagram showing the structure of the variable tap length band-synthesizing filter bank shown in FIG. 21.

With the variable tap length converting band-synthesis filter bank 85, in distinction from the fixed tap length converting band-synthesizing filter bank 50, the tap length L' can be varied with time. To this variable tap length converting band-synthesis filter bank 85 is sequentially entered a decoder load signal A specifying the processing state of the decoder 7, as shown in FIG. 22. A decoder processing capability detector 89 detects the processing capability of the decoder 7 to derive the tap length L' matched to the processing capability. Based on this tap length L', a corrected band synthesis filter coefficient processor 90 re-sets a band synthesis filter coefficient setting and holding unit 88. The convolution processing of the band-synthesizing filter coefficients from the band synthesis filter coefficient setting and holding unit 88 and the time-domain signals $S'_0$, $S'_1$, $S'_2$ and $S'_3$ from the input buffer 86 is carried out by a convolution processor 87 to output an output acoustic signal S'.

Figure 23:
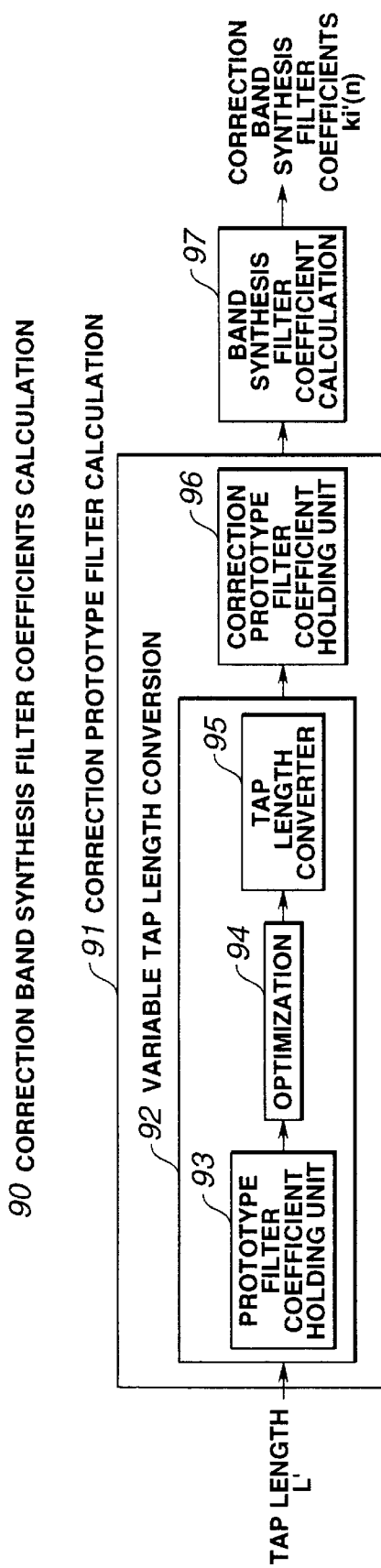
FIG. 23 is a block diagram showing the structure of a correction band-synthesizing filter coefficient processor of a variable tap length converting the band-synthesizing filter bank shown in FIG. 22.

The corrected band synthesis filter coefficient processor 90 in FIG. 22 is constructed as shown in FIG. 23. First, the corrected prototype filter coefficients with the tap length L' are derived from the prototype filter with the tap length L=96 by a corrected prototype filter coefficient processor 91.

The corrected prototype filter coefficient processor 91 includes a variable tap length converter 92 for converting the tap length of a prototype filter with the tap length L=96, and a correction prototype filter coefficient holder 96 for holding the correction prototype filter coefficient obtained on tap length conversion by this variable tap length converter 92.

The variable tap length converter 92 includes a prototype filter coefficient holder 93 for holding the coefficients of the prototype filter with the tap length L=96, an optimization processor 94 for optimizing the prototype filter coefficients held by this prototype filter coefficient holder 93 with a window function with the tap length L' and a tap length converter 95 for rounding off filter coefficients with both end values of the optimized prototype filter for deriving the corrected prototype filter with the tap length L'.

From the correction prototype filter coefficients with the tap length L' derived from the corrected prototype filter coefficient processor 91, the band-synthesizing filter coefficients $k_f(n)$ with the tap length L' are derived by a band-synthesis filter coefficient processor 97 operating as explained in connection with the band synthesis filter coefficient deriving step shown in FIG. 7.

Figure 24:
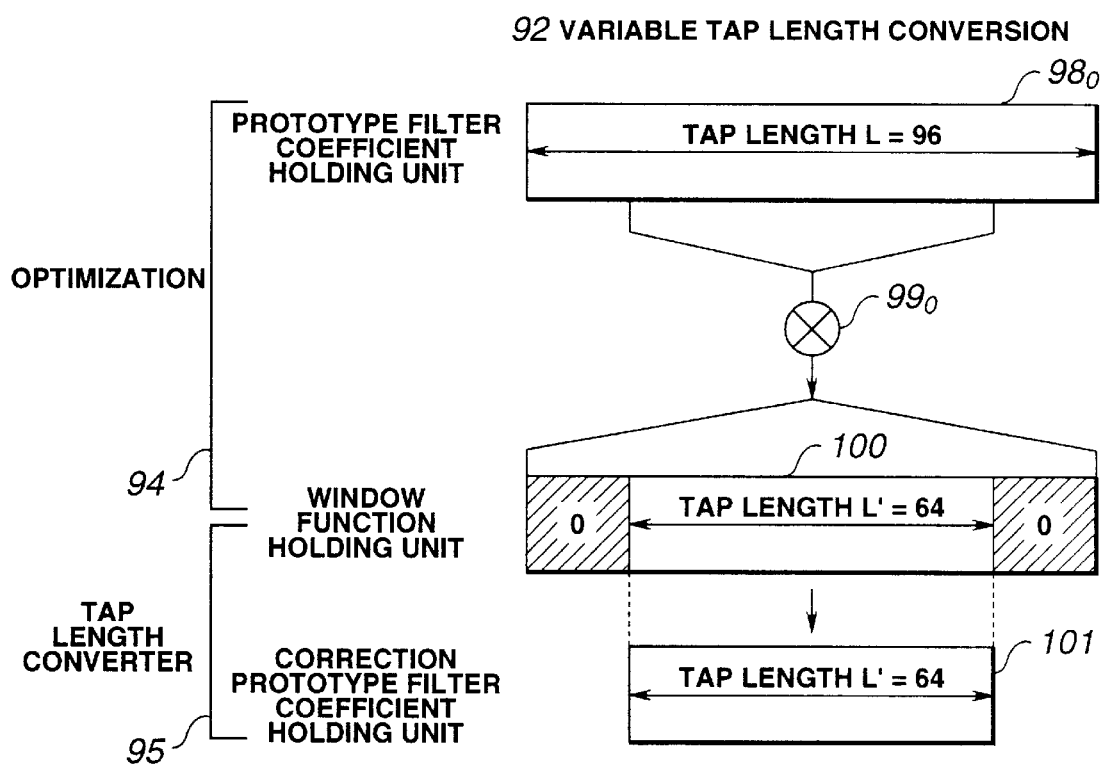
FIG. 24 illustrates the operation of obtaining a tap length of L=64 in a variable tap length conversion unit of a correction band synthesis filter coefficient calculating unit shown in FIG. 23.
Figure 25:
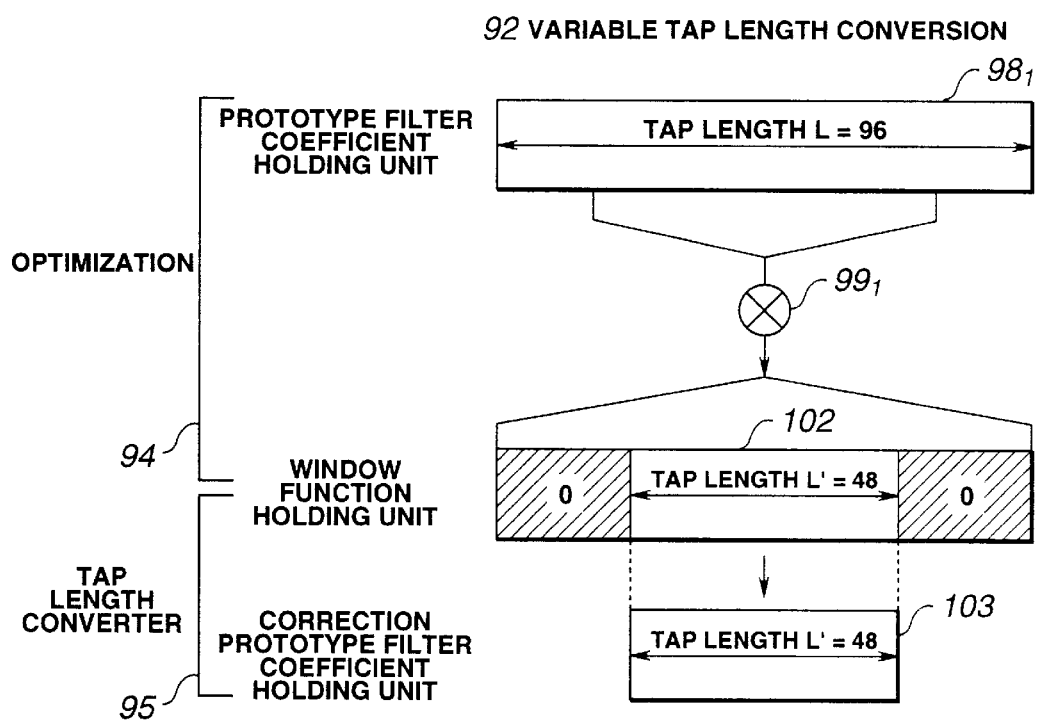
FIG. 25 illustrates the operation of obtaining a tap length of L=48 in a variable tap length conversion unit of a correction band synthesis filter coefficient calculating unit shown in FIG. 23.

FIGS. 24 and 25 show the variable tap length converter 92 for converting the tap length L=96 to the tap length L'=64 and 48. First, in the optimization processor 94, the window functions of the tap lengths L'=64 and L'=48 of window function holders 100 and 102 are applied by multipliers $99_0$ and $99_1$ on the prototype filter coefficients with the tap length L=96 held by prototype filter coefficient holders 100 and 102. 16 taps from both ends of the window function $W_{64}(n)$ are 0 in value, while 24 taps from both ends of the window function $W_{48}$ are also 0 in value, thus not affecting processing accuracy. Therefore, this portion can be discarded by a tap length converter 95 for deriving the correction prototype filter coefficients via correction prototype filter coefficient holders 101 and 103.

The optimization processor 94 applies the optimizing function to the prototype filter with the tap length L as in FIG. 16. With the fixed tap length converting bandsynthesizing filter bank 50, the processing capability proper to the decoder is previously inspected for deriving the tap length. In the present variable tap length converting bandsynthesis filter bank 85, the tap length L' can be varied with time, so that the Hamming function is also varied with the tap length L'.

Figure 26A:
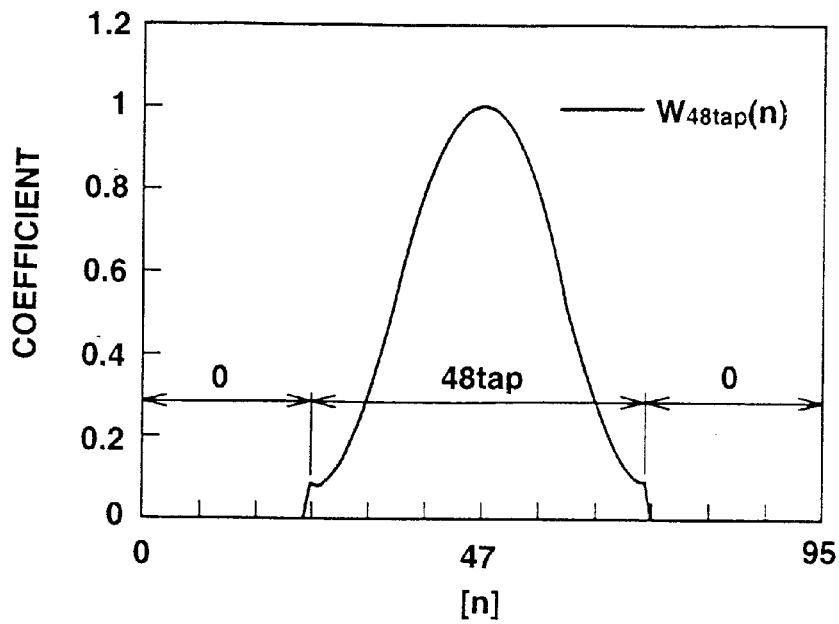
FIGS. 26A and 26B illustrate an example of coefficients of the window function holding unit shown in FIGS. 24 and 25.

For the tap length L'=48, the Hamming function $w_{48tap}(n)$ is as shown in FIG. 26A, such that $W(n)=0.54-0.46 \cos(2\pi(n-1)/(L'-1))$ for 24<n<73, where $i=(L-L')/2$ $w(n)=0$ for other values of n.

Figure 26B:
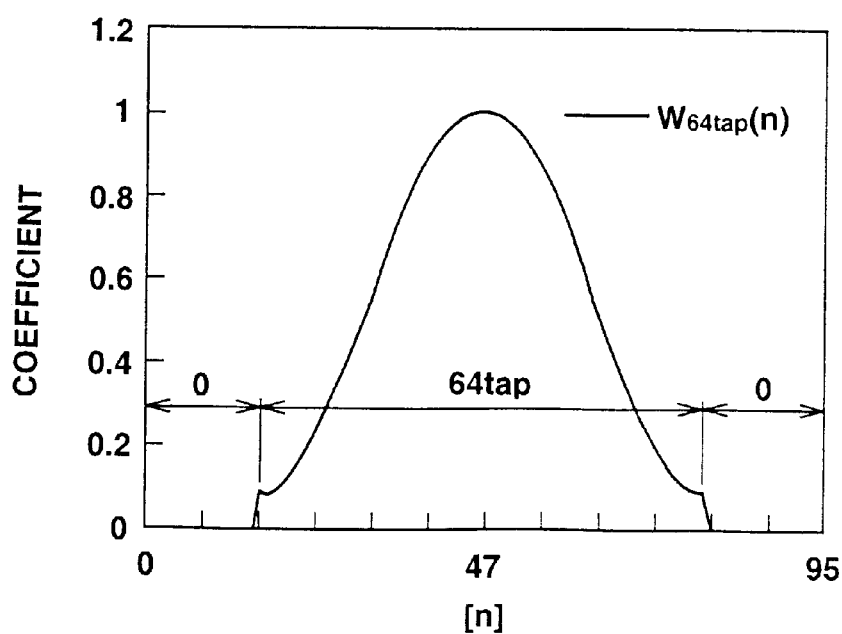

On the other hand, for the tap length L'=64, the Hamming function $W_{48tap}(n)$ is as shown in FIG. 26B, such that $W(n)=0.54-0.46 \cos(2\pi(n-1)/(L'-1))$ for 16<n<81, where $i=(L-L')/2$ $w(n)=0$ for other values of n.

If the tap length is varied, the optimization processor 94 can switch the window function immediately. By employing these window functions, discontinuities on the time axis can be reduced by smoothly changing the values at the time of rounding off both ends of the prototype filter h(n) with the tap length L=96 thus maintaining satisfactory frequency separation characteristics.

Figure 27A:
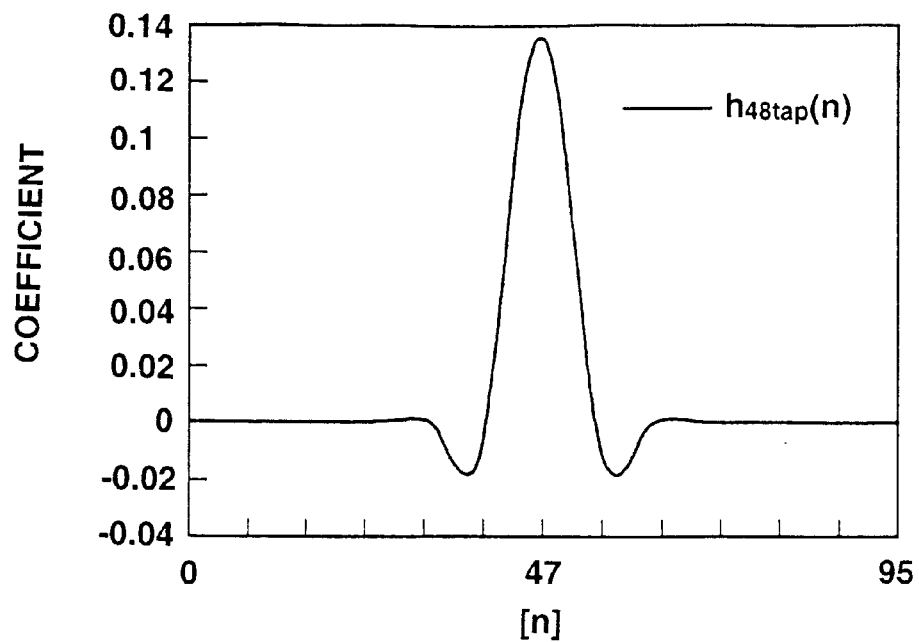
FIGS. 27A and 27B illustrate the impulse response of the correction prototype filter obtained on applying the window function specifying the coefficients of FIGS. 26A and 26B on the prototype filter having the characteristics shown in FIGS. 8A and 8B.
Figure 27B:
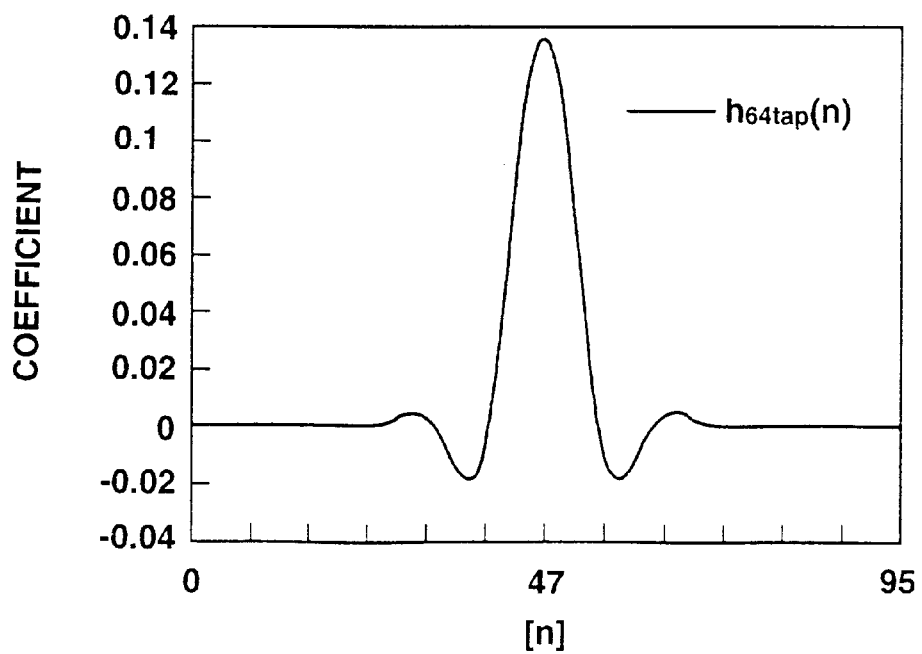
Figure 28A:
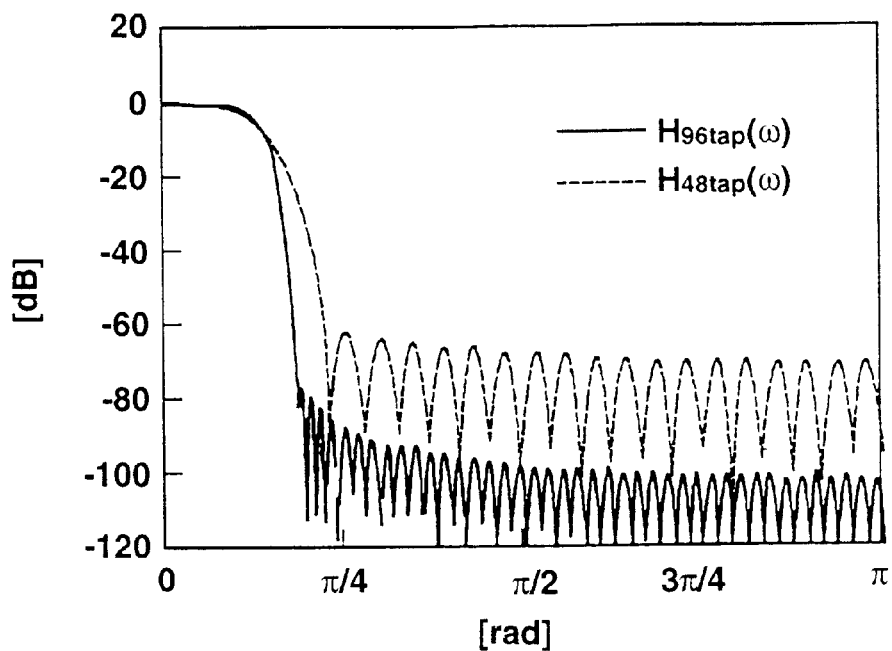
FIGS. 28A and 28B illustrate the impulse response of the correction prototype filter obtained on applying the window function specifying the coefficients of FIGS. 26A and 26B on the prototype filter having the characteristics shown in FIGS. 8A and 8B.
Figure 28B:
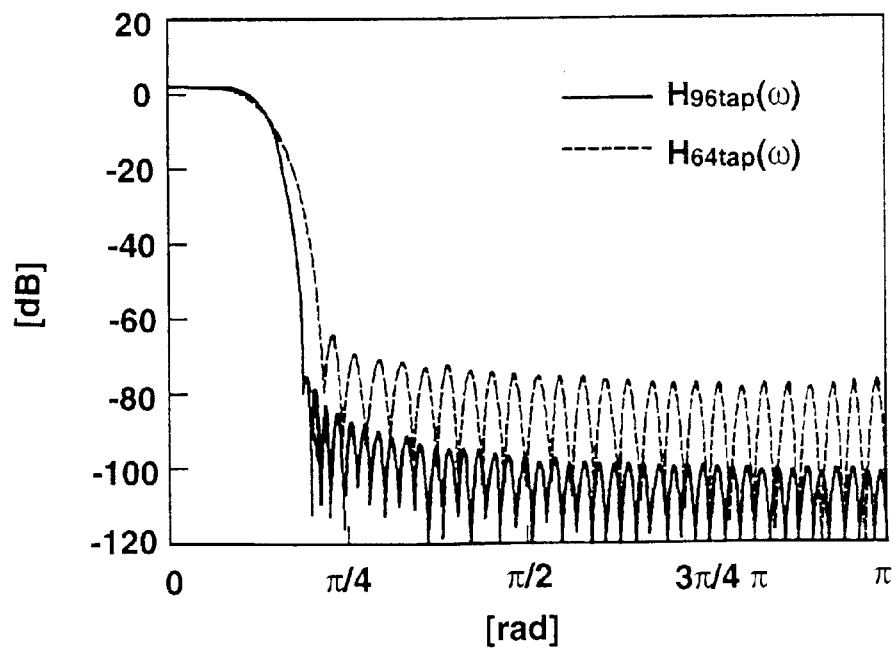

FIGS. 27A and 27B show impulse characteristics of the correction prototype filters $h_{48tap}(n)$ and $h_{64tap}(n)$ obtained on applying the Hamming functions $W_{48tap}(n)$ and $W_{64tap}(n)$ shown in FIGS. 26A and 26B, respectively. FIGS. 28A and 28B show the respective filter response along with the frequency response of the prototype filter with the tap length L=96. FIGS. 29A, 29B, 30A and 30B show the coefficients of the band splitting and band synthesis filters derived from these correction prototype filters $h_{48tap}(n)$ and $h_{64tap}(n)$, respectively.

Figure 29A:
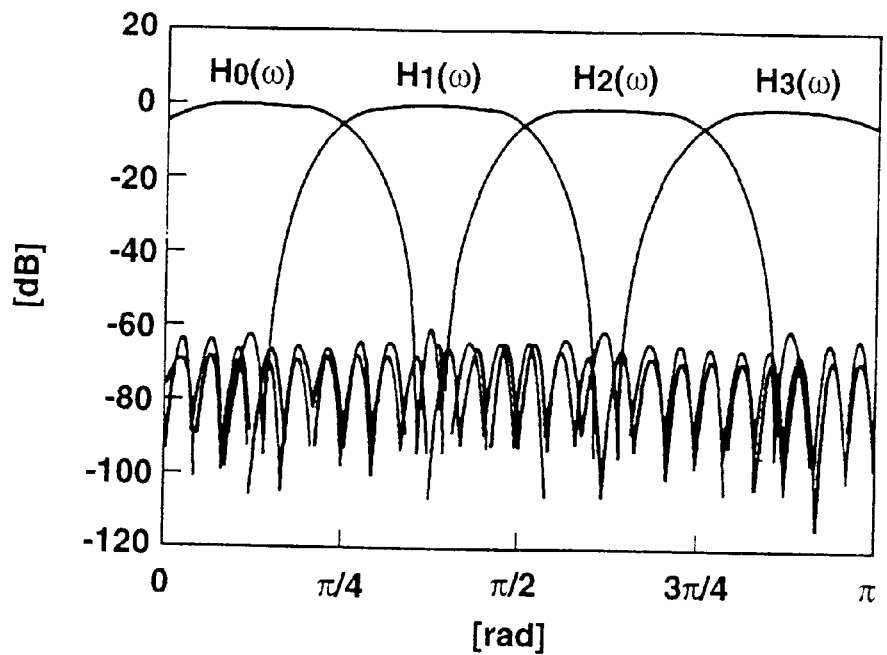
FIGS. 29A and 29B illustrate the frequency response of the band-splitting filter and the band-synthesizing filter with a tap length L'=48 derived from the correction prototype filter having the characteristics shown in FIGS. 28A and 28B.
Figure 29B:
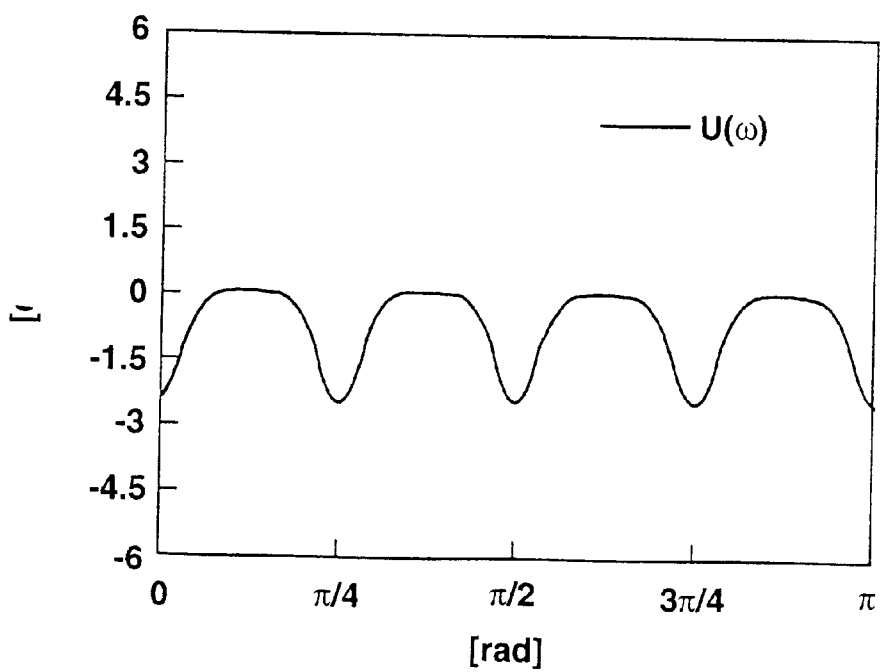

In the case of the band splitting and band synthesis filter coefficients of FIGS. 29A and 29B, derived from the correction prototype filters $h_{48tap}(n)$, the inhibiting band attenuation of the order of 60 dB is secured, such that, excepting the case in which only specified spectral components have large values or in which the signal energy is concentrated in the spectral components in the band-overlapping portions, band synthesis of acoustic signals employing the band synthesis filter coefficients is not objectionable to human ears.

Figure 30A:
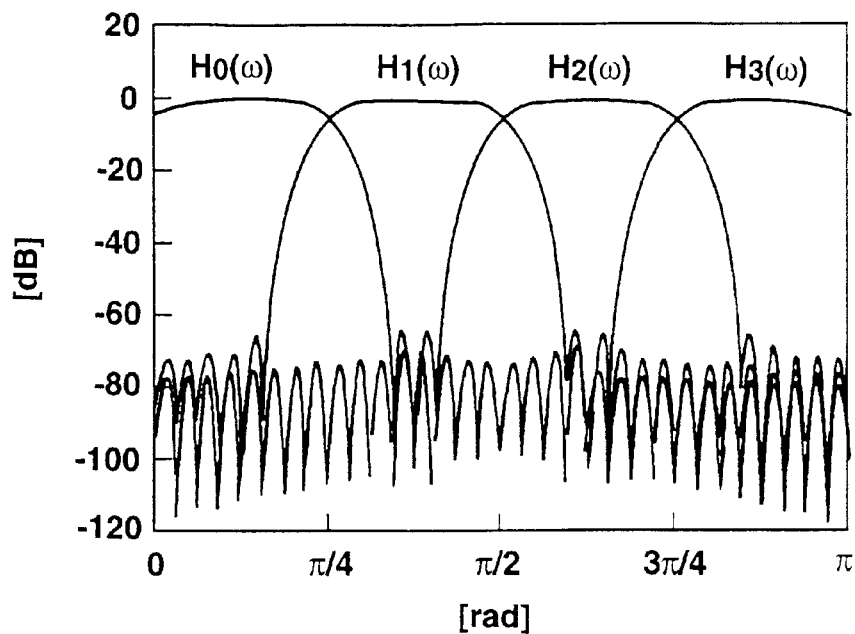
FIGS. 30A and 30B illustrate the frequency response of the band-splitting filter and the band-synthesizing filter with a tap length L'=64 derived from the correction prototype filter having the characteristics shown in FIGS. 28A and 28B.
Figure 30B:
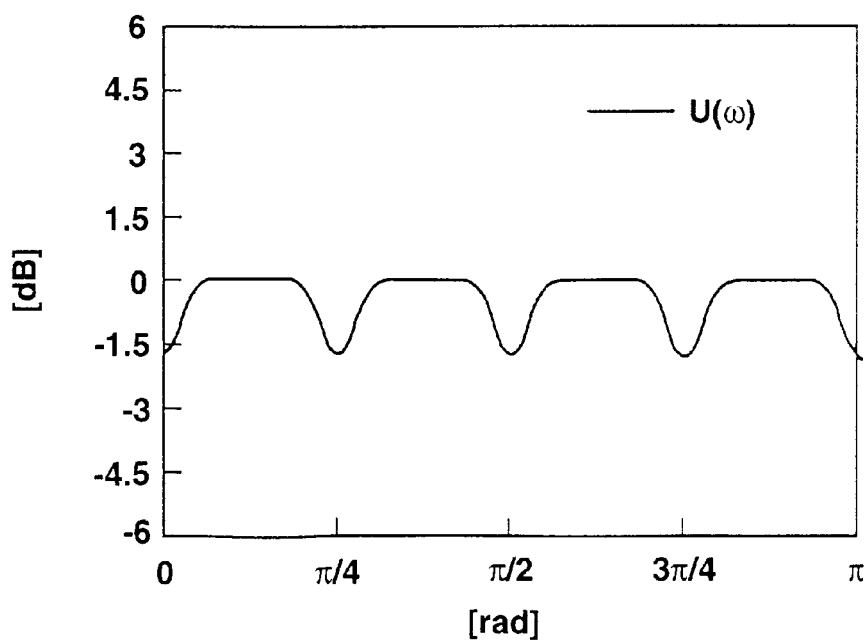

In the case of the band splitting and band synthesis filter coefficients of FIGS. 30A and 30B, derived from the correction prototype filters $h_{64tap}(n)$, a larger inhibiting band attenuation of the order of 80 dB is secured, such that no problem is raised in connection with the human hearing sense if the band synthesis filter coefficients are used for band synthesis of a majority of acoustic signals, with the frequency response being practically useful.

Thus, with the variable tap length converting bandsynthesis filter bank 85, the filter coefficients can be varied for raising no problems in connection with the human hearing sense even if the processable tap length is varied, such that the filter bank is useful for a system having its processing capability changed with lapse of time.

Figure 31:
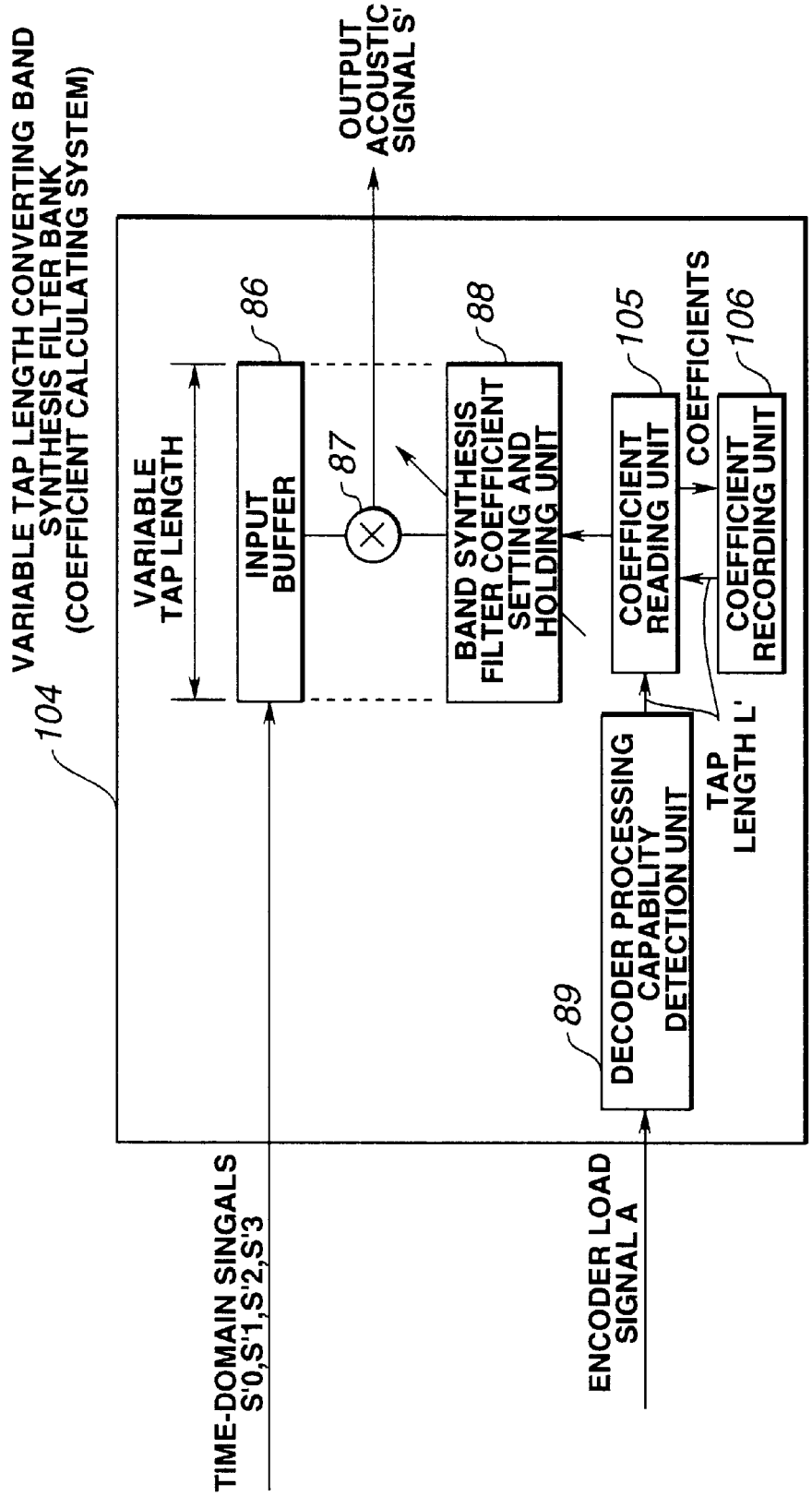
FIG. 31 is a block diagram showing the structure of a variable tap length modified band-synthesizing filter bank having a structure different from the structure of the variable tap length modified band-synthesizing filter bank shown in FIG. 22.

FIG. 31 shows the structure of a variable tap length converting band synthesizing filter bank 104 which implements the setting of the band synthesizing filter coefficients by a method different from the method shown in FIG. 22. With the present variable tap length converting band synthesizing filter bank 104, a correction band synthesis filter coefficient reading unit 105 reads the coefficients matched to the tap length L' from a band synthesis filter coefficient recording unit 106 for setting in the band synthesis filter coefficient setting and holding unit 88. With this method, high-speed coefficient setting becomes possible since it is unnecessary to calculate the band synthesis filter coefficients several times when the time axis length L' is varied frequently with time.

Figure 32:
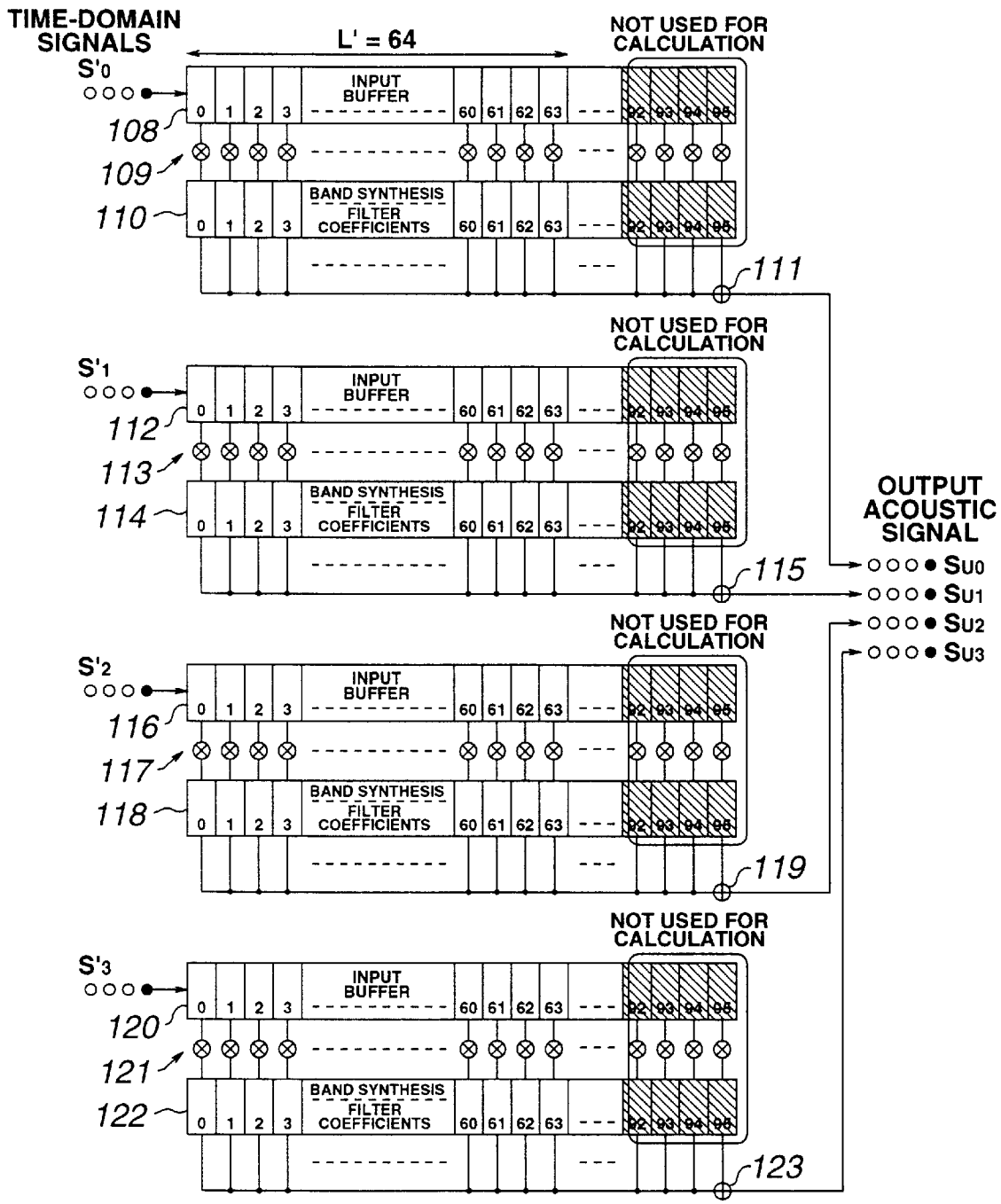
FIG. 32 illustrates the structure of a band-synthesizing filter bank employing a band-synthesizing filter derived in FIGS. 30A and 30B.

FIG. 32 shows the structure of a variable tap length converting band synthesizing filter bank 107 obtained on substituting a band-synthesis filter bank with a tap length L'=64 for the band-synthesis filter bank 32 with the tap length L=96 of FIG. 12. To input buffers 108, 112, 116 and 120 are entered four time-domain signals $S'_0, S'_1, S'_2$ and $S'_3$ sample-by-sample, such that the convolution processing by these input buffers and the band-synthesis filter coefficient holders 110, 114, 118 and 122 with the tap length L'=64 is carried out by multiplier sets 109, 113, 117 and 121 and the adders 111, 115, 119 and 123 for producing band-based outputs $S_{U0}, S_{U1}, S_{U2}$ and $S_{U3}$, respectively.

For the band-synthesis filter coefficient holders 110, 114, 118 and 122, corrected band synthesis filter coefficients $k_1'(n)$ with the tap length L' as found in FIG. 15 are used. The variable tap length converting band synthesizing filter bank 107 converts the filter coefficients and the effective tap length so as not to raise any serious psychoacoustic problems. The portions of the input buffers 108, 112, 116 and 120 and the band-synthesis filter coefficient holders 110, 114, 118 and 122 which are shown shaded are those portions corresponding to the 0 values of the filter coefficients. Since these shaded portions are irrelevant to the processing accuracy, there is no necessity of executing convolution operations for these portions. Thus, by allocating the input buffers and coefficient holders for not executing the processing for these portions, the processing volume can be diminished for expediting the bad synthesis processing operations. Also, if the tap length L' is varied, these shaded portions can be re-allocated immediately.

In the foregoing description, PQF filter banks are used for the band-splitting filter bank 12 in the orthogonal transform unit 3 and for the band-synthesizing filter bank 17 in the time-domain signal synthesis unit 11 in the acoustic signal encoding/decoding system 1 shown in FIG. 1.

With the PQF filter bank, the band splitting filter and the band synthesis filter coefficients can be separated into first-order coefficients and the second-order coefficients by exploiting coefficient symmetry for realizing efficient processing operations.

Figure 33:
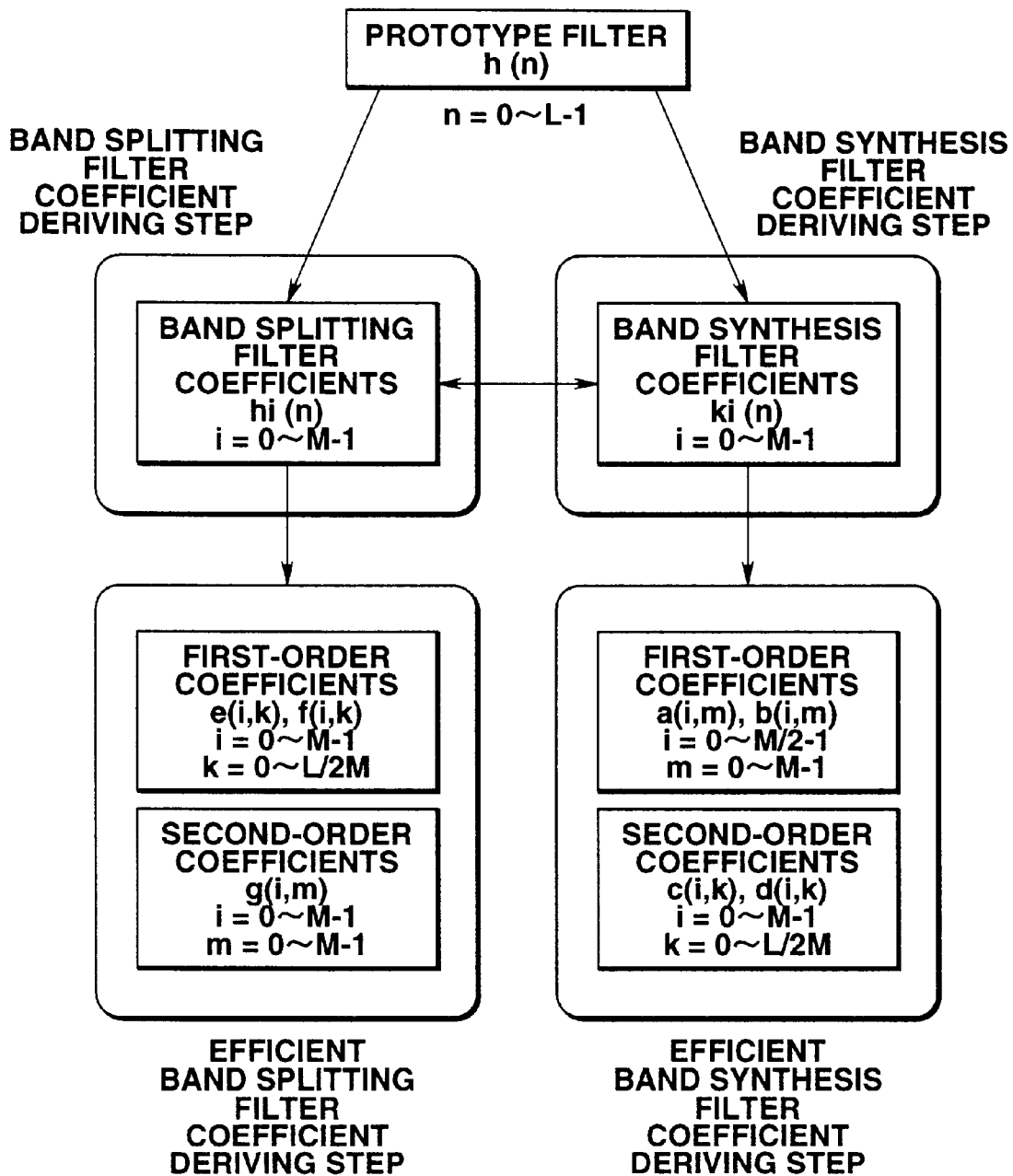
FIG. 33 illustrates the process for separating the coefficients of the band-splitting filter and the band-synthesizing filter into first-order and second-order coefficients for improving the efficiency of the band-splitting processing and band-synthesizing processing, respectively.

Referring to FIG. 33, the first-order coefficients and the second-order coefficients can be derived by applying the efficient band-splitting filter coefficient deriving step and the efficient band-synthesis filter coefficient deriving step, respectively, to the band-splitting filter coefficients and band-synthesizing filter coefficients derived from the band-splitting filter coefficient deriving process and by the band-synthesis filter coefficient deriving process, respectively.

First, from the prototype filter h(n), the band-splitting filter coefficients $h_i(n)$ and the band synthesizing filter coefficients $k_i(n)$ are derived by the band-splitting filter coefficient deriving process and by the band-synthesizing filter coefficient deriving process, respectively. From the band splitting filter coefficients $h_i(n)$, first-order coefficients e(i,k) and f(i,k) and second-order coefficients g(i,m) are derived by the efficiency band-synthesis filter coefficient deriving process. Also, from the band synthesizing filter coefficients $k_i(n)$, second-order coefficients a(i,m) and b(i,m) and second-order coefficients c(i,k) and d(i,k) are derived by the efficiency band-synthesis filter coefficient deriving process.

Figure 34:
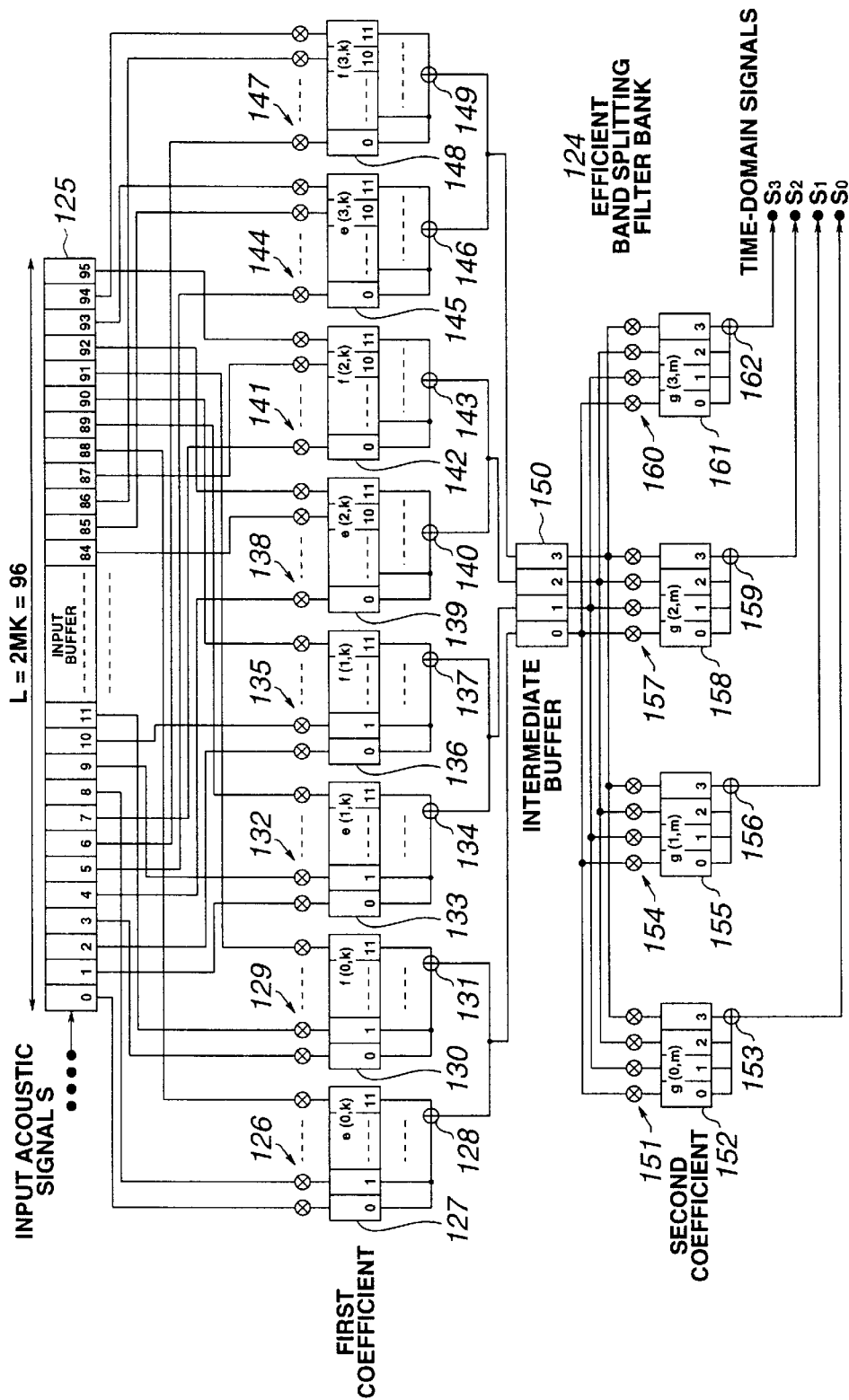
FIG. 34 illustrates the structure of an efficiency band-splitting filter bank configured for splitting the band-splitting filter coefficients into first-order and second-order coefficients.

FIG. 34 shows an efficiency band-splitting filter bank obtained on re-constructing the band-splitting filter bank using the first-order coefficients e(i,k) and f(i,k) and second-order coefficients g(i,m) derived by the above-described efficiency band-splitting filter coefficient deriving process. With this efficiency band-splitting filter bank 124, the band-splitting filter coefficients of the band-splitting filter coefficient holders 21, 24, 27 and 30 of the band-splitting filter bank 18 shown in FIG. 11 are separated into e(0,k), e(1,k), e(2,k) and e(3,k) of the first-order coefficient holders 127, 131, 139 and 145, f(0,k), f(1,k), f(2,k) and f(3,k) of first-order coefficient holders 130, 136, 142 and 148 and into g(0,m), g(1,m), g(2,m) and g(3,m) of second-order coefficient holders 152, 155, 158 and 161 by exploiting coefficient symmetry for improving the processing efficiency for enabling fast band-splitting processing operations.

To this input buffer 125 is entered the input acoustic signal S by four samples each time. The convolution processing by the input buffer 125 and the first-order coefficient holders 127, 130, 133, 136, 139, 142, 145 and 148 is carried out by sets of multipliers 126, 129, 132, 135, 138, 141, 144 and 147 and by adders 128, 131, 134, 137, 140, 143, 146 and 149. The results of the processing are sent to an intermediate buffer 150. The convolution processing of an output of the intermediate buffer 150 and the second-order coefficient holders 152, 155, 158 and 161 are carried out by the multiplier sets 151, 154, 157 and 160 and the adders 153, 156, 159 and 162 for producing band-based signal components $S_0, S_1, S_2$ and $S_3$.

With this efficiency band-splitting filter bank 124, the number of times of the product-sum processing per sample is represented as 2K+M, where K=L/2M, so that, with the number of band splitting M=4 and the tap length L=96, only 28 product-sum processing operations per sample suffice. That is, the processing volume is not more than one-third of that required in the processing method explained with reference to FIG. 11, thus enabling expedited band splitting processing operations. If it is desired to further expedite the band-splitting processing operations, the tap length may be reduced. However, if the tap length L is reduced on the band-splitting side, filter characteristics are worsened to decrease the inhibition band attenuation such that orthogonal transform is applied to signals containing aliasing components from the neighboring bands. The aliasing components, produced at this time, are not cancelled on band synthesis. Therefore, it is generally necessary for the band-synthesizing filter bank to have acute high precision frequency response. Thus it is not advisable to decrease the tap length.

Figure 35:
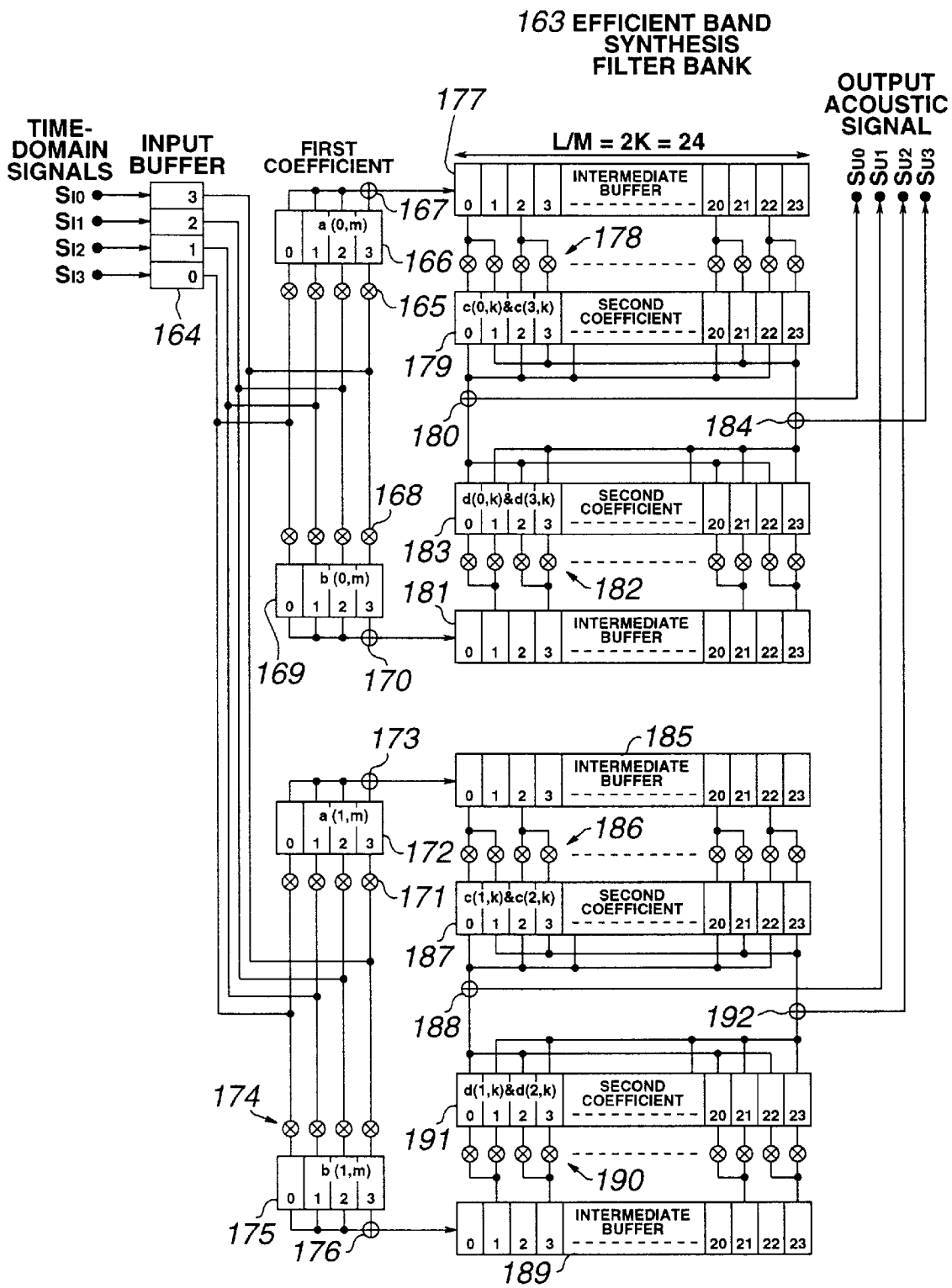
FIG. 35 illustrates the structure of an efficiency band-synthesizing filter bank configured for splitting the band-synthesizing filter coefficients into first-order and second-order coefficients.

FIG. 35 shows an efficiency band-splitting filter bank 163 obtained on re-constructing the band-synthesizing filter bank using the first-order coefficients a(i,m) and b(i,m) and second-order coefficients c(i,k) and d(i,k) derived by the above-described efficiency band-synthesizing filter coefficient deriving process. With this efficiency band-splitting filter bank 163, the band-splitting filter coefficients of the band-synthesizing filter coefficient holders 35, 39, 43 and 47 of the band-synthesizing filter bank 32 shown in FIG. 12 are separated into a(0,m) and a(1,m) of the first-order coefficient holders 166 and 172, b(0,m) and b(1,m) of first-order coefficient holders 169 and 175, c(0,k), c(3,k), c(1,k) and c(2,k) of second-order coefficient holders 179 and 187 and into d(0,k), d(3,k), d(1,k) and d(2,k) of second-order coefficient holders 183, and 191 by exploiting coefficient symmetry for improving the processing efficiency for enabling fast band-splitting processing operations.

To the input buffer 164 are entered time-domain signals $S_{10}, S_{11}, S_{12}$ and $S_{13}$ from the inverse orthogonal transform units 150, 151, 152 and 153. The convolution processing by the input buffer 164 and the first-order coefficient holders 166, 169, 172 and 175 is carried out by multiplier sets 165, 168, 172 and 175 and adders a 67, 170, 173 and 176 and the results of the processing are sent to intermediate buffers 177, 181, 185 and 189. The convolution processing of the outputs of the intermediate buffers 177, 181, 185 and 189 and the second-order coefficient holders 179, 183, 187 and 191 is carried out by multiplier sets 178, 182, 186 and 190 and adders 180, 184, 188 and 192 to give band-based signal components $S_{U0}, S_{U1}, S_{U2}$ and $S_{U3}$. With this efficiency band-splitting filter bank 124, the number of times of the product-sum processing per sample is presented as 2K+M, where K=L/2M, so that, with the number of band splitting M=4 and the tap length L=96, only 28 product-sum processing operations per sample suffice. That is, the processing volume is not more than one-third of that required in the processing method explained with reference to FIG. 11, thus enabling expedited band-splitting processing operations.

Thus, in the time-domain signal synthesis unit 11 in the decoder 7 of the acoustic signal encoding/decoding system 1 of the instant embodiment, it is possible to cause the fixed tap length converting band-synthesizing filter bank 50 and the variable tap length converting band-synthesis filter bank 85 to carry out not only the above-described tap length conversion but also the separation of the filter coefficients into first-order coefficients and second-order coefficients for further expediting the band-synthesizing operations. If, for example, the tap length L is converted to 64 or 48, the number of times of the processing operations is equal to 20 or 16, respectively.

Figure 36:
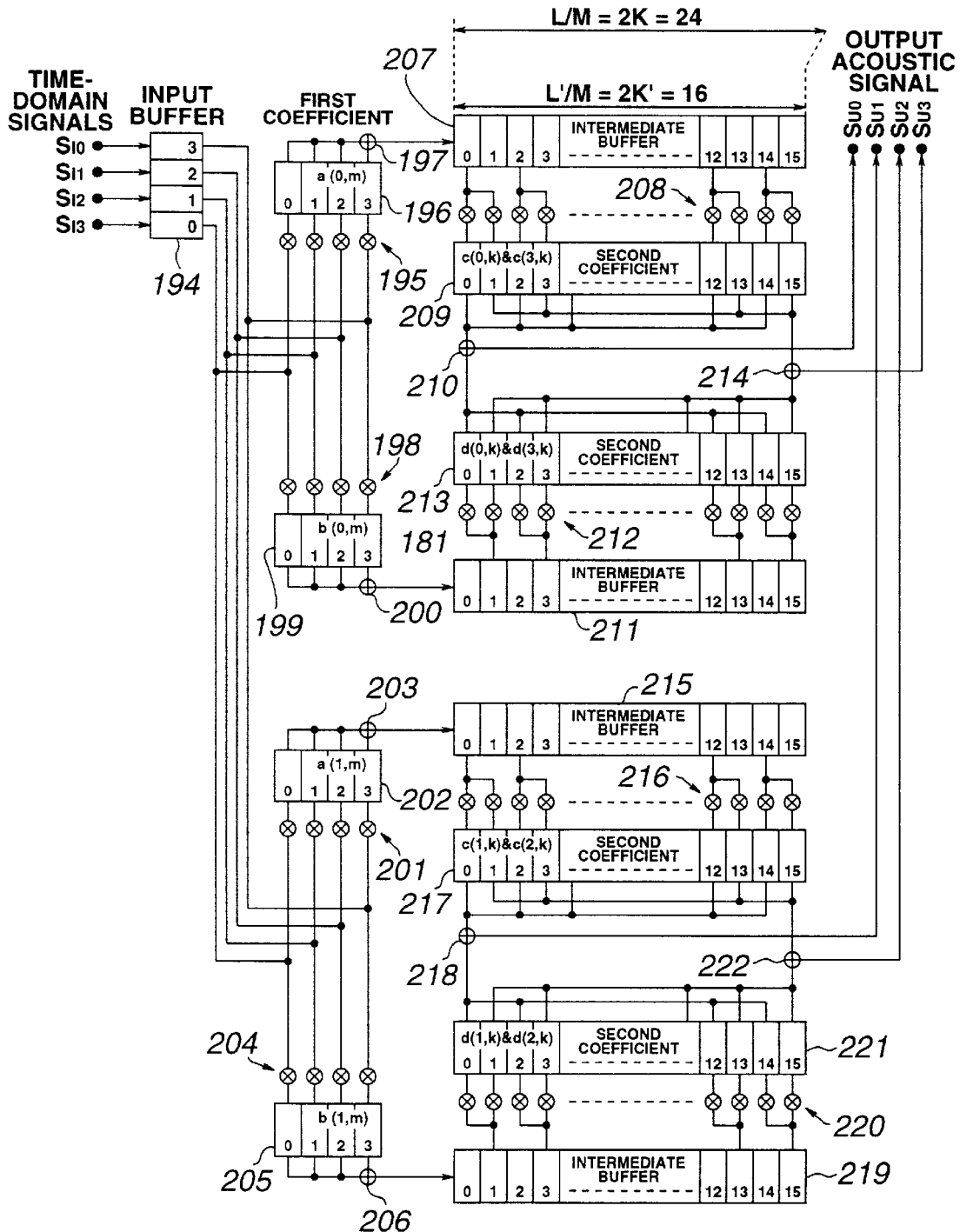
FIG. 36 shows the structure of a filter bank by the combination of the efficiency band-synthesizing filter bank and the fixed tap length conversion band synthesizing filter.

FIG. 36 shows the structure of the fixed tap length converting synthesis filter bank and the efficiency band-synthesis filter bank. To the input buffer 194 are entered time-domain signals $S_{10}$, $S_{11}$, $S_{12}$ and $S_{13}$ from the inverse orthogonal transform units $15_0$, $15_1$, $15_2$ and $15_3$. The convolution processing by the input buffer 194 and the first-order coefficient holders 196, 199, 202 and 205 is carried out by multiplier sets 195, 198, 202 and 205 and adders 197, 200, 203 and 206 and the results of the processing are sent to intermediate buffers 207, 211, 215 and 219. The convolution processing of the outputs of the intermediate buffers 207, 211, 215 and 219 and the second-order coefficient holders 209, 213, 217 and 221 is carried out by multiplier sets 208, 212, 216 and 220 and adders 210, 214, 218 and 222 to give band-based signal components $S_{U0}$, $S_{U1}$, $S_{U2}$ and $S_{U3}$.

If desired to perform fixed tap length conversion, it suffices to convert tap lengths of the second-order coefficient holders 209, 213, 217 and 221 and the intermediate buffers 207, 211, 215 and 219.

Figure 37:
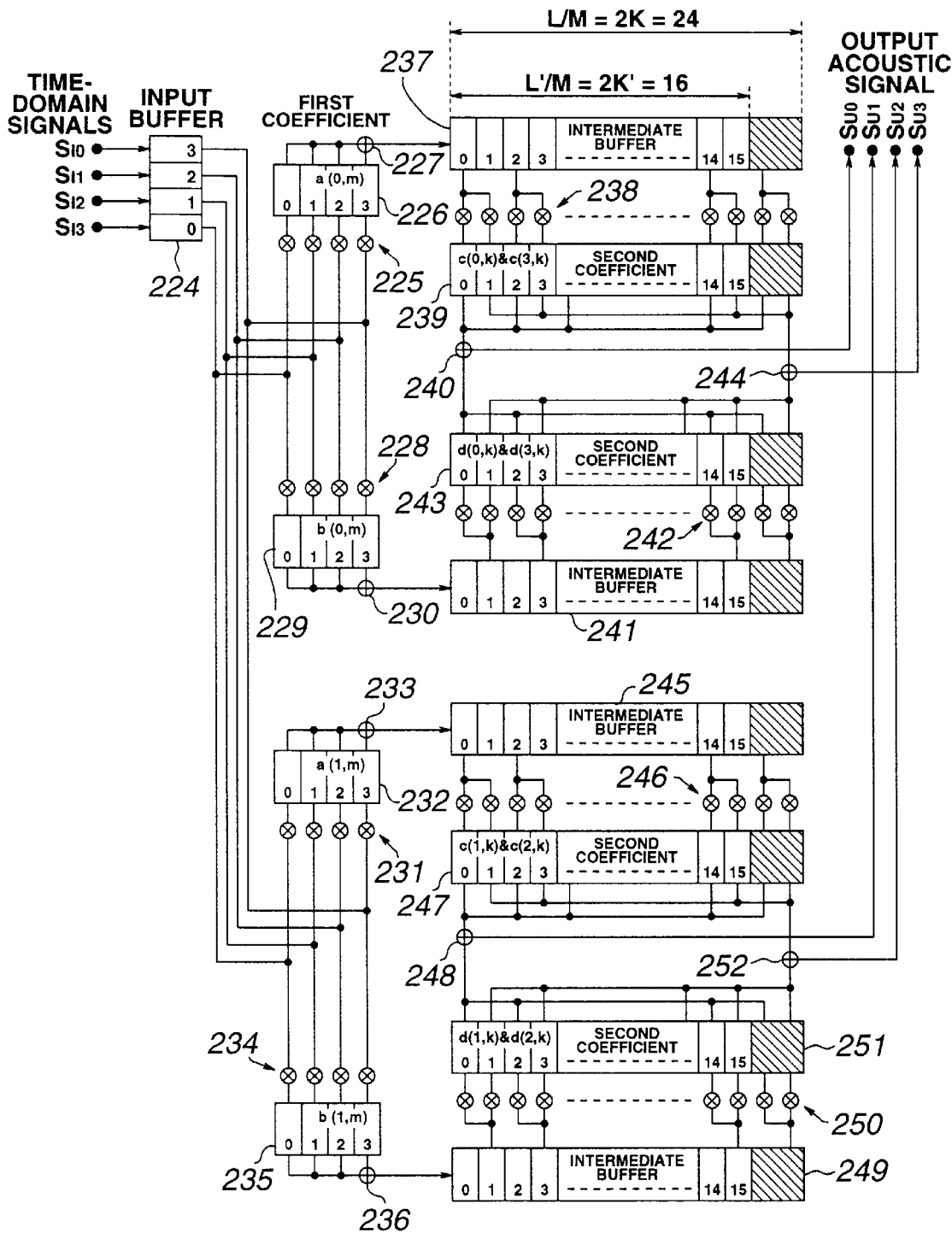
FIG. 37 shows the structure of a filter bank by the combination of the efficiency band-synthesizing filter bank and the variable tap length conversion band synthesizing filter.

FIG. 37 shows the structure of the band synthesis filter bank in which the variable tap length converting band synthesizing filter bank is re-constructed by the efficiency band-synthesis filter bank. To the input buffer 224 are entered time-domain signals $S_{10}$, $S_{11}$, $S_{12}$ and $S_{13}$ from the inverse orthogonal transform units $15_0$, $15_1$, $15_2$ and $15_3$. The convolution processing by the input buffer 224 and the first-order coefficient holders 226, 229, 232 and 235 is carried out by multiplier sets 225, 228, 231 and 234 and adders 227, 230, 233 and 236 and the results of the processing are sent to intermediate buffers 237, 241, 245 and 249. The convolution processing of the outputs of the intermediate buffers 237, 241, 245 and 249 and the second-order coefficient holders 239, 243, 247 and 251 is carried out by multiplier sets 238, 242, 246 and 250 and adders 240, 244, 248 and 252 to give band-based signal components $S_{U0}$, $S_{U1}$, $S_{U2}$ and $S_{U3}$.

If desired to perform variable tap length conversion, it suffices to convert tap lengths of the second-order coefficient holders 239, 243, 247 and 251 and the intermediate buffers 237, 241, 245 and 249. The shaded portions of FIG. 37 permit re-allocation of the coefficients and the buffer and are varied immediately if the tap length L' is varied to vary the processing volume and the band-synthesizing processing precision.

It is seen from above that, if the above-described arrangement is used, the tap length in meeting with the capability of the decoding processor can be set thus optimizing the required processing volume and the frequency response for band synthesis.

For example, if, in the band synthesis of acoustic signals, the processing capability of the decoder is not that high, there is raised no strict demand as to the sound quality but there is raised a demand for wide band feeling, it is sufficient to decrease the tap length L' to reduce the processing volume of the band-synthesis filter bank. In addition, the present invention is effective if there is raised no strict demand as to the sound quality such as when it is necessary to perform only data retrieval and inspection expeditiously.

It is also possible with the fixed/variable tap length filter bank of the present invention to adjust the load applied to the decoder. Specifically, if there is allowance in the processing capability, the tap length L' is set to a larger value for high-precision band synthesis, whereas, if there is no sufficient allowance in the processing capability, the tap length L' is decreased to decrease the processing volume in order to perform pseudo band synthesis such as to minimize psychoacoustic problems.

In particular, the present invention is effective for a case in which the processing capability is changed with time, such as when plural application programs are running on the decoder, such that the decoding operation can be continued even on occurrence of a large load on the decoder.

The foregoing description has been directed to decreasing the processing volume for expediting the operations mainly of the band-synthesizing processing carried out by the decoder. The reason is that encoding on the encoder side need not necessarily be carried out in real-time and that moreover an encoder having a higher processing capability can be used.

However, if desired to design an encoder of a small size and a low processing capability or to do real-time processing, it is mandatory to suppress the processing volume.

Thus, the present invention provides a band splitting filter bank, a band splitting filtering method, a band synthesis filter bank, a band synthesis filtering method, an encoder, an encoding method, a decoder, a decoding method, and a recording medium whereby it is possible to control the processing volume for realizing the real-time processing for both encoding and decoding even in cases wherein it is necessary to use a device having a lower processing capability or a device the processing capability of which is varied with time.

Figure 38:
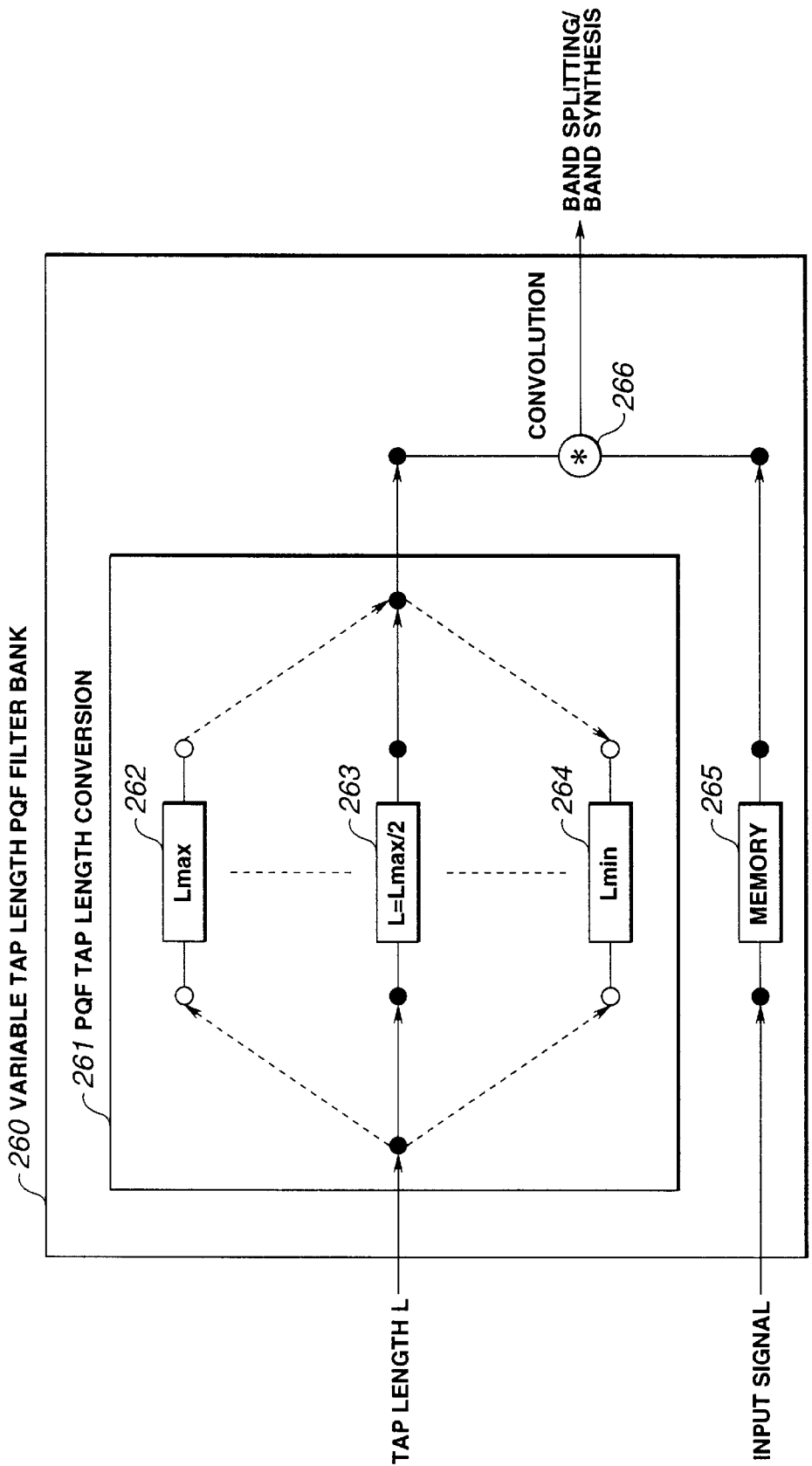
FIG. 38 is a block diagram of a variable tap length PQF filter bank as an example of a filter bank capable of varying the tap length of the filter of the orthogonal transform/time-domain synthesizing unit.

FIG. 38 shows the structure of a variable tap length PQF filter bank 260, with a variable tap length of the PQF filter bank, used for a band-splitting filter bank or a band-synthesizing filter bank.

This variable tap length PQF filter bank 260 includes a PQF tap length converter 261 for outputting filter coefficients of a desired tap length, obtained on reducing the filter coefficients of the standard tap length based on the desired tap length information, and a convolution unit 266 for convolving the filter coefficients of the desired tap length from the PQF tap length converter 261 and the above-mentioned acoustic signals.

The variable tap length PQF filter bank 260 sends an output of the PQF tap length converter 261 and the input signal via memory 265 to the convolution unit 266 to output the result of the convolution processing from the convolution unit 266 as a band splitting/band synthesizing signal.

The PQF tap length converter 261 first sets the longest tap length L max 262 the performance of the PQF filter bank of which is used as a standard. By reducing the tap length L max 262 to a shorter tap length, such as (L=L max/2) 263, L min 264, it becomes possible to reduce the processing volume involved in band splitting/band synthesis.

Figure 39:
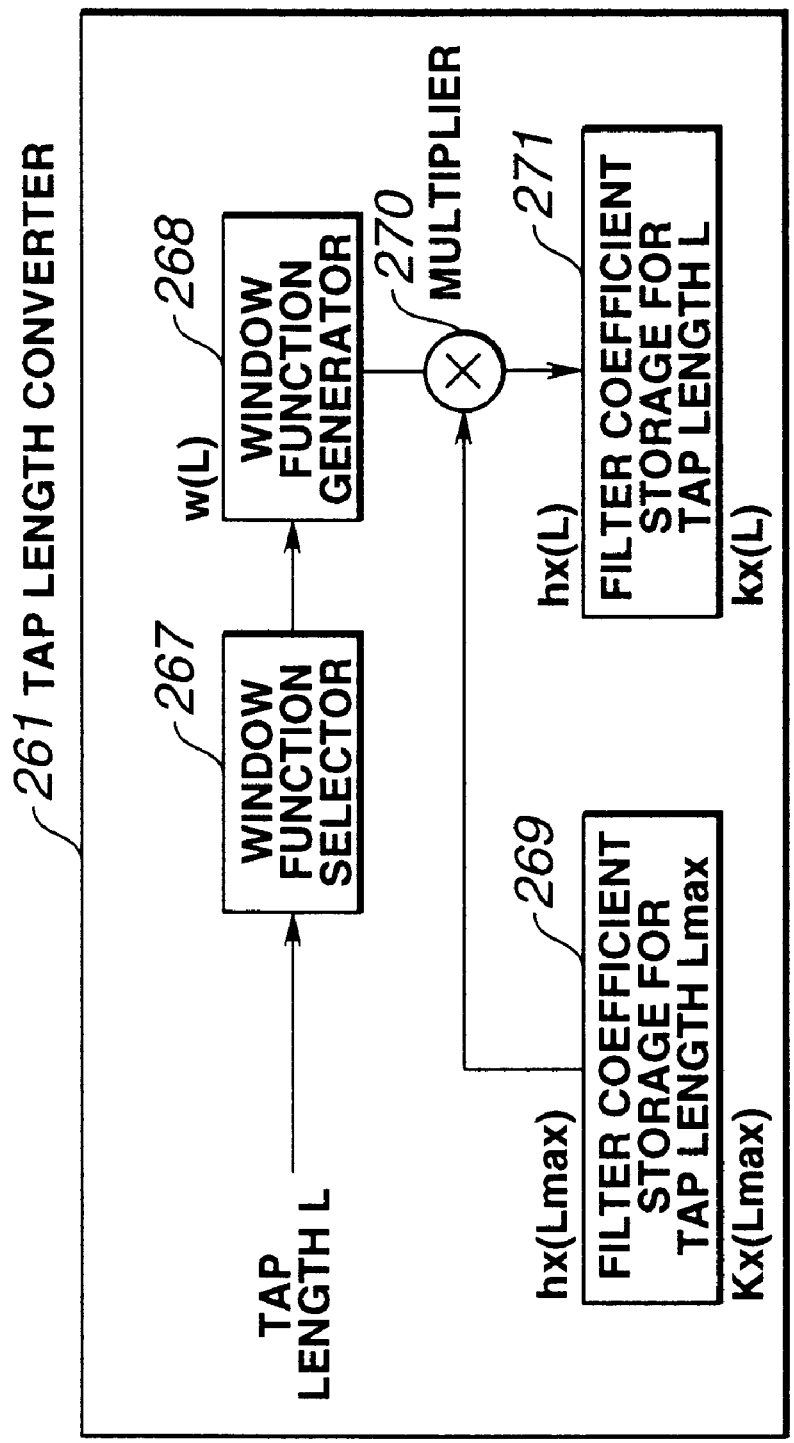
FIG. 39 is a block diagram showing the structure of a PQF tap length converter on the variable tap length filter bank for converting the tap length.

That is, the PQF tap length converter 261 shown in FIG. 39 reads out and outputs the filter coefficients of a desired tap length, pre-stored in a RAM, based on the tap length information.

If the processing volume in case of using the tap length L max 262 is Cul(L max), the filter performance is lowered by setting the tap length to a value lower than L max 262, such as (L=L max/2) 263 or L min 264. However, the processing volume Cul(L) becomes smaller than Cul(L max).

However, if the tap length is reduced, the sound quality is deteriorated. Therefore, it becomes necessary to act on the value of the filter coefficient.

FIG. 39 shows the structure of the PQF tap length converter 261 adapted for varying the tap length L. This PQF tap length converter 261 includes a window function selector 267 for selecting functions such as square window or Hamming window, a window function generator 268 for generating the window function as selected by window function selector 267 and a filter coefficient storage unit 269 having stored therein the band-splitting filter coefficients hx(max) or the band-synthesizing filter coefficients kx(max) with the tap length of L max. The PQF tap length converter 261 further includes a multiplier 270 for multiplying the filter coefficients hx(max) or kx(max) from the filter coefficient storage unit 269 with the window function generated by the window function generator 268 and a filter coefficient storage unit 271 for storing the results of multiplication from the multiplier 270, that is the band-splitting filter coefficients hx(L) or the band-synthesizing filter coefficients kx(L) with the tap length L. The PQF tap length converter 261, shown in FIG. 39, performs an operation of finding the filter coefficients with the occasionally desired tap length responsive to the tap length information.

The reason the window function from the window function generator 268 is applied in the multiplier 270 in deriving the new band-splitting filter coefficients hx(L) or the band-synthesizing filter coefficients kx(L) is that the aliasing from neighbouring bands needs to be suppressed effectively at the time of the band splitting/band synthesis. This operation enables the psychoacoustic problems to be minimized even on varying the tap length of the PQF filter bank.

Figure 10:
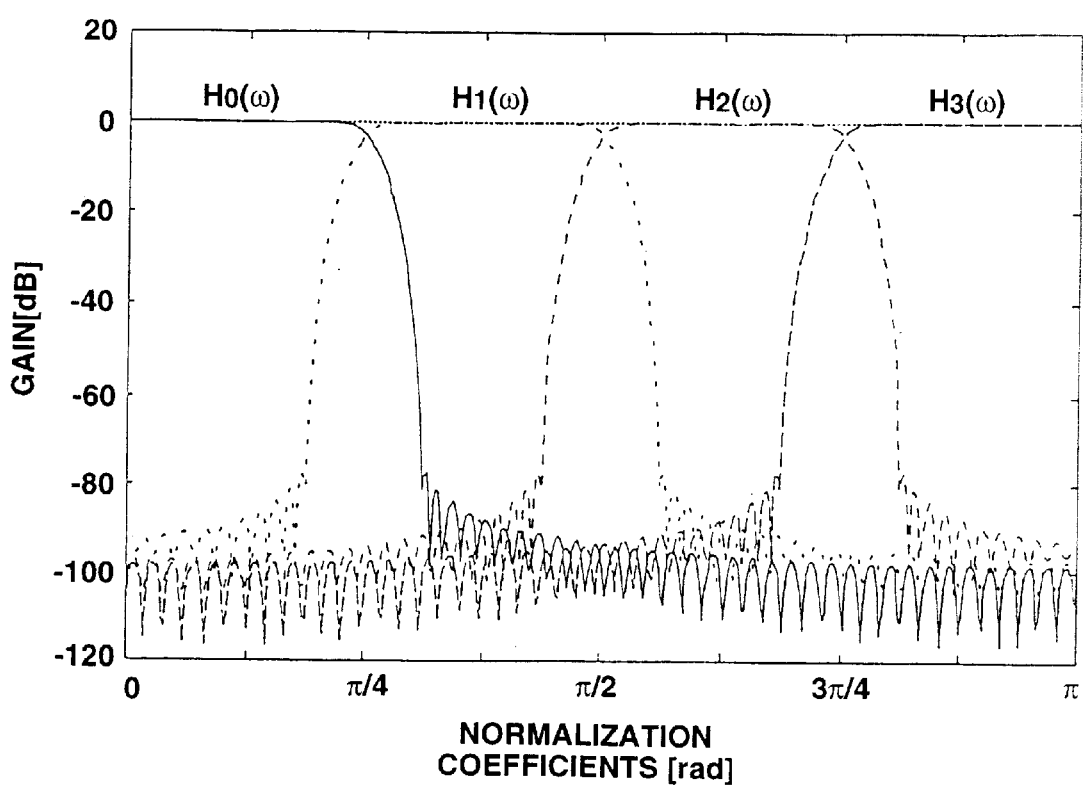
FIG. 10 shows detailed characteristics of a PQF filter bank used in FIGS. 9A and 9B.
Figure 40:
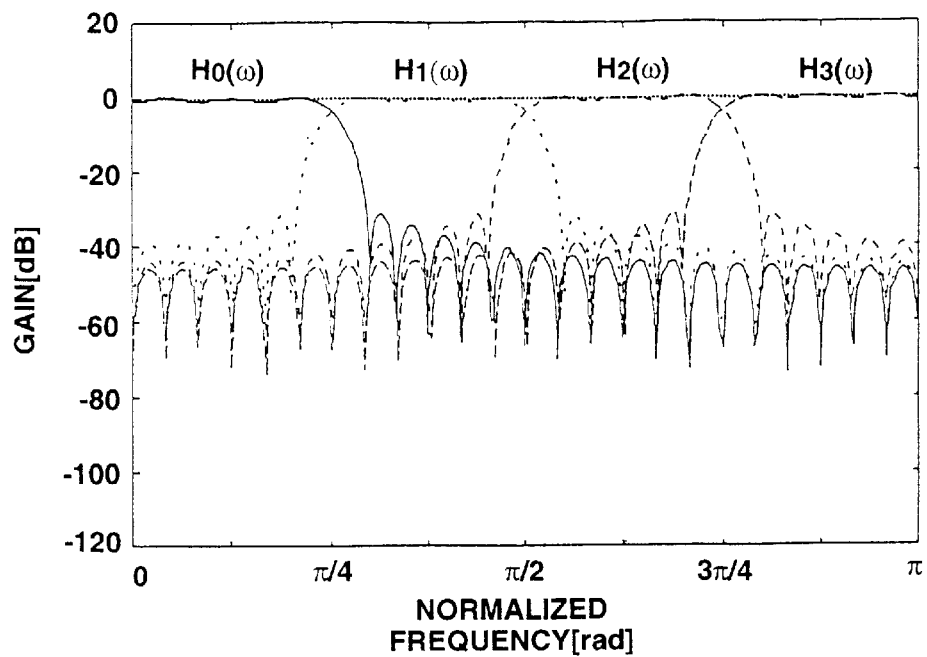
FIG. 40 is a graph showing band splitting characteristics in case the tap length of the filter bank shown in FIG. 10 is converted from 96 to 48 by the PQF tap length converter employing the square-shaped window function.
Figure 41:
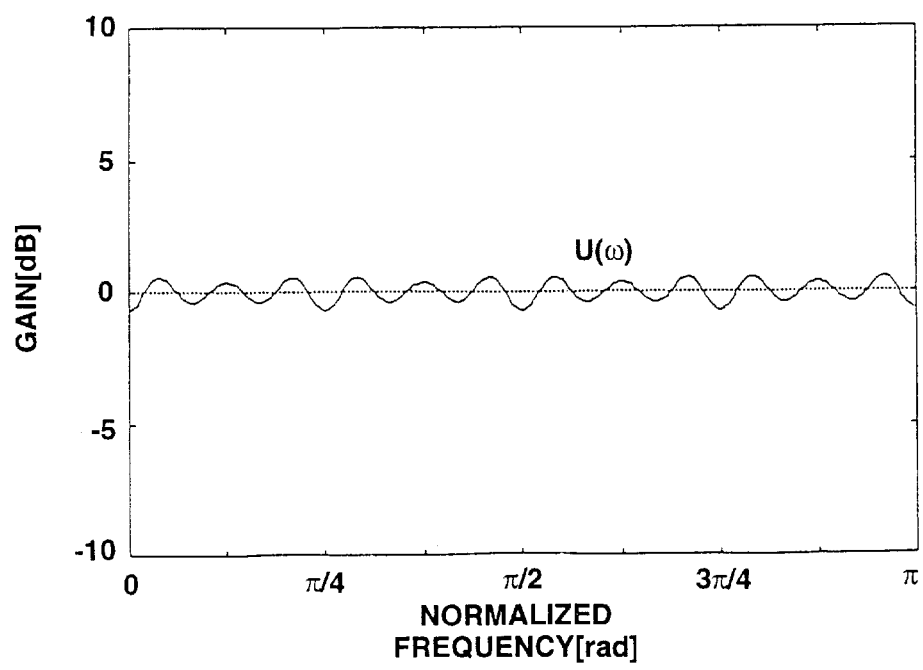
FIG. 41 is a graph showing band synthesis characteristics in case the tap length of the filter bank shown in FIG. 10 is converted from 96 to 48 by the PQF tap length converter employing the square-shaped window function.

FIG. 40 is a graph showing amplitude characteristics Hx of the PQF filter bank in which the filter coefficients hx(96) of the PQF filter bank with the tap length L=96 having the amplitude characteristics shown in FIG. 10 are converted into the filter coefficients hx(48) by the square window function with the tap length L=48. FIG. 41 is a graph showing amplitude characteristics of the PQF filter bank having the filter coefficients kx(48).

FIG. 40 shows that the gain attenuation in the inhibiting band of the PQF filter bank is of the order of 40 dB. The gain attenuation as small as this tends to affect the sound as heard by the ear by aliasing generated in the neighboring bands.

Figure 42:
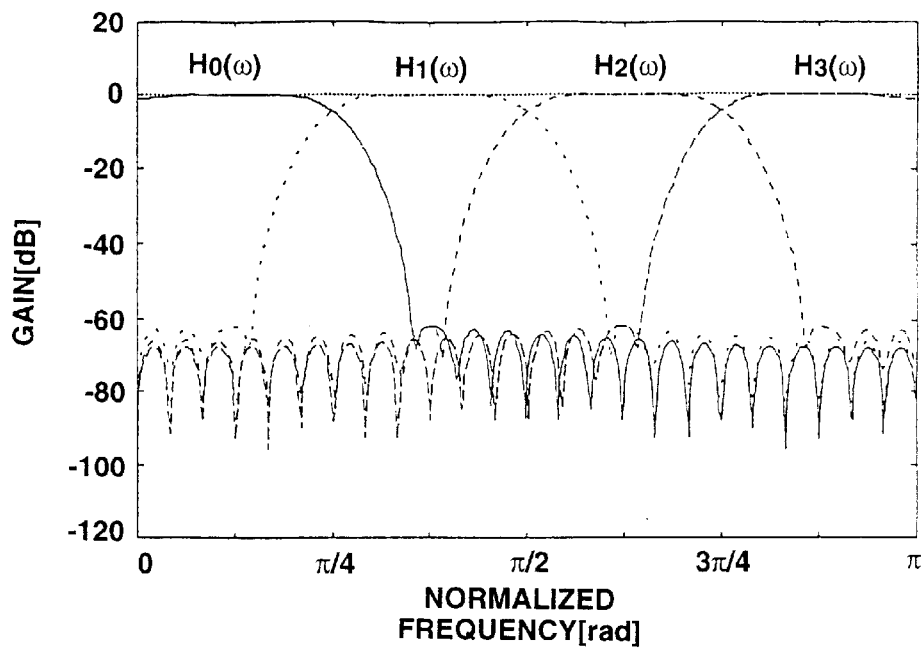
FIG. 42 shows band-splitting characteristics in case the tap length of the filter bank shown in FIG. 10 is changed from 96 to 48 by a PQF tap length converting unit employing a Hamming window function.

FIG. 42 shows amplitude characteristics Hx of the PQF filter bank in which filter coefficients hx(96) of a PQF filter bank having amplitude characteristics shown in FIG. 10 are converted with the Hamming window function of a tap length L=48 by a PQF tap length converter 261 shown in FIG. 39 to give filter coefficients hx(48).

As may be seen from FIG. 42, this PQF filter bank has the gain attenuation in the inhibition band of not less than 60 dB which represents the performance higher than that of a PQF filter bank of FIG. 40 employing the square-shaped window function converted to the same tap length L=48.

Figure 43:
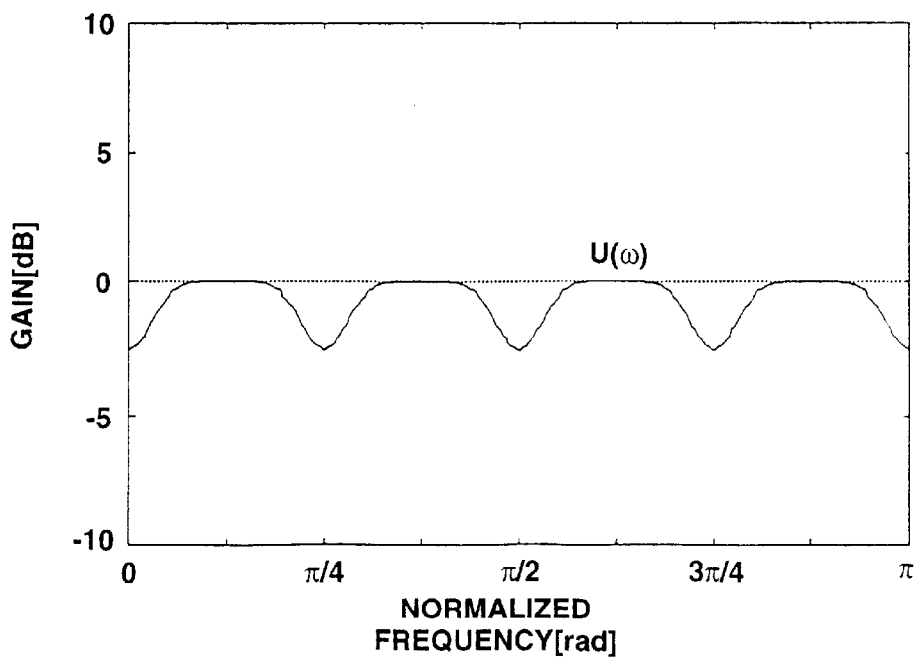
FIG. 43 shows band-splitting characteristics in case the tap length of the filter bank shown in FIG. 10 is changed from 96 to 48 by a PQF tap length converting unit employing a Hamming window function.

By employing the Hamming window function, the gain attenuation in the inhibition range can be set to a larger value. However, this increases ripples in the amplitude characteristics U at the time of band synthesis, as shown in FIG. 43. However, this phenomenon is not psychoacoustically so troublesome. Rather, it is the aliasing from the neighboring band that is mainly responsible for the psychoacoustic problems. Therefore, it is psychoacoustically more meritorious to use a larger value of the gain attenuation in the inhibiting band.

Thus, in the band-splitting filter, the processing volume can be reduced for preferring real-time processing, depending on the selected window function and tap length.

With an encoder employing such band-splitting filter, that is in a band-splitting filter bank and an encoder 2 for generating a codestring by encoding acoustic signals band-split by this band-splitting filter, as shown in FIG. 1, the processing volume can be controlled for preferring real-time processing if the processing capability is low or varied with time.

On the other hand, with a decoder employing such band-synthesis filter, that is in a band-synthesizing filter bank and a decoder 7 for generating a decoded output by decoding acoustic signals band-synthesized by this band-synthesizing filter, the processing volume can be controlled for preferring real-time processing if the processing capability is low or varied with time.

The new band-splitting filter coefficients hx(L) or band-synthesizing filter coefficients kx(L), discussed with reference to FIG. 39, are interchangeable with the band-splitting filter coefficients hx(L max) or band-synthesizing filter coefficients kx(L max) with the tap length L max.

Figure 44:
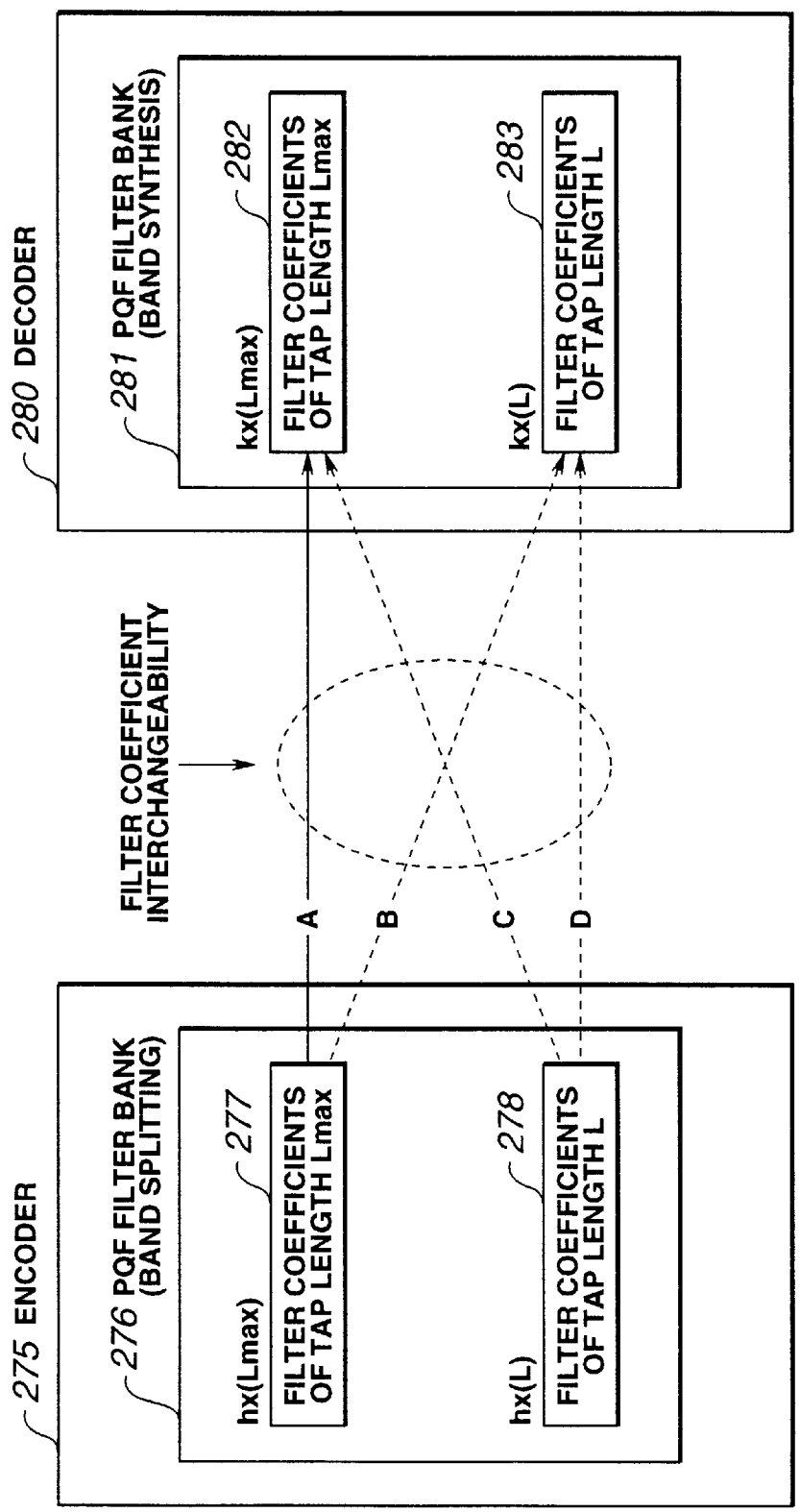
FIG. 44 illustrates that filter banks of different tap lengths can be used in an encoder and in a decoder.

For example, data obtained on band-splitting by a PQF filter bank 276 employing the filter coefficients hx(L max) 277 with the tap length L max in an encoder 275 shown in FIG. 44 can be band-synthesized by a PQF filter bank 281 employing the filter coefficients kx(L) 277 with the tap length L in a decoder 280. The data can also be band-synthesized in the PQF filter bank 281 using the filter coefficients kx(L max) 282 with the tap length L max in the PQF filter bank 281. Also, data obtained on band-splitting by a PQF filter bank 276 employing the filter coefficients hx(L) 278 with the tap length L in the encoder 275 shown in FIG. 44 can be band-synthesized by the PQF filter bank 281 employing the filter coefficients kx(L) 283 with the tap length L in the decoder 280. The data can also be band-synthesized in the PQF filter bank 281 using the filter coefficients kx(L max) 282 with the tap length L max in the PQF filter bank 281. Specifically, the encoding/decoding can be done by routes A, B, C and D as shown in FIG. 44.

Figure 45:
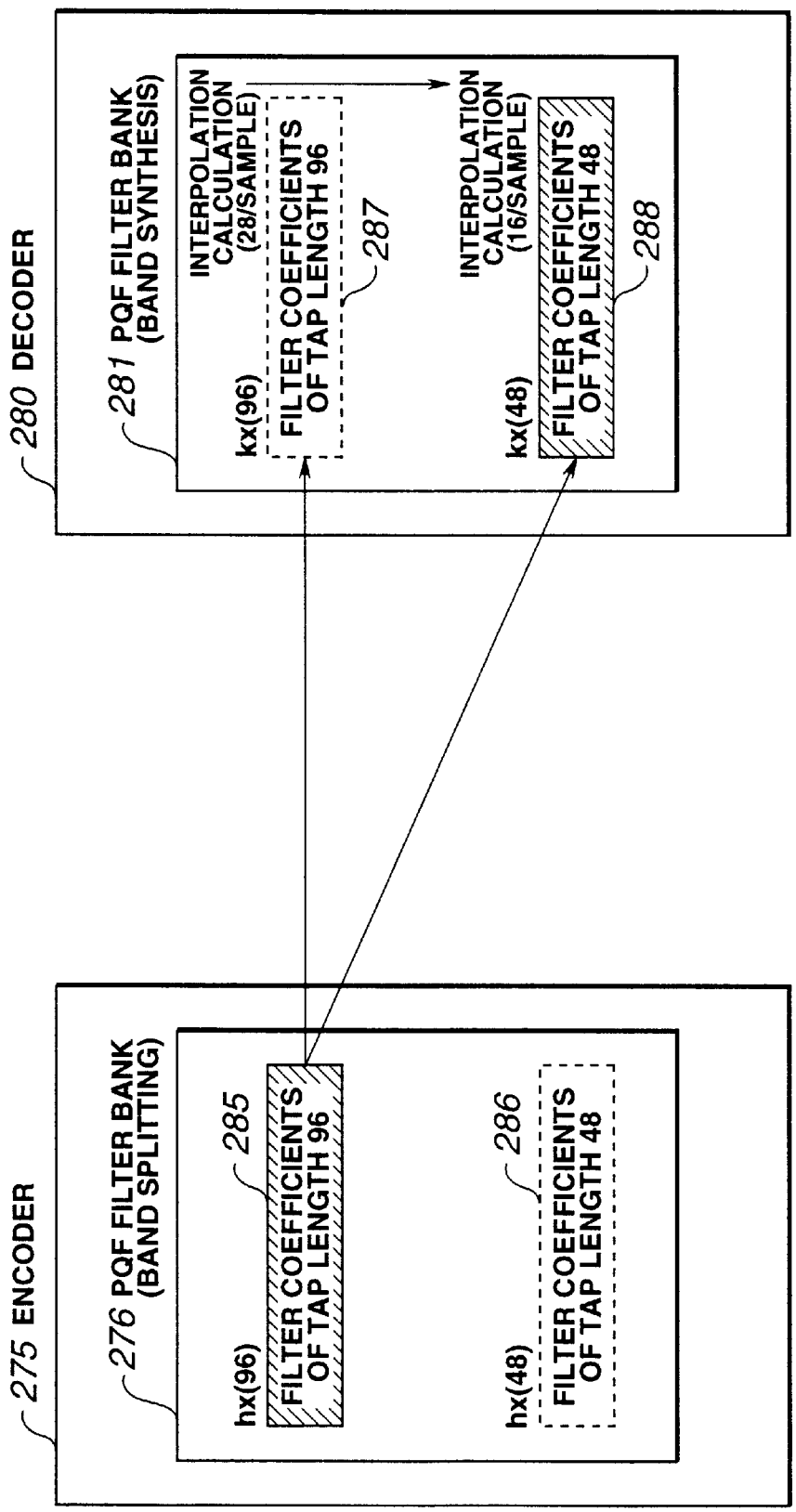
FIG. 45 illustrates that a filter bank of different tap length can be used in a decoder from that used in an encoder and also that 96/48 tap switching is possible by the processing capability of the decoder.

FIG. 45 shows an acoustic signal encoder/decoder for doing band-splitting in the PQF filter bank 276 of the encoder 275 using filter coefficients hx(96) 285 with the tap length L max=96 and for doing band synthesis in the PQF filter bank 281 of the decoder 280 using filter coefficients kx(48) 288 with the tap length L=48.

The decoder 280 selects the band-synthesizing filter bank of a processing volume matched to the processing capability at the time of decoding and performs band-synthesis before proceeding to decoding.

The decoder 280 splits the filter coefficients into two coefficients, as described above, thus requiring L/M+N times of the product-sum processing operations on PQF per sample.

The number of times of product-sum processing operations per sample, employing the filter coefficients kx(48) 288 with the tap length L=48, performed in the PQF filter bank 281 of the decoder 280, is 16, which is not more than 60% of the number of times of the product-sum processing operations per sample in the filter coefficients kx(96) 287 with the tap length L=96, which is 28.

The encoder/decoder shown in FIG. 45 can perform encoding with a sufficient accuracy for the encoder 275, so that a simplified device can be fabricated which is small-sized and of a small processing volume. This is equivalent to reduction in the processing volume by the decoder explained with reference to the figures up to FIG. 37.

If the processing capability of the decoder 280 is carried with time such that band synthesis processing becomes difficult to perform in the PQF filter with the tap length 96 at a certain time point, the tap length of the PQF filter bank can be changed to 48 for reducing the processing volume for reducing the load for enabling real-time processing.

The decoder 280 as a hardware has merits such as reduction in system size and saving in power consumption, while the decoder 280 as a software has merits such as reduction in load imposed on the decoding program.

Figure 46:
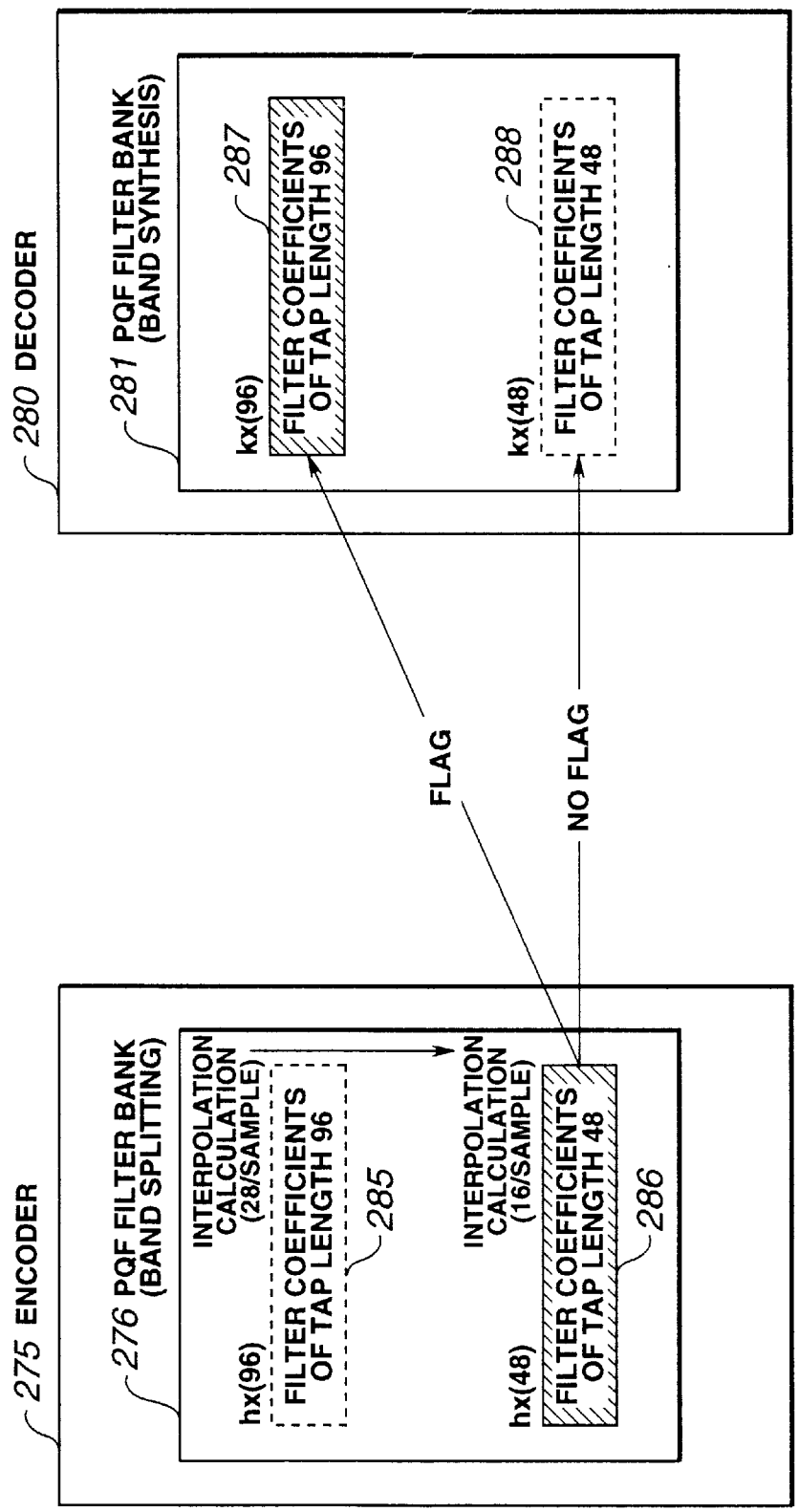
FIG. 46 illustrates that a filter bank of different tap length can be used in an encoder from that used in a decoder and also that 96/48 tap switching is possible on the decoder side by recording a flag on the encoder side.

FIG. 46 shows an acoustic signal encoder/decoder doing band splitting using filter coefficients hx(48) 286 with the tap length L=48 in the PQF filter bank 276 of the encoder 275 and doing band synthesis using filter coefficients kx(96) 287 with the tap length L max=96 in the PQF filter bank 281 of the decoder 280.

In the acoustic signal encoder/decoder, shown in FIG. 46, since the filter coefficients are divided in two, L/M+N product-sum operations for the PQF are required per sample.

In the acoustic signal encoder/decoder shown in FIG. 46, since the filter coefficients are divided into two portions, as in FIG. 45, the number of times of product-sum processing operations per sample, employing the filter coefficients kx(48) 286 with the tap length L=48, in the PQF filter bank 276 of the decoder 275, is 16, which is not more than 60% of the number of times of the product-sum processing operations per sample performed in the filter coefficients kx(96) 285 with the tap length L=96, which is 28. However, the characteristics of the decoder 280 at the time of band synthesis cannot surpass band-splitting characteristics on the encoder side.

Thus, a flag specifying the tap length L of the PQF filter bank in the codestring is recorded as an ancillary function. The decoder 280 can discriminate the flag for constructing a PQF filter bank matched to the type length L for doing band synthesis, thus preventing the processing volume from being increased unnecessarily.

Specifically, the encoder 275 writes in the codestring the tap length information used in band-splitting the acoustic signal by the band-splitting filter bank in the encoder.

The decoder 280 reads the tap length information to do the band synthesis by the band synthesizing filter bank having the same performance as the band synthesizing filter bank that can be identified by this tap length information. The decoder 280 then proceeds to decoding the codestring.

It is noted that the decoder 280 reads the tap length information from a recording medium having recorded thereon the above-mentioned codestring along with the tap length information of the filter bank used in band splitting.

This recording medium contributes to reduction in the processing volume of the decoder 280 at the decoding time.

With the above-described encoder/decoder, encoding can be performed by a simplified encoder which is small in size and in processing volume. By employing the additional function, the processing volume can be suppressed even in a decoder having a variable length PQF filter bank, while the acoustic signals can be restored even in a decoder not having the variable tap length PQF filter bank.

Of course, the tap length can be changed in a manner other than 96→48 described above only by way of illustration.

It will be appreciated from the foregoing that the above configuration enables the required processing volume and frequency response at the time of band splitting/band synthesis to be optimized by setting the tap length of the band splitting/band synthesis matched to the capability of the encoder/decoder.

For example, if the processing capability of the encoder/decoder is not that high, encoder/decoder can be performed psychoacoustically satisfactorily by changing the tap length of the band splitting/band synthesis filter.

What is claimed is:

1. A band-splitting filter bank for processing an input signal with band-splitting, comprising:

tap length converting means for outputting filter coefficients with a contracted tap length obtained on contracting the filter coefficients of a standard tap length based on a tap length information; and processing means for convolving the filter coefficients of the contracted tap length outputted by said tap length converting means with said input signal.

2. The band-splitting filter bank as claimed in claim 1 wherein said tap length converting means processes the filter coefficients of the standard tap length with psychoacoustic optimizing processing for producing the filter coefficients of the contracted tap length.

3. The band-splitting filter bank as claimed in claim 2 wherein said tap length converting means performs, as the optimizing processing, the processing by a window function capable of improving frequency separation characteristics.

4. The band-splitting filter bank as claimed in claim 1 wherein said processing means performs the processing by splitting the filter coefficients into two coefficients by exploiting coefficient symmetry.

5. The band-splitting filtering method for band-splitting an input signal, comprising:

a tap length converting step for outputting filter coefficients with a contracted tap length obtained on contracting the filter coefficients of a standard tap length based on a tap length information; and a processing step for convolving the filter coefficients of the contracted tap length outputted by said tap length converting step with said input signal.

6. The band-splitting filtering method as claimed in claim 5 wherein said tap length converting step processes the filter coefficients of the standard tap length with psychoacoustic optimizing processing for producing the filter coefficients of the contracted tap length.

7. The band-splitting filtering method as claimed in claim 6 wherein said tap length converting step performs, as the optimizing processing, the processing by a window function capable of improving frequency separation characteristics.

8. The band-splitting filtering method as claimed in claim 5 wherein said processing means performs the processing on splitting the filter coefficients into two coefficients by exploiting coefficient symmetry.

9. A recording medium having recorded thereon input signals processed with band-splitting processing, said band-splitting processing including a tap length converting step for outputting filter coefficients with a contracted tap length obtained on contracting the filter coefficients of a standard tap length based on a tap length information; and a processing step for convolving the filter coefficients of the contracted tap length outputted by said tap length converting step with said input signal.

10. A band-synthesizing filter bank for processing an input signal with band synthesis, comprising:

tap length converting means for outputting filter coefficients with a contracted tap length obtained on contracting the filter coefficients of a standard tap length based on a tap length information; and processing means for convolving the filter coefficients of the contracted tap length outputted by said tap length converting means with said input signal.

11. The band-synthesizing filter bank as claimed in claim 10 wherein said tap length converting means processes the filter coefficients of the standard tap length with psychoacoustic optimizing processing for producing the filter coefficients of the contracted tap length.

12. The band-synthesizing filter bank as claimed in claim 11 wherein said tap length converting means performs, as the optimizing processing, the processing by a window function capable of improving frequency separation characteristics.

13. The band-synthesizing filter bank as claimed in claim 10 wherein said processing means performs the processing on splitting the filter coefficients into two coefficients by exploiting coefficient symmetry.

14. A band-synthesizing filtering method for band-synthesizing an input signal, comprising:
    a tap length converting step for outputting filter coefficients with a contracted tap length obtained on contracting the filter coefficients of a standard tap length based on a tap length information; and
    a processing step for convolving the filter coefficients of the contracted tap length outputted by said tap length converting step with said input signal.

15. The band-synthesizing filtering method as claimed in claim 14 wherein said tap length converting step processes the filter coefficients of the standard tap length with psychoacoustic optimizing processing for producing the filter coefficients of the contracted tap length.

16. The band-synthesizing filtering method as claimed in claim 15 wherein said tap length converting step performs, as the optimizing processing, the processing by a window function capable of improving frequency separation characteristics.

17. The band-synthesizing filtering method as claimed in claim 14 wherein said processing means performs the processing on splitting the filter coefficients into two coefficients by exploiting coefficient symmetry.

18. A recording medium having recorded thereon band-synthesizing filtering processing of band-synthesizing input signals; said band-synthesizing filtering processing including
    a tap length covering step for outputting filter coefficients with a contracted tap length obtained on contracting the filter coefficients of a standard tap length based on a tap length information; and
    a processing step for convolving the filter coefficients of the contracted tap length outputted by said tap length converting step with said input signal.

19. A band-splitting filter bank for processing an input signal with band splitting, comprising:
    optimizing processing means for processing filter coefficients using an optimizing function; and
    tap length converting means for converting the tap length of said filter coefficients optimized by said optimizing processing means.

20. The band-splitting filter bank as claimed in claim 19 wherein said tap length converting means converts said tap length based on a tap length information.

21. The band-splitting filter bank as claimed in claim 19 wherein said optimizing processing means uses, as the optimizing function, a window function capable of improving the frequency separating characteristics.

22. A band-splitting filtering method for processing an input signal with band splitting processing, comprising:
    an optimizing processing step for processing said filter coefficients using an optimizing function; and
    a tap length converting step for converting the tap length of said filter coefficients optimized by said optimizing processing step.

23. The band-splitting filtering method as claimed in claim 22 wherein said tap length converting step converts said tap length based on a tap length information.

24. The band-splitting filter bank as claimed in claim 22 wherein said optimizing processing step uses, as the optimizing function, a window function capable of improving the frequency separating characteristics.

25. A recording medium having recorded thereon band-splitting filtering processing of band-splitting input signals; said band-splitting processing including
    an optimizing processing step for processing filter coefficients using an optimizing function; and
    a tap length converting step for converting the tap length of said filter coefficients optimized by said optimizing processing step.

26. A band synthesizing filter bank for processing an input signal with band synthesis processing with modified filter coefficients, said input signal being such a signal band-split by a band-splitting filter bank constituted by a pre-set finite tap length, comprising:
    optimizing processing means for processing said filter coefficients using an optimizing function; and
    tap length converting means for converting the tap length of said filter coefficients optimized by said optimizing processing means.

27. The band-splitting filtering bank as claimed in claim 26 wherein said tap length converting means converts said tap length based on a tap length information.

28. The band-splitting filter bank as claimed in claim 26 wherein said optimizing processing means uses, as the optimizing function, a window function capable of improving the frequency separating characteristics.

29. A band synthesizing filtering method for processing an input signal with band synthesis processing with modified filter coefficients, said input signal being such a signal band-split by a band-splitting filter bank constituted by a pre-set finite tap length, comprising:
    an optimizing processing step for processing filter coefficients using an optimizing function; and
    a tap length converting step for converting the tap length of said filter coefficients optimized by said optimizing processing step.

30. The band-splitting filter bank as claimed in 29 wherein said tap length converting means converts said tap length based on a tap length information.

31. The band-splitting filtering method as claimed in claim 29 wherein said optimizing processing means uses, as the optimizing function, a window function capable of improving the frequency separating characteristics.

32. A recording medium having recorded thereon band synthesizing filtering processing of band-synthesizing an input signal using modified filter coefficients, said input signal being a signal band-split by a band-splitting filter bank constituted by a pre-set finite tap length; said band-synthesizing processing including
    an optimizing processing step for processing filter coefficients using an optimizing function; and
    a tap length converting step for converting the tap length of said filter coefficients optimized by said optimizing processing step.

33. An encoder for band-splitting and subsequently encoding an input signal, comprising:
    a band splitting filter bank for band-splitting said input signal; and encoding means for encoding a signal band-split by said band-splitting filter bank for generating a codestring, said encoding means writing in said codestring a tap length information used for band-splitting the input signal by said band-splitting filter bank.

34. The encoder as claimed in claim 33 wherein said band-splitting filter bank includes tap length converting means for outputting filter coefficients with a contracted tap length obtained on contracting the filter coefficients of a standard tap length based on a tap length information; and processing means for convolving the filter coefficients of the contracted tap length outputted by said tap length converting means with said input signal.

35. The encoder as claimed in 34 wherein said tap length converting means processes the filter coefficients of the standard tap length with psychoacoustic optimizing processing for producing the filter coefficients of the contracted tap length.

36. The encoder as claimed in claim 35 said tap length converting means performs, as the optimizing processing, the processing by a window function capable of improving frequency separation characteristics.

37. The encoder as claimed in claim 34 wherein said processing means performs the processing on splitting the filter coefficients into two coefficients by exploiting coefficient symmetry.

38. An encoding method for band-splitting and subsequently encoding an input signal, comprising:

a band-splitting filtering step for band-splitting said input signal; and an encoding step for encoding a signal band-split by said band-splitting filter bank for generating a codestring, said encoding means writing in said codestring a tap length information used for band-splitting the input signal by said band-splitting filtering step.

39. The encoding method as claimed in claim 38 wherein said band-splitting filtering step includes a tap length converting step for outputting filter coefficients with a contracted tap length obtained on contracting the filter coefficients of a standard tap length based on a tap length information; and a processing step for convolving the filter coefficients of the contracted tap length outputted by said tap length converting means with said input signal.

40. The encoding method as claimed in claim 39 wherein said tap length converting means processes the filter coefficients of the standard tap length with psychoacoustic optimizing processing for producing the filter coefficients of the contracted tap length.

41. The encoding method as claimed in claim 40 wherein said tap length converting step performs, as the optimizing processing, the processing by a window function capable of improving frequency separation characteristics.

42. The encoding method as claimed in claim 39 wherein said processing step performs the processing on splitting the filter coefficients into two coefficients by exploiting coefficient symmetry.

43. A recording medium having recorded thereon encoder processing of band-splitting and subsequently encoding an input signal; said encoding processing including a band splitting filtering step for band-splitting said input signal; and an encoding step for encoding a signal band-split by said band-splitting filter bank for generating a codestring, said encoding means writing in said codestring a tap length information used for band-splitting the input signal by said band-splitting filtering step.

44. A decoder for decoding a codestring encoded by an encoder employing a band-splitting filter bank; comprising:

readout means for reading out band-splitting tap length information from said codestring; and a band-synthesizing filter bank for setting the band synthesis tap length based on the band-splitting tap length information read out by said readout means, said band-synthesizing filter bank doing band synthesis by said band-splitting tap length.

45. The decoder as claimed in claim 44 wherein said band-synthesizing filter bank includes tap length obtained on converting means for outputting filter coefficients of a band-synthesizing tap length obtained on contracting the filter coefficients of a standard tap length based on the band-splitting tap length information read out by said readout means; and processing means for convolving the filter coefficients of a contracted tap length outputted by said tap length converting means and said input signal.

46. The decoder as claimed in claim 45 wherein said tap length converting means contracts the tap length to a band-synthesizing tap length of a processing volume matched to the processing capability at the time of decoding.

47. The decoder as claimed in claim 45 wherein said tap length converting means processes the filter coefficients of the standard tap length with psychoacoustic optimizing processing for producing the filter coefficients of the contracted tap length.

48. The decoder as claimed in claim 47 wherein said tap length converting means performs, as the optimizing processing, the processing by a window function capable of improving frequency separation characteristics.

49. The decoder as claimed in claim 45 wherein said processing means performs the processing by splitting the filter coefficients into two coefficients by exploiting coefficient symmetry.

50. The decoder as claimed in claim 44 wherein said band-synthesizing filter bank sets the band-synthesizing tap length based on a processing volume matched to the processing capability at the decoding time.

51. A decoding method for decoding a codestring encoded by an encoder employing a band-splitting filter bank; comprising:

readout step for reading out band-splitting tap length information from said codestring; and a band-synthesizing filtering step for setting the band synthesis tap length based on the band-splitting tap length information read out by said readout means, said band-synthesizing filtering step doing band synthesis by said band-splitting tap length.

52. The decoding method as claimed in claim 51 wherein said band-synthesizing filtering step includes a tap length converting step for outputting filter coefficients of a band-synthesizing tap length obtained on contracting the filter coefficients of a standard tap length based on the band-splitting tap length information read out by said readout means; and a processing step for convolving the filter coefficients of a contracted tap length outputted by said tap length converting means and said input signal.

53. The decoding method as claimed in claim 52 wherein said tap length converting step contracts the tap length to a band-synthesizing tap length of a processing volume matched to the processing capability at the time of decoding.

54. The decoding method as claimed in claim 52 wherein said tap length converting step processes the filter coefficients of the standard tap length with psychoacoustic optimizing processing for producing the filter coefficients of the contracted tap length.

55. The decoding method as claimed in claim 54 wherein said tap length converting step performs, as the optimizing processing, the processing by a window function capable of improving frequency separation characteristics.

56. The decoding method as claimed in claim 52 wherein said processing step performs the processing on splitting the filter coefficients into two coefficients by exploiting coefficient symmetry.

57. The decoding method as claimed in claim 51 wherein said band-synthesizing filtering step sets the band-synthesizing tap length based on a processing volume matched to the processing capability at the decoding time.

58. A recording medium having recorded thereon a decoding processing of decoding a codestring encoded by encoding processing employing a band-splitting filter bank; said decoding processing including a readout step for reading out band-splitting tap length information from said codestring; and a band-synthesizing filtering step for setting the band synthesis tap length based on the band-splitting tap length information read out by said readout means, said band-synthesizing filtering step doing band synthesis by said band-splitting tap length.

59. A recording medium comprising a codestring wherein the codestring is obtained by band-splitting a signal using a tap length information of a filter bank and encoding the band-split signal from one band to another.

* * * * *